(12) United States Patent
Ogawa et al.

(10) Patent No.: US 11,326,009 B2
(45) Date of Patent: May 10, 2022

(54) DISPERSION COMPOSITION, CURABLE COMPOSITION, LIGHT-SHIELDING FILM, COLOR FILTER, SOLID-STATE IMAGING DEVICE, IMAGE DISPLAY DEVICE, RESIN, AND METHOD FOR MANUFACTURING CURED FILM

(71) Applicant: FUJIFILM Corporation, Tokyo (JP)

(72) Inventors: Michihiro Ogawa, Haibara-gun (JP); Yutaro Fukami, Haibara-gun (JP)

(73) Assignee: FUJIIFILM Corporation, Tokyo (JP)

( * ) Notice: Subject to any disclaimer, the term of this patent is extended or adjusted under 35 U.S.C. 154(b) by 0 days.

(21) Appl. No.: 16/107,369

(22) Filed: Aug. 21, 2018

(65) Prior Publication Data

US 2018/0355088 A1 Dec. 13, 2018

Related U.S. Application Data

(63) Continuation of application No. PCT/JP2017/004567, filed on Feb. 8, 2017.

(30) Foreign Application Priority Data

Feb. 29, 2016 (JP) .............................. JP2016-037972
May 27, 2016 (JP) .............................. JP2016-106313

(51) Int. Cl.
    *C08F 220/28*      (2006.01)
    *C08F 290/06*      (2006.01)
    (Continued)

(52) U.S. Cl.
    CPC ...... *C08F 220/283* (2020.02); *C08F 290/061* (2013.01); *C08G 63/08* (2013.01);
    (Continued)

(58) Field of Classification Search
    CPC .. C08F 220/283; C08F 290/061; C08G 63/08; C08G 63/912; C08L 33/04;
    (Continued)

(56) References Cited

U.S. PATENT DOCUMENTS

2006/0256175 A1    11/2006   Kanaya
2009/0220748 A1    9/2009   Kanaya et al.
(Continued)

FOREIGN PATENT DOCUMENTS

CN      105189569 A      12/2015
EP      2302454    *   3/2011
(Continued)

OTHER PUBLICATIONS

Korean Intellectual Property Office; Communication dated Aug. 28, 2019 issued in counterpart application No. 10-2018-7024291.
(Continued)

*Primary Examiner* — Ling Siu Choi
*Assistant Examiner* — Ronald Grinsted
(74) *Attorney, Agent, or Firm* — Sughrue Mion, PLLC

(57) ABSTRACT

The present invention provides a dispersion composition from which a curable composition having excellent developability can be obtained and in which generation of precipitates under a low temperature environment is suppressed. In addition, the present invention provides a curable composition, a light-shielding film obtained by curing the curable composition, a color filter containing a cured film obtained by curing the curable composition, a solid-state imaging device and an image display device, a resin, and a method for manufacturing a cured film.

The dispersion composition of the present invention contains a colorant and a resin, in which the resin contains a structural unit A having a polymer chain and a structural unit B having an acid group, and the polymer chain contains 2 or
(Continued)

more structural units GF, and the structural unit GF is selected from the group consisting of a structural unit composed of an oxyalkylene group and a structural unit composed of an oxyalkylene carbonyl group.

32 Claims, 4 Drawing Sheets

(51) Int. Cl.

| | |
|---|---|
| *C08G 63/08* | (2006.01) |
| *C08G 63/91* | (2006.01) |
| *C08L 33/04* | (2006.01) |
| *C09D 4/06* | (2006.01) |
| *C09D 5/00* | (2006.01) |
| *C09D 5/32* | (2006.01) |
| *C09D 133/04* | (2006.01) |
| *C09D 187/00* | (2006.01) |
| *G02B 5/00* | (2006.01) |
| *G02B 5/20* | (2006.01) |
| *G02B 5/22* | (2006.01) |
| *G02F 1/1335* | (2006.01) |
| *H01L 27/146* | (2006.01) |
| *H01L 27/32* | (2006.01) |
| *H01L 33/44* | (2010.01) |

(52) U.S. Cl.
CPC ............ *C08G 63/912* (2013.01); *C08L 33/04* (2013.01); *C09D 4/06* (2013.01); *C09D 5/00* (2013.01); *C09D 5/32* (2013.01); *C09D 133/04* (2013.01); *C09D 187/005* (2013.01); *G02B 5/003* (2013.01); *G02B 5/20* (2013.01); *G02B 5/223* (2013.01); *G02F 1/133514* (2013.01); *H01L 27/14618* (2013.01); *H01L 27/322* (2013.01); *H01L 33/44* (2013.01)

(58) Field of Classification Search
CPC ... C09D 4/06; C09D 5/00; C09D 5/32; C09D 133/04; C09D 187/005; G02B 5/003; G02B 5/20; G02B 5/223; G02F 1/133514; H01L 27/14618; H01L 27/322; H01L 33/44
USPC ........................................................ 252/586
See application file for complete search history.

(56) References Cited

U.S. PATENT DOCUMENTS

| | | |
|---|---|---|
| 2010/0186625 A1 | 7/2010 | Kanaya |
| 2010/0216960 A1 | 8/2010 | Ahrens et al. |
| 2011/0124824 A1 | 5/2011 | Nagata et al. |
| 2014/0163161 A1 | 6/2014 | Sulser et al. |
| 2015/0264231 A1 | 9/2015 | Murayama et al. |
| 2016/0062235 A1 | 3/2016 | Itou et al. |

FOREIGN PATENT DOCUMENTS

| | | | |
|---|---|---|---|
| EP | 2302454 A1 | | 3/2011 |
| JP | 2-24311 A | | 1/1990 |
| JP | 2005-313070 A | | 11/2005 |
| JP | 2006-273892 A | | 10/2006 |
| JP | 2006-274031 A | | 10/2006 |
| JP | 2007-126608 A | | 5/2007 |
| JP | 2007-231268 A | | 9/2007 |
| JP | 2008-272604 A | | 11/2008 |
| JP | 2008272604 | * | 11/2008 |
| JP | 2009-001683 A | | 1/2009 |
| JP | 2010-539306 A | | 12/2010 |
| JP | 2011-070156 A | | 4/2011 |
| JP | 2011-089108 A | | 5/2011 |
| JP | 2012-96945 A | | 5/2012 |
| JP | 2012096945 | * | 5/2012 |
| JP | 2013-76086 A | | 4/2013 |
| JP | 2013-249417 A | | 12/2013 |
| JP | 2014-526570 A | | 10/2014 |
| TW | 201403223 A | | 1/2014 |
| WO | 2013/180035 A1 | | 12/2013 |

OTHER PUBLICATIONS

International Search Report dated Apr. 25, 2017 in counterpart international application No. PCT/JP2017/004567.
Written Opinion dated Apr. 25, 2017 in counterpart international application No. PCT/JP2017/004567.
International Preliminary Report on Patentability with translation of Written Opinion dated Sep. 4, 2018 in counterpart international application No. PCT/JP2017/004567.
Office Action dated Dec. 17, 2019, from the Japanese Patent Office in Japanese application No. 2018-502982.
Office Action dated Dec. 19, 2019 from the Korean Intellectual Property Office in Korean application No. 10-2018-7024291.
Communication dated Oct. 8, 2019, from the Japanese Patent Office in counterpart Application No. 2018-502982.
Communication dated Feb. 5, 2020, issued by the Taiwan Patent Office in Application No. 106105932.
Office Action dated Jan. 26, 2021 by the Japanese Patent Office in Japanese Application No. 2020-068188.

* cited by examiner

DISPERSION COMPOSITION, CURABLE COMPOSITION, LIGHT-SHIELDING FILM, COLOR FILTER, SOLID-STATE IMAGING DEVICE, IMAGE DISPLAY DEVICE, RESIN, AND METHOD FOR MANUFACTURING CURED FILM

CROSS-REFERENCE TO RELATED APPLICATIONS

This application is a Continuation of PCT International Application No. PCT/JP2017/004567 filed on Feb. 8, 2017, which claims priority under 35 U.S.C. § 119(a) to Japanese Patent Application No. 2016-037972 filed on Feb. 29, 2016 and Japanese Patent Application No. 2016-106313 filed on May 27, 2016. Each of the above applications is hereby expressly incorporated by reference, in its entirety, into the present application.

BACKGROUND OF THE INVENTION

1. Field of the Invention

The present invention relates to a dispersion composition, a curable composition, a light-shielding film, a color filter, a solid-state imaging device, an image display device, a resin, and a method for manufacturing a cured film.

2. Description of the Related Art

In the related art, a dispersion composition containing a colorant is applied to various uses. Usually, in order to uniformly disperse the colorant in the dispersion composition, a dispersant is often used.

For example, in JP2013-76086A, a graft copolymer containing a structural unit having a predetermined graft chain is used as a dispersant.

SUMMARY OF THE INVENTION

The present inventors examined characteristics of a dispersion composition containing the graft copolymer specifically described in JP2013-76086A and have found that in a case where the dispersion composition is placed under a low temperature environment, there is a problem that precipitates are generated in the dispersion composition.

Further, the dispersion composition containing the colorant is mixed with a polymerization initiator and a polymerizable compound, and used as a curable composition. In order to form a patterned cured film using this curable composition, a developing treatment is performed in some cases. Thus, it is also required that the curable composition exhibits excellent developability.

Accordingly, an object of the present invention is to provide a dispersion composition from which a curable composition having excellent developability can be obtained and in which generation of precipitates under a low temperature environment is suppressed.

Further, another object of the present invention is to provide a curable composition, a light-shielding film obtained by curing the curable composition, a color filter containing a cured film obtained by curing the curable composition, a solid-state imaging device and an image display device, a resin, and a method for manufacturing a cured film.

The present inventors performed intensive studies to address the above problems, and, as a result, have found that the above problems can be solved by using a dispersion composition containing a colorant and a resin, in which the above-mentioned resin contains a structural unit A having a polymer chain containing a predetermined structural unit and a structural unit B having an acid group. Based on this finding, the present inventors have completed the present invention.

That is, the present inventors have found that the above objects can be achieved by the following constitution.

[1] A dispersion composition comprising:
a colorant; and
a resin,
in which the resin contains a structural unit A having a polymer chain and a structural unit B having an acid group,
the polymer chain contains two or more structural units GF, and
each of the structural units GF is selected from the group consisting of a structural unit composed of an oxyalkylene group and a structural unit composed of an oxyalkylene carbonyl group.

[2] The dispersion composition according to [1],
in which a polymer forming the polymer chain has a crystallization temperature of less than 20.0° C.

[3] The dispersion composition according to [1] or [2],
in which the polymer chain contains a structural unit $L^1$ represented by Formula (1), and a structural unit $L^2$ selected from the group consisting of a structural unit represented by Formula (2) and a structural unit represented by Formula (3).

[4] The dispersion composition according to [3],
in which the structural unit A is represented by Formula (A), and the structural unit B is represented by Formula (B).

[5] The dispersion composition according to [4],
in which a sum of p and q in Formula (A) is greater than 5 and less than 120.

[6] The dispersion composition according to any one of [3] to [5],
in which a mass ratio of the structural unit $L^1$ to the structural unit $L^2$ is greater than 50/50 and less than 95/5.

[7] The dispersion composition according to any one of [3] to [6],
in which the structural unit $L^1$ and the structural unit $L^2$ are each a structural unit obtained by ring-opening polymerization of a cyclic compound.

[8] The dispersion composition according to [7],
in which the cyclic compound is a lactone compound.

[9] The dispersion composition according to [8],
in which the lactone compound is at least one selected from the group consisting of β-propiolactone, β-butyrolactone, β-valerolactone, γ-butyrolactone, γ-valerolactone, γ-caprylolactone, δ-valerolactone, β-methyl-δ-valerolactone, δ-stearolactone, ε-caprolactone, 2-methyl-ε-caprolactone, 4-methyl-ε-caprolactone, ε-caprylolactone, and ε-palmitolactone.

[10] The dispersion composition according to any one of [1] to [9],
in which the structural unit A has a formula weight of 500 to 30,000.

[11] The dispersion composition according to any one of [1] to [10],
in which a content of the structural unit A is 10% to 90% by mass with respect to the entire mass of the resin, and
a content of the structural unit B is 10% to 90% by mass with respect to the entire mass of the resin.

[12] The dispersion composition according to any one of [1] to [11],
in which the resin has a weight average molecular weight of 1,000 to 100,000.

[13] The dispersion composition according to any one of [1] to [12],
in which the resin has an acid value of 35 to 250 mgKOH/g.

[14] The dispersion composition according to any one of [1] to [13], further comprising a solvent.

[15] The dispersion composition according to [14], in which the solvent includes two or more solvents.

[16] A curable composition comprising:
the dispersion composition according to any one of [1] to [15];
a polymerizable compound; and
a polymerization initiator.

[17] The curable composition according to [16], further comprising an alkali-soluble resin.

[18] The curable composition according to [16] or [17], in which the colorant contains a black pigment.

[19] The curable composition according to [18], in which the black pigment is titanium oxynitride.

[20] The curable composition according to [18], in which the black pigment is titanium nitride.

[21] The curable composition according to [18], in which the black pigment is at least one selected from the group consisting of niobium oxynitride and niobium nitride.

[22] A method for manufacturing a cured film, comprising:
a step of coating the curable composition according to any one of [16] to [21] onto a base material to form a curable composition layer;
a step of irradiating the curable composition layer with actinic rays or radiation to perform exposure; and
a step of developing the curable composition after the exposure to form a cured film.

[23] A color filter comprising a cured film that is obtained by curing the curable composition according to any one of [16] to [21].

[24] A light-shielding film that is obtained by curing the curable composition according to any one of [18] to [21].

[25] A solid-state imaging device comprising a cured film that is obtained by curing the curable composition according to any one of [16] to [21].

[26] An image display device comprising a cured film that is obtained by curing the curable composition according to any one of [16] to [21].

[27] A resin comprising:
a structural unit A having a polymer chain; and
a structural unit B having an acid group,
in which the polymer chain contains two or more structural units GF, and
each of the structural units GF is selected from the group consisting of a structural unit composed of an oxyalkylene group and a structural unit composed of an oxyalkylene carbonyl group.

[28] The resin according to [27],
in which a polymer forming the polymer chain has a crystallization temperature of less than 20.0° C.

[29] The resin according to [27] or [28],
in which the polymer chain contains a structural unit $L^1$ represented by Formula (1), and a structural unit $L^2$ selected from the group consisting of a structural unit represented by Formula (2) and a structural unit represented by Formula (3).

[30] The resin according to [29],
in which the structural unit A is represented by Formula (A) and the structural unit B is represented by Formula (B).

[31] The resin according to [30],
in which a sum of p and q in Formula (A) is greater than 5 and less than 120.

[32] The resin according to any one of [29] to [31],
in which a mass ratio of the structural unit $L^1$ to the structural unit $L^2$ is greater than 50/50 and less than 95/5.

[33] The resin according to any one of [29] to [32],
in which the structural unit $L^1$ and the structural unit $L^2$ are structural units obtained by ring-opening polymerization of a cyclic compound.

[34] The resin according to [33],
in which the cyclic compound is a lactone compound.

[35] The resin according to [34],
in which the lactone compound is at least one selected from the group consisting of β-propiolactone, β-butyrolactone, β-valerolactone, γ-butyrolactone, γ-valerolactone, γ-caprylolactone, δ-valerolactone, β-methyl-δ-valerolactone, δ-stearolactone, ε-caprolactone, 2-methyl-ε-caprolactone, 4-methyl-ε-caprolactone, ε-caprylolactone, and ε-palmitolactone.

[36] The resin according to any one of [27] to [33],
in which the structural unit A has a formula weight of 500 to 30,000.

[37] The resin according to any one of [27] to [36],
in which a content of the structural unit A is 10% to 90% by mass with respect to the entire mass of the resin, and
a content of the structural unit B is 10% to 90% by mass with respect to the entire mass of the resin.

[38] The resin according to any one of [27] to [37],
in which the resin has a weight average molecular weight of 1,000 to 100,000.

[39] The resin according to any one of [27] to [38],
in which the resin has an acid value of 35 to 250 mgKOH/g.

According to the present invention, it is possible to provide a dispersion composition from which a curable composition having excellent developability can be obtained and in which generation of precipitates under a low temperature environment is suppressed.

Further, according to the present invention, it is possible to provide a curable composition, a light-shielding film obtained by curing the curable composition, a color filter containing a cured film obtained by curing the curable composition, a solid-state imaging device and an image display device, a resin, and a method for manufacturing a cured film.

DESCRIPTION OF THE PREFERRED EMBODIMENTS

Figure 1:
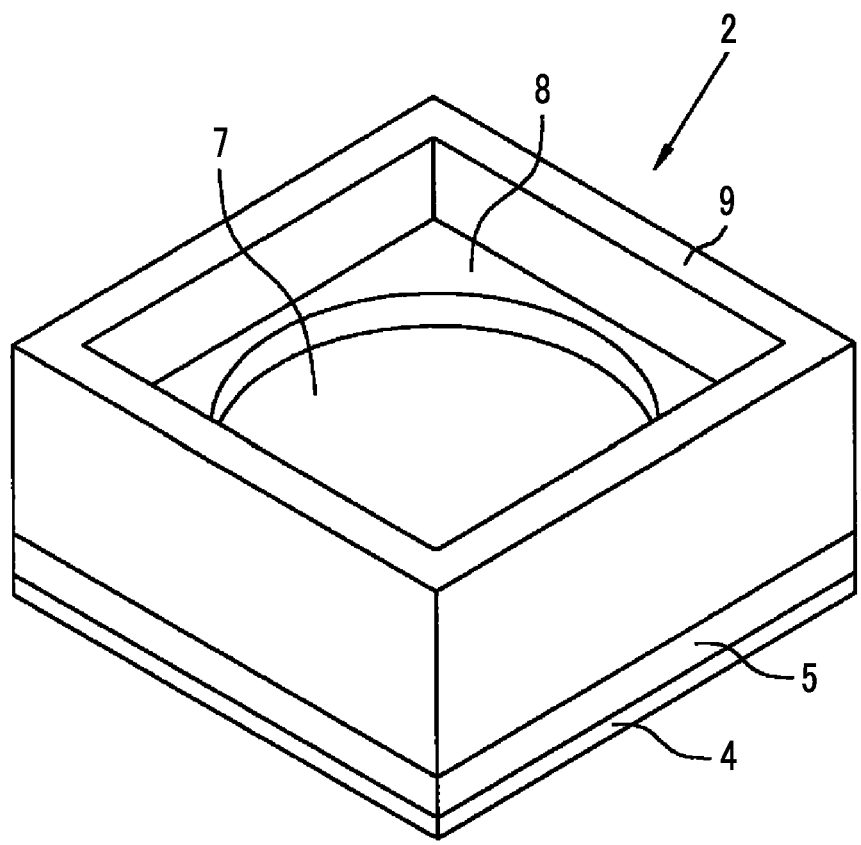
FIG. 1 is a perspective view showing a solid-state imaging device according to a first embodiment.

Hereinafter, the present invention will be described in detail.

Description of the constituent requirements described below may be made on the basis of representative embodiments of the present invention. However, the present invention is not limited to such embodiments.

In the present specification, in a case where a group (atomic group) is indicated without specifying whether it is substituted or unsubstituted, it includes a group having a substituent as well as a group having no substituent as long as effects of the present invention are not impaired. For example, an "alkyl group" includes not only an alkyl group having no substituent (unsubstituted alkyl group) but also an alkyl group having a substituent (substituted alkyl group). This also has the same meaning for each compound.

Further, in the present specification, a "radiation" means to include, for example, a bright line spectrum of mercury lamp, excimer laser, far ultraviolet rays, extreme ultraviolet rays (EUV light), X rays, electron beam, and the like. In addition, in the present specification, light means actinic rays or radiation. In the present specification, unless otherwise stated, "exposure" means to include not only exposure by mercury lamp, excimer laser, X rays, EUV light, or the like but also drawing by particle beam such as electron beam and ion beam.

Further, in the present specification, "(meth)acrylate" represents either or both of acrylate and methacrylate, and "(meth)acrylic" represents either or both of acrylic and methacrylic.

Further, in the present specification, a "monomeric substance" has the same meaning as a "monomer". In the present specification, a monomer is distinguished from an oligomer and a polymer, and, unless otherwise stated, refers to a compound having a weight average molecular weight of 2,000 or less. In the present specification, a polymerizable compound refers to a compound having a polymerizable functional group, and may be a monomer or a polymer. The polymerizable functional group refers to a group involved in the polymerization reaction.

Further, in the present specification, "preparation" means to include not only providing a specific material by synthesis, compounding, or the like, but also procuring a predetermined product by purchase or the like.

Further, a numerical range expressed by using a preposition "to" in the present specification means a range including numerical values described before and after the preposition "to" as a lower limit and an upper limit, respectively.

[Dispersion Composition]

The dispersion composition of the present invention is a dispersion composition containing a colorant and a resin. Here, the resin contains a structural unit A having a polymer chain and a structural unit B having an acid group, in which the polymer chain contains two or more structural units GF, and the structural unit GF is selected from the group consisting of a structural unit composed of an oxyalkylene group and a structural unit composed of an oxyalkylene carbonyl group.

According to the present invention, it is possible to provide a dispersion composition from which a curable composition having excellent developability can be obtained and in which generation of precipitates under a low temperature environment is suppressed (hereinafter also referred to as "having an effect of the present invention").

Although this is not clearly established, the present inventors make a presumption as follows.

A dispersion composition containing a colorant and a resin may be stored under a low temperature environment and/or transported under a low temperature environment in order to maintain quality thereof. In addition, the dispersion composition may be used under a low temperature environment. Precipitates generated during storage, transportation, and/or use under the above-mentioned low temperature environment can cause deterioration of quality of the dispersion composition. The deterioration of quality of the dispersion composition mentioned here means, for example, that the above-mentioned precipitates remain as a foreign matter in a coating film obtained by applying the dispersion composition and/or a curable composition containing the dispersion composition, and thus various defects easily occur. As the above-mentioned defects, for example, unintentional scattering of light due to the precipitates in a case where the above-mentioned coating film is irradiated with the light, and the like are mentioned.

The present inventors have newly discovered that in a case where crystallinity of the resin in the dispersion composition is high, precipitates are easily generated under a low temperature environment. The present inventors have completed the present invention for the first time by paying attention to crystallinity of the resin the above-mentioned dispersion composition and controlling a primary structure of the resin.

That is, one of features of the present invention includes the fact that the resin contains a structural unit A having a polymer chain and a structural unit B having an acid group, in which the polymer chain contains two or more structural units GF, and the structural unit GF is selected from the group consisting of a structural unit composed of an oxyalkylene group and a structural unit composed of an oxyalkylene carbonyl group.

It is presumed that since the polymer chain contains two or more structural units GF, stereoregularity of a molecular chain of the resin is decreased and crystallinity of the resin is decreased. The respective components contained in the dispersion composition of the present invention will be described in detail below.

[Resin]

The resin contains a structural unit A having a polymer chain and a structural unit B having an acid group. In addition, the polymer chain contains two or more structural units GF, and each of the structural units GF is selected from the group consisting of a structural unit composed of an oxyalkylene group and a structural unit composed of an oxyalkylene carbonyl group.

As long as the resin contains a predetermined structural unit A and a predetermined structural unit B, other structures thereof are not particularly limited, and the resin may have any of linear, branched, and cyclic structures, or may have a structure in which these structures are combined. Further, disposition of the structural unit A and the structural unit B in the resin is not particularly limited, and they may be random-type, alternating-type, or block-type.

<Structural Unit A>

The structural unit A is a structural unit of the resin and has a polymer chain in a structure thereof. Also, it is preferable that the structural unit A has a polymer chain in a side chain.

The polymer chain contains two or more structural units GF. That is, in the polymer chain, two or more structural units GF having different structures from each other are contained. Each of the structural units GF is selected from the group consisting of a structural unit composed of an oxyalkylene group and a structural unit composed of an oxyalkylene carbonyl group.

In the present specification, the oxyalkylene group is represented by Formula (OA). In addition, in the present specification, the oxyalkylene carbonyl group is represented by Formula (OAC).

In Formulas (OA) and (OAC), $R^X$ represents an alkylene group. The alkylene group represented by $R^X$ is not particularly limited, and is preferably a linear or branched alkylene group having 1 to 20 carbon atoms. From the viewpoint that the dispersion composition has more excellent effects of the present invention, the alkylene group is more preferably a linear or branched alkylene group having 2 to 16 carbon atoms, and still more preferably a linear or branched alkylene group having 3 to 12 carbon atoms.

Here, the two or more structural units GF are intended for two or more structural units having different structures from each other. More specifically, as an embodiment of two or more structural units GF, for example, a case where heterogeneous structural units are contained in a polymer chain, such as a combination of a structural unit composed of an oxyalkylene group and a structural unit composed of an oxyalkylene carbonyl group, is mentioned. In addition, an embodiment, in which two or more oxyalkylene groups having different numbers of carbon atoms in an alkylene group are contained in a polymer chain, is mentioned. In addition, an embodiment in which two or more oxyalkylene carbonyl groups having different numbers of carbon atoms in an alkylene group are contained in a polymer chain, is also mentioned. In the above description, reference is made with respect to difference in number of carbon atoms of an alkylene group in the structural unit. However, even in a case where the two structural units have the same number of carbon atoms in an alkylene group, in a case of having different structures (linear or branched), they are considered to be different structural units. For example, —(OCH$_2$CH$_2$CH$_2$)— and —(OCH$_2$CH(CH$_3$))— correspond to structural units with $R^X$ having 3 carbon atoms in Formula (OA), but are considered to be different structural units. In addition, structural units having different branching positions are considered to be different structural units. For example, —(OCH$_2$CH(CH$_3$)CH$_2$)— and —(OCH$_2$CH$_2$CH(CH$_3$))— correspond to different structural units.

A structure of this polymer chain is not particularly limited, and it is sufficient that the structure is formed of a polymer. Examples of the polymer forming the polymer chain include polymers selected from the group consisting of random copolymers, alternating copolymers, and block copolymers.

Further, in order to further improve dispersibility of the colorant in the dispersion composition, a terminal of a molecular chain of each of the above-mentioned polymers may be modified with a known modifier.

(Crystallization Temperature of Polymer)

The polymer may have crystallinity. In a case where the polymer has crystallinity, crystallization temperature of the polymer is not particularly limited, and, in view of obtaining a dispersion composition in which generation of precipitates is further suppressed under a low temperature environment, the crystallization temperature is preferably less than 20.0° C., and more preferably 17° C. or less.

A lower limit of the crystallization temperature is not particularly limited, and the lower limit is preferably higher than −20.0° C., and more preferably higher than −11.0° C.

In the present specification, the crystallization temperature of the polymer is intended to mean a crystallization temperature measured by a method described in the examples as described later by using a differential scanning calorimeter (DSC).

Further, the crystallization temperature of the polymer forming the polymer chain can also be measured from a dispersion composition containing the resin. In a case of measuring the crystallization temperature of the polymer chain from the dispersion composition, hydrochloric acid, sodium hydroxide, or the like may be used to hydrolyze the resin in the dispersion composition under strong acid or strong base conditions so that the polymer chain is separated to obtain a polymer, and measurement may be performed in the same manner as described above.

From the viewpoint that the dispersion composition has more excellent effects of the present invention, the polymer chain preferably contains a structural unit $L^1$ represented by Formula (1), and a structural unit $L^2$ selected from the group consisting of a structural unit represented by Formula (2) and a structural unit represented by Formula (3). In this case, the polymer chain in the structural unit A may contain structural units other than the structural units $L^1$ and $L^2$.

(Structural Unit $L^1$ and Structural Unit $L^2$)

The structural unit $L^1$ is represented by Formula (1), and the structural unit $L^2$ is selected from the group consisting of the structural unit represented by Formula (2) and the structural unit represented by Formula (3). The structural unit represented by Formula (3) corresponds to a structural unit formed by connecting two structural units composed of an oxyalkylene carbonyl group.

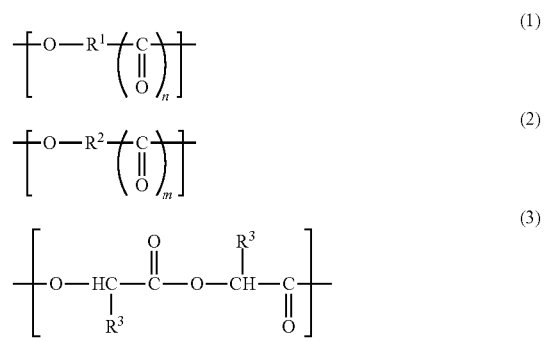

In Formula (1), $R^1$ represents an alkylene group. The alkylene group represented by $R^1$ is not particularly limited, and is preferably a linear or branched alkylene group having 1 to 20 carbon atoms. From the viewpoint that the dispersion composition has more excellent effects of the present invention, the alkylene group is more preferably a linear or branched alkylene group having 2 to 16 carbon atoms, and still more preferably a linear or branched alkylene group having 3 to 12 carbon atoms. Also, n represents 0 or 1.

In Formula (2), $R^2$ represents an alkylene group different from $R^1$. Here, the alkylene group different from the other alkylene group refers to having a different number of carbon atoms and/or a different branched state.

The alkylene group represented by $R^2$ is not particularly limited, and, from the viewpoint that the dispersion composition has more excellent effects of the present invention, the alkylene group is preferably a linear or branched alkylene group having 1 to 20 carbon atoms, and more preferably, a linear or branched alkylene group having 2 to 16 carbon atoms. Also, m represents an integer of 0 or 1.

In a case where the above-mentioned $R^1$ and $R^2$ have different numbers of carbon atoms, either of a number of carbon atoms of the alkylene group represented by $R^1$ and a number of carbon atoms of the alkylene group represented by $R^2$ may be larger than the other. For example, an embodiment, in which the number of carbon atoms of the alkylene group represented by $R^1$ is larger than a number of carbon atoms of the alkylene group represented by $R^2$, is mentioned. In this case, the alkylene group represented by $R^1$ has 2 or more carbon atoms.

Further, a case where the above-mentioned $R^1$ and $R^2$ have different branched states refers to a case where the alkylene group represented by $R^1$ is linear, whereas the alkylene group represented by $R^2$ is branched, or vice versa, or a case where the alkylene groups represented by $R^1$ and $R^2$ are each branched and have different branching numbers and/or embodiments (for example, branching positions).

It is more preferable that n in Formula (1) and m in Formula (2) are the same. That is, it is more preferable that in a case where n is 0, m is also 0, and in a case where n is 1, m is 1. Among these, it is still more preferable that n and m are 1. In a case where n and m are the same, it becomes easier to manufacture a compound that can form the above-mentioned structural unit A by polymerization. Here, the compound which can form the structural unit A by polymerization indicates a compound (hereinafter also referred to as a "macromonomer") which is a raw material for manufacturing a resin and can form the structural unit A having the polymer chain by polymerization.

The structural unit $L^2$ may be a structural unit represented by Formula (3). In Formula (3), $R^3$ represents an alkyl group, and two $R^3$'s in the structural unit may be the same or different from each other. The alkyl group is not particularly limited, and is, for example, preferably a linear or branched alkyl group having 1 to 20 carbon atoms. From the viewpoint that the dispersion composition has more excellent effects of the present invention, the alkyl group is more preferably a linear or branched alkyl group having 1 to 10 carbon atoms, still more preferably an alkyl group having 1 to 5 carbon atoms, and particularly preferably an alkyl group having 1 to 3 carbon atoms. Among these, a methyl group is preferable.

From the viewpoint that manufacture of the structural unit A having a polymer chain becomes easier and quality of the dispersion composition is more stable, the structural unit $L^1$ and the structural unit $L^2$ are preferably structural units obtained by ring-opening polymerization of a cyclic compound.

As the cyclic compound, it is possible to use known ones. As such a cyclic compound, those capable of being ring-opened by hydrolysis are preferable, and examples thereof include cyclic amide compounds such as ε-caprolactam; cyclic urea derivatives such as N,N'-dimethylpropylene urea and 1,3-dimethyl-2-imidazolidinone, and cyclic esters (lactone compounds) such as β-propiolactone, β-butyrolactone, β-valerolactone, γ-butyrolactone, γ-valerolactone, γ-caprylolactone, δ-valerolactone, β-methyl-δ-valerolactone, δ-stearolactone, ε-caprolactone, γ-octanoic lactone, 2-methyl-ε-caprolactone, 4-methyl-ε-caprolactone, ε-caprylolactone, ε-palmitolactone, α-hydroxy-γ-butyrolactone, and α-methyl-γ-butyrolactone; cyclic diesters such as glycolide and lactide; and the like. Among these, from the viewpoint of good reactivity of ring-opening polymerization, the cyclic compound is preferably a lactone compound or lactide; from the viewpoint of higher reactivity and easier availability of raw materials, the cyclic compound is more preferably a lactone compound, and still more preferably at least one selected from the group consisting of β-propiolactone, β-butyrolactone, β-valerolactone, γ-butyrolactone, γ-valerolactone, γ-caprylolactone, β-valerolactone, β-methyl-δ-valerolactone, δ-stearolactone, ε-caprolactone, 2-methyl-ε-caprolactone, 4-methyl-ε-caprolactone, ε-caprylolactone, and ε-palmitolactone.

The resin is preferably a so-called graft copolymer in that it has an action of improving dispersibility of the colorant as described later, in particular, it has more excellent dispersibility of the colorant. That is, the resin is preferably a resin having, in a side chain, a polymer chain contained in the above-mentioned structural unit A. This is because the polymer chain in the resin adsorbs to a surface of a dispersed body and prevents the dispersed body from be reaggregated to one another. In addition, in a dispersion composition containing a solvent, affinity between the resin and the solvent is likely to be high, and dispersion state of the colorant in the dispersion composition is likely to be kept good for a long period of time (hereinafter this is referred to as "having excellent temporal stability"). In addition, affinity of the resin to other resins is likely to be high, and in a case where a coating film is produced using a curable composition containing the dispersion composition and development is performed after exposure, residues are hardly generated in unexposed portions (hereinafter referred to as "having excellent developability").

A length of the polymer chain is not particularly limited. As the polymer chain becomes longer, a steric repulsion effect increases and dispersibility of the colorant is improved. On the other hand, in a case where the polymer chain is too long, absorptivity of the resin to the colorant (for example, black pigment) decreases and dispersibility thereof tends to decrease. Therefore, in the polymer chain, the number of atoms excluding hydrogen atoms is preferably in a range of 40 to 10,000; the number of atoms excluding hydrogen atoms is more preferably 50 to 2,000; and the number of atoms excluding hydrogen atoms is still more preferably 60 to 500.

The above-described resin having a polymer chain can be produced, for example, by polymerizing and/or copolymerizing a macromonomer having a predetermined polymer chain and having a reactive double-bonding group. Examples of the above-mentioned macromonomer include a modified poly(meth)acrylate having the above-mentioned polymer chain at a terminal thereof.

The structural unit A is preferably a structural unit based on a macromonomer represented by Formula (a).

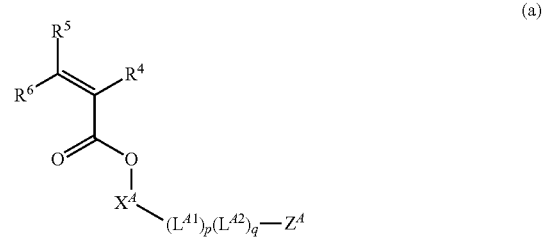

In Formula (a), $R^4$, $R^5$, and $R^6$ each independently represent a hydrogen atom, a halogen atom, or an alkyl group, and, among these, a hydrogen atom, a halogen atom, or an alkyl group having 1 to 6 carbon atoms (for example, a methyl group, an ethyl group, and a propyl group) are preferable.

In Formula (a), $R^4$, $R^5$, and $R^6$ are, more preferably, each independently a hydrogen atom or an alkyl group having 1 to 3 carbon atoms, and, still more preferably, each independently represents a hydrogen atom or a methyl group. In Formula (a), $R^5$ and $R^6$ are, particularly preferably, each a hydrogen atom.

Further, in Formula (a), $X^A$ represents a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group, and a substituted arylene group), a divalent heterocyclic group, a sulfur atom (—S—), an imino group (—NH—), a substituted imino bond (—NR$^{41'}$—, where R$^{41'}$ is an aliphatic group, an aromatic group, or a heterocyclic group), a carbonyl bond (—CO—), and combinations thereof.

The divalent aliphatic group may have a cyclic structure or a branched structure. The number of carbon atoms of the aliphatic group is preferably 1 to 20, more preferably 1 to 15, and still more preferably 1 to 10. The aliphatic group is preferably a saturated aliphatic group rather than an unsaturated aliphatic group. In addition, the aliphatic group may have a substituent. Examples of the substituent include a halogen atom, a hydroxy group, an aromatic group, and a heterocyclic group.

The number of carbon atoms of the divalent aromatic group is preferably 6 to 20, more preferably 6 to 15, and still more preferably 6 to 10. In addition, the aromatic group may have a substituent. Examples of the substituent include a halogen atom, a hydroxy group, an aliphatic group, an aromatic group, and a heterocyclic group.

The divalent heterocyclic group preferably has a 5-membered ring or a 6-membered ring as a heterocyclic ring. Another heterocyclic ring, aliphatic ring, or aromatic ring may be condensed with the heterocyclic ring. In addition, the heterocyclic group may have a substituent. Examples of the substituent include a halogen atom, a hydroxy group, an oxo group (=O), a thioxo group (=S), an imino group (=NH), a substituted imino group (=N—R$^{42}$, where R$^{42}$ is an aliphatic group, an aromatic group, or a heterocyclic group), an aliphatic group, an aromatic group, and a heterocyclic group.

In Formula (a), $L^{A1}$ and $L^{A2}$ each represent the above-mentioned structural unit $L^1$ and structural unit $L^2$. Here, arrangement of $L^{A1}$ and $L^{A2}$ in Formula (a) does not indicate an arrangement sequence of the structural unit $L^1$ and the structural unit $L^2$, and in a case where repetition numbers of the structural unit $L^1$ and the structural unit $L^2$ are p and q, respectively, the arrangement sequence is not limited. That is, the arrangement sequence of the structural unit $L^1$ and the structural unit $L^2$ may be any of random, alternating, or block. In addition, in Formula (A), the structural unit $L^2$ may be bonded to a left terminal group, and the structural unit $L^1$ may be bonded to a right terminal group. From the viewpoint that the dispersion composition has more excellent effects of the present invention, the arrangement sequence of the structural unit $L^1$ and the structural unit $L^2$ is preferably random or alternating. In a case where the arrangement sequence of the structural unit $L^1$ and the structural unit $L^2$ is random or alternating, it is presumed that stereoregularity of a molecular chain of the resin is further decreased and crystallinity of the resin is further decreased.

p and q each represent an integer of 1 or more. p is preferably in a range of 1 to 120, and more preferably in a range of 2 to 60. q is preferably in a range of 1 to 120, and more preferably in a range of 2 to 60.

In Formula (a), $Z^A$ represents a monovalent organic group. A type of the organic group is not particularly limited, and specific examples thereof include an alkyl group, a hydroxy group, an alkoxy group, an aryloxy group, a heteroaryloxy group, an alkylthioether group, an arylthioether group, a heteroaryl thioether group, and an amino group. Among these, the organic group represented by $Z^A$ preferably has a steric repulsion effect, in particular, from the viewpoint of improving dispersibility of the colorant, and is preferably an alkyl group or alkoxy group having 5 to 24 carbon atoms. Among these, a branched alkyl group having 5 to 24 carbon atoms, a cyclic alkyl group having 5 to 24 carbon atoms, or an alkoxy group having 5 to 24 carbon atoms is particularly preferable. An alkyl group contained in the alkoxy group may be any of linear, branched, or cyclic.

From the viewpoint that the dispersion composition has more excellent effects of the present invention, the structural unit A is preferably a structural unit represented by Formula (A).

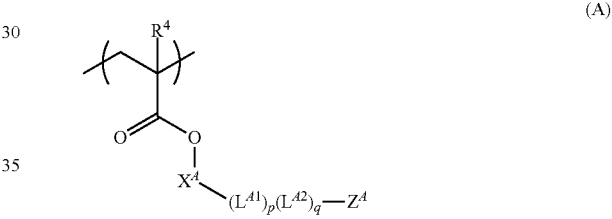

(A)

In Formula (A), $R^4$ represents a hydrogen atom or an alkyl group. Among these, a hydrogen atom or an alkyl group having 1 to 6 carbon atoms (for example, a methyl group, an ethyl group, and a propyl group) is preferable.

Further, in Formula (A), $X^A$ represents a single bond or a divalent linking group. $L^{A1}$ and $L^{A2}$ represent the structural unit $L^1$ and the structural unit $L^2$, respectively. p and q each represent an integer of 1 or more. $Z^A$ represents a hydrogen atom or a monovalent organic group. These suitable embodiments are as described above.

A sum of p and q (hereinafter referred to as "p+q") in Formulas (a) and (A) is preferably greater than 5 and less than 120. In a case where p+q is larger than the lower limit value, the dispersion composition has more excellent temporal stability. On the other hand, in a case where p+q is smaller than the upper limit value, the dispersion composition has properties of further suppressing generation of precipitates under a low temperature environment and has more excellent temporal stability. In addition, it is possible to obtain a curable composition having more excellent developability.

A content of the structural unit $L^1$ in the polymer chain is not particularly limited, and, from the viewpoint of having more excellent effects of the present invention, the content is preferably 2% to 98% by mass, and more preferably 5% to 95% by mass, with respect to the entire mass of the polymer chain.

A content of the structural unit $L^2$ in the polymer chain is not particularly limited, and, from the viewpoint of having more excellent effects of the present invention, the content is preferably 2% to 98% by mass, and more preferably 5% to 95% by mass, with respect to the entire mass of the polymer chain.

A mass ratio of the structural unit $L^1$ to the structural unit $L^2$ is preferably greater than 50/50, and more preferably less than 95/5. In a case where the mass ratio is within the above range, generation of precipitates in the dispersion composition under a low temperature environment is further suppressed. In addition, a curable composition containing the dispersion composition has more excellent developability. In addition, the mass ratio is preferably greater than 50/50, and more preferably less than 90/10. In a case the above-mentioned mass ratio is smaller than the upper limit value, the dispersion composition has more excellent temporal stability.

A formula weight of the structural unit A is preferably 500 to 30,000, and more preferably 1200 to 20,000. In a case where the formula weight is equal to or greater than the upper limit value, the dispersion composition has more excellent temporal stability. On the other hand, in a case where the formula weight is equal to or less than the lower limit value, the dispersion composition has more excellent effects of the present invention and more excellent temporal stability.

In the present specification, in a case where the structural unit A is formed of the above-mentioned macromonomer, the formula weight corresponds to a weight average molecular weight of the macromonomer. The weight average molecular weight of the macromonomer can be measured by the gel permeation chromatography (GPC) method.

Also, in the present specification, the weight average molecular weight is measured by the GPC method which will be described later in detail.

<Structural Unit B>

The structural unit B is a structural unit of a resin and has an acid group in a structure thereof. "Having an acid group in a structure" refers to having an acid group in a side chain that does not contribute to formation of a main chain of the resin. Here, the acid group is a functional group corresponding to definition of at least one of Bronsted acid or Lewis acid, and a derivative group thereof (for example, a functional group having a structure of a salt thereof), and examples thereof include an acid group selected from a carboxylic acid group, a phosphoric acid group, a sulfonic acid group, a phenolic hydroxy group, and a thiol group, and derivative groups thereof (for example, salts of acid groups).

The structural unit B is preferably a structural unit based on a compound (hereinafter also referred to as a "polymerizable monomer") having a reactive double-bonding group from the viewpoint that manufacture of the resin becomes easier. The above-mentioned reactive double-bonding group and acid group may be directly linked or may be bonded via a linking group.

In the present specification, the structural unit B refers to a structural unit that is different from the above-mentioned structural unit A, a structural unit C as described later, and a structural unit D.

Due to having an acid group, the structural unit B is capable of interacting with the colorant (for example, black pigment, in particular, titanium black). In particular, by having an alkali-soluble group, such as a carboxylic acid group, as an acid group, more excellent developability for pattern formation by development can be imparted to the resin. A curable composition containing such a resin has more excellent light-shielding properties and more excellent developability.

Further, by containing a structural unit having an acid group, the resin is easily compatible with a solvent, and coating properties of the dispersion composition and the curable composition to a base material tend to be improved.

This is presumed to be due to the fact that the acid group in the structural unit B easily interacts with the colorant, the structural unit B stably disperses the colorant and, at the same time, viscosity of the resin dispersing the colorant decreases, and the resin itself is easily dispersed stably.

Examples of the acid group which is a functional group capable of interacting with the colorant include a carboxylic acid group, a phosphoric acid group, a sulfonic acid group, a phenolic hydroxy group, or a thiol group. The acid group is preferably at least one of a carboxylic acid group, a sulfonic acid group, or a phosphoric acid group, and a particularly preferable one is a carboxylic acid group having a good absorptivity to the colorant (for example, black pigment) and a high dispersibility thereof.

That is, it is preferable that the resin further has a structural unit having at least one of a carboxylic acid group, a phosphoric acid group, a sulfonic acid group, a phenolic hydroxy group, or a thiol group.

How the acid group is introduced into the resin of the present invention is not particularly limited, and the resin preferably has one or more structural unit selected from structural units derived from monomers represented by General Formulas (ib) to (iiib).

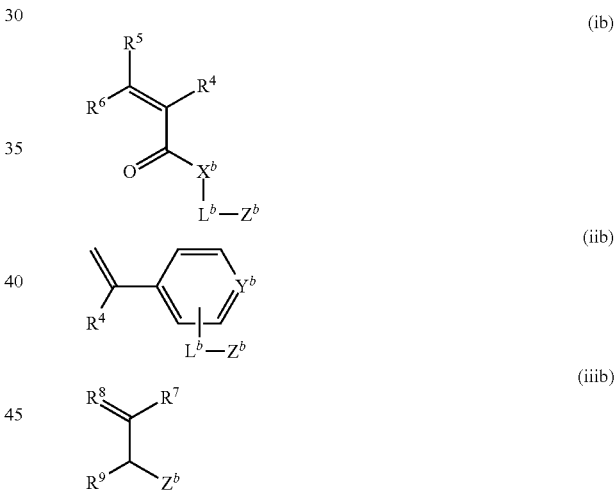

In Formulas (ib) to (iiib), $R^4$, $R^5$, and $R^6$ each independently represent a hydrogen atom, a halogen atom, or an alkyl group, and, among these, a hydrogen atom, a halogen atom, or an alkyl group having 1 to 6 carbon atoms (for example, a methyl group, an ethyl group, and a propyl group) is preferable.

In Formula (ib), $X^b$ represents an oxygen atom (—O—) or an imino group (—NH—), and is preferably an oxygen atom.

Further, in Formula (iiB), $Y^b$ represents a methine group or a nitrogen atom.

Further, in Formulas (ib) to (iiib), $L^b$ represents a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group, and a substituted arylene group), a divalent heterocyclic group, an oxygen atom (—O—), a sulfur atom (—S—), an imino group (—NH—), a substituted imino bond (—NR$^{31'}$—, where R$^{31'}$ is an aliphatic group, an aromatic group, or a heterocyclic group), a carbonyl bond (—CO—), and combinations thereof.

The divalent aliphatic group may have a cyclic structure or a branched structure. The number of carbon atoms of the aliphatic group is preferably 1 to 20, more preferably 1 to 15, and still more preferably 1 to 10. The aliphatic group is preferably a saturated aliphatic group rather than an unsaturated aliphatic group. In addition, the aliphatic group may have a substituent. Examples of the substituent include a halogen atom, a hydroxy group, an aromatic group, and a heterocyclic group.

The number of carbon atoms of the divalent aromatic group is preferably 6 to 20, more preferably 6 to 15, and still more preferably 6 to 10. In addition, the aromatic group may have a substituent. Examples of the substituent include a halogen atom, a hydroxy group, an aliphatic group, an aromatic group, and a heterocyclic group.

The divalent heterocyclic group preferably has a 5-membered ring or a 6-membered ring as a heterocyclic ring. One or more of another heterocyclic ring, aliphatic ring, or aromatic ring may be condensed with the heterocyclic ring. In addition, the heterocyclic group may have a substituent. Examples of the substituent include a halogen atom, a hydroxy group, an oxo group (═O), a thioxo group (═S), an imino group (═NH), a substituted imino group (═N—R$^{32}$ where R$^{32}$ is an aliphatic group, an aromatic group, or a heterocyclic group), an aliphatic group, an aromatic group, and a heterocyclic group.

L$^b$ may be a single bond, an alkylene group, or a divalent linking group containing an oxyalkylene structure. The oxyalkylene structure is more preferably an oxyethylene structure or an oxypropylene structure. In addition, L$^b$ may contain a polyoxyalkylene structure containing two or more oxyalkylene structures in a repeated manner. As the polyoxyalkylene structure, a polyoxyethylene structure or a polyoxypropylene structure is preferable. The polyoxyethylene structure is represented by —(OCH$_2$CH$_2$)v-, where v is preferably an integer of 2 or more, and more preferably an integer of 2 to 10.

In Formulas (ib) to (iiib), Z$^b$ represents an acid group.

In General Formula (iiib), R$^7$, R$^8$, and R$^9$ each independently represent a hydrogen atom, a halogen atom (for example, a fluorine atom, a chlorine atom, and a bromine atom), an alkyl group having 1 to 6 carbon atoms (for example, a methyl group, an ethyl group, and a propyl group), —Z$^b$, or L$^b$-Z$^b$. Here, L$^b$ and Z$^b$ have the same meanings as L$^b$ and Z$^b$ in the above, and suitable embodiments thereof are also the same. R$^7$, R$^8$, and R$^9$ are each independently preferably a hydrogen atom or an alkyl group having 1 to 3 carbon atoms, and more preferably a hydrogen atom.

As a monomer represented by Formula (iib), a compound in which R$^4$ is a hydrogen atom or a methyl group, L$^b$ is an alkylene group, Z$^b$ is a carboxylic acid group, and Y$^b$ is a methine group is preferable.

As a monomer represented by Formula (iiib), a compound in which R$^7$, R$^8$, and R$^9$ are each independently a hydrogen atom or a methyl group, and Z$^b$ is a carboxylic acid group is preferable.

Examples of the monomers include methacrylic acid, crotonic acid, isocrotonic acid, a reaction product of a compound having an addition polymerizable double bond and a hydroxy group in a molecule thereof (for example, 2-hydroxyethyl methacrylate) and succinic anhydride, a reaction product of a compound having an addition polymerizable double bond and a hydroxy group in a molecule thereof and a phthalic anhydride, a reaction product of a compound having an addition polymerizable double bond and a hydroxy group in a molecule thereof and tetrahydroxyphthalic anhydride, a reaction product of a compound having an addition polymerizable double bond and a hydroxy group in a molecule thereof and trimellitic anhydride, a reaction product of a compound having an addition polymerizable double bond and a hydroxy group in a molecule thereof and pyromellitic anhydride, acrylic acid, acrylic acid dimer, acrylic acid oligomer, maleic acid, itaconic acid, fumaric acid, and 4-vinylbenzoic acid.

From the viewpoint of obtaining a dispersion composition having more excellent effects of the present invention, the structural unit B is preferably a structural unit represented by Formula (B).

In Formula (B), R$^4$ represents a hydrogen atom or an alkyl group, and among these, a hydrogen atom or an alkyl group having 1 to 6 carbon atoms (for example, a methyl group, an ethyl group, and a propyl group) is preferable. X$^B$ represents a single bond or a divalent linking group, and Z$^B$ represents a hydrogen atom or an acid group selected from the group consisting of a carboxylic acid group, a phosphoric acid group, a sulfonic acid group, a phenolic hydroxy group, and a thiol group, or a derivative group thereof. In a case where Z$^B$ is a hydrogen atom, X$^B$ represents a single bond. A suitable embodiment of X$^B$ as the divalent linking group is the same as the above-mentioned L$^b$. That is, in a case where X$^B$ is a divalent linking group, it may contain an alkylene group or oxyalkylene structure. The oxyalkylene structure is more preferably an oxyethylene structure or an oxypropylene structure. In addition, X$^B$ may contain a polyoxyalkylene structure containing two or more oxyalkylene structures in a repeated manner. As the polyoxyalkylene structure, a polyoxyethylene structure or a polyoxypropylene structure is preferable. The polyoxyethylene structure is represented by —(OCH$_2$CH$_2$)v-, where v is preferably an integer of 2 or more, and more preferably an integer of 2 to 10.

<Structural Unit C>

The resin used in the present invention may contain a hydrophobic structural unit as a structural unit C as long as effects of the present invention are exhibited. In the present specification, the hydrophobic structural unit does not have a polymer chain containing the structural unit L$^1$ and the structural unit L$^2$, and does not have an acid group.

The hydrophobic structural unit is preferably a structural unit derived from (or corresponding to) a compound (monomer) having a C log P value of 1.2 or more, and more preferably a structural unit derived from a compound having a C log P value of 1.2 to 8.

A C log P value is a value calculated by the program "C LOG P", which is available from Daylight Chemical Information System, Inc. This program provides values of "calculated log P" calculated using Hansch and Leo's fragment approach (see literature below). The fragment approach is based on a chemical structure of a compound, and a log P value of the compound is estimated by dividing the chemical structure into partial structures (fragments) and summing log P contributions allocated to the respective fragments. Details thereof are described in the following literature. In the present invention, C log P values calculated by the program C LOG P v4.82 are used.

A. J. Leo, Comprehensive Medicinal Chemistry, Vol. 4, C. Hansch, P. G. Sammnens; J. B. Taylor and C. A. Ramsden, Eds., p. 295, Pergamon Press, 1990 C.; Hansch & A. J. Leo. Substituent Constants for Correlation Analysis in Chemistry and Biology. John Wiley & Sons; and A. J. Leo. Calculating log Poct from structure. Chem. Rev., 93, 1281-1306, 1993.

A log P means a common logarithm of a partition coefficient P, and is a physical property which represents, as a quantitative numerical value, how an organic compound is distributed in an equilibrium of a two-phase system of oil (typically 1-octanol) and water. The log P is expressed in the following expression.

$$\log P = \log(C_{oil}/C_{water})$$

In the expression, Coil represents a molar concentration of the compound in an oil phase, and Cwater represents a molar concentration of the compound in a water phase.

The above expression means that in a case where the value of log P increases in a positive direction across 0, oil solubility increases, and in a case where an absolute value increases in a negative direction, water solubility increases. The log P has a negative correlation with water solubility of an organic compound and is widely used as a parameter for estimating hydrophilic or hydrophobic properties of the organic compound.

The hydrophobic structural unit preferably has one or more structural units selected from structural units based on monomers represented by General Formulas (i) to (iii).

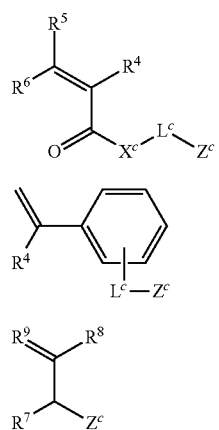

In Formulas (ic) to (iiic), $R^4$, $R^5$, and $R^6$ each independently represent a hydrogen atom, a halogen atom, or an alkyl group, and among these, a hydrogen atom, a halogen atom, or an alkyl group having 1 to 6 carbon atoms (for example, a methyl group, an ethyl group, and a propyl group) is preferable.

$X^c$ and $L^c$ have the same meanings as the above-mentioned $X^b$ and $L^b$ contained in the structural unit B, respectively, and suitable embodiments thereof are also the same. Examples of $Z^c$ include an aliphatic group (for example, an alkyl group, a substituted alkyl group, an unsaturated alkyl group, and a substituted unsaturated alkyl group), an aromatic group (for example, an aryl group, a substituted aryl group, an arylene group, and a substituted arylene group), a heterocyclic group, and combinations thereof. These groups may contain an oxygen atom (—O—), a sulfur atom (—S—), an imino group (—NH—), a substituted imino group (—NR$^{31}$—, where R$^{31}$ is an aliphatic group, an aromatic group, or a heterocyclic group), or a carbonyl group (—CO—).

The aliphatic group may have a cyclic structure or a branched structure. The number of carbon atoms of the aliphatic group is preferably from 1 to 20, more preferably from 1 to 15, and even more preferably from 1 to 10. The aliphatic group further includes a ring-assembled hydrocarbon group and a bridged cyclic hydrocarbon group, and examples of the ring-assembled hydrocarbon group include a bicyclohexyl group, a perhydronaphthalenyl group, a biphenyl group, a 4-cyclohexylphenyl group, and the like. Examples of the bridged cyclic hydrocarbon ring include a bicyclic hydrocarbon ring such as pinane, bornane, norpinane, norbornane, and bicyclooctane ring (bicyclo[2.2.2]octane ring, bicyclo[3.2.1]octane ring, or the like); a tricyclic hydrocarbon ring such as homobredane, adamantane, tricyclo[5.2.1.0$^{2,6}$]decane, and tricyclo[4.3.1.1$^{2,5}$]undecane ring; and a tetracyclic hydrocarbon ring such as tetracyclo [4.4.0.1$^{2,5}$.1$^{7,10}$]dodecane and perhydro-1,4-methano-5,8-methanonaphthalene ring. In addition, the bridged cyclic hydrocarbon ring includes condensed cyclic hydrocarbon rings, for example, a condensed ring formed by condensing a plurality of 5-membered to 8-membered cycloalkane rings such as perhydronaphthalene (decalin), perhydroanthracene, perhydrophenanthrene, perhydroacenaphthene, perhydrofluorene, perhydroindene, and perhydrophenalene ring.

The aliphatic group is preferably a saturated aliphatic group rather than an unsaturated aliphatic group. In addition, the aliphatic group may have a substituent. Examples of the substituent include a halogen atom, an aromatic group, and a heterocyclic group. However, the aliphatic group does not have an acid group as the substituent.

The number of carbon atoms of the aromatic group is preferably 6 to 20, more preferably 6 to 15, and still more preferably 6 to 10. In addition, the aromatic group may have a substituent. Examples of the substituent include a halogen atom, an aliphatic group, an aromatic group, and a heterocyclic group. However, the aromatic group does not have an acid group as the substituent.

The heterocyclic group preferably has a 5-membered ring or a 6-membered ring as a heterocyclic ring. Another heterocyclic ring, aliphatic ring or aromatic ring may be condensed with the heterocyclic ring. In addition, the heterocyclic group may have a substituent. Examples of the substituent include a halogen atom, a hydroxy group, an oxo group (=O), a thioxo group (=S), an imino group (=NH), a substituted imino group (=N—R$^{32}$, where R$^{32}$ is an aliphatic group, an aromatic group, or a heterocyclic group), an aliphatic group, an aromatic group, and a heterocyclic group. However, the heterocyclic group does not have an acid group as the substituent.

In Formula (iiic), $R^7$, $R^8$, and $R^9$ each independently represent a hydrogen atom, a halogen atom (for example, fluorine, chlorine, and bromine), an alkyl group having 1 to 6 carbon atoms (for example, a methyl group, an ethyl group, and a propyl group), $Z^C$, or -L$^C$-Z$^C$. Here, L$^C$ and Z$^C$ have the same meanings as those in the above. R$^7$, R$^8$, and R$^9$ are preferably a hydrogen atom or an alkyl group having 1 to 3 carbon atoms, and more preferably a hydrogen atom.

In the present invention, as a monomer represented by the formula (ic), preferred compounds are those in which $R^4$, $R^5$, and $R^6$ are hydrogen atoms or methyl groups, and $L^c$ is a single bond, an alkylene group, or a divalent linking group containing an oxyalkylene structure, $X^c$ is an oxygen atom or an imino group, and $Z^c$ is an aliphatic group, a heterocyclic group, or an aromatic group.

Further, as a monomer represented by General Formula (iic), preferred compounds are those in which $R^4$ is a hydrogen atom or a methyl group, $L^c$ is an alkylene group, and $Z^c$ is an aliphatic group, a heterocyclic group, or an aromatic group.

Further, as a monomer represented by General Formula (iiic), preferred compounds are those in which $R^7$, $R^8$, and $R^9$ are hydrogen atoms or methyl groups, and $Z^c$ is an aliphatic group, a heterocyclic group, or an aromatic group.

As monomers represented by Formulas (ic) to (iiic), a compound represented by Formula (ic) is more preferable from the viewpoint of having excellent polymerizability. Among these, in Formula (ic), a compound ((meth) acrylic acid esters), in which $R^4$ is a hydrogen atom or a methyl group, $R^5$ and $R^6$ are hydrogen atoms, $L^c$ is a single bond, $X^c$ is an oxygen atom, and $Z^c$ is an aromatic group, is still more preferable, and benzyl (meth)acrylate is most preferable from the viewpoint that more excellent hydrophobicity is exhibited and the dispersion composition has more excellent effects of the present invention.

Examples of representative compounds represented by Formulas (ic) to (iiic) include radically polymerizable compounds selected from acrylic acid esters, methacrylic acid esters, styrenes, and the like.

As examples of representative compounds represented by Formulas (ic) to (iiic), reference can be made to compounds described in paragraph numbers 0089 to 0093 of JP2013-249417A, the contents of which are incorporated herein.

<Structural Unit D>

Furthermore, for the purpose of improving various performances such as image strength, as long as effects of the present invention is not impaired, the resin may further have other structural unit D (for examples, a structural unit having a functional group with an affinity for a dispersion medium used for a dispersion) having various functions which differ from the structural unit A, the structural unit B, and the structural unit C.

Examples of such other structural unit include structural units derived from radically polymerizable compounds selected from acrylonitriles and methacrylonitriles.

The resin can be synthesized according to a known method, and examples of a solvent used in a case of synthesizing the resin include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. These solvents may be used alone or in combination of two or more thereof.

<Content of Each Structural Unit in Resin>

A content of the structural unit A is, respectively, preferably 3% to 90% by mass, more preferably 30% to 90% by mass, and still more preferably 30% to 80% by mass, with respect to the entire mass of the resin. In a case where the content of the structural unit A is within the above-mentioned range, the dispersion composition has more excellent effects of the present invention.

A content of the structural unit B is, respectively, preferably 3% to 90% by mass, more preferably 5% to 70% by mass, and still more preferably 10% to 60% by mass, with respect to the entire mass of the resin. In a case where the content of the structural unit B is within the above-mentioned range, the dispersion composition has more excellent effects of the present invention.

Further, a content of the structural unit C is preferably 3% to 90% by mass, more preferably 5% to 60% by mass, and still more preferably 10% to 40% by mass, with respect to the entire mass of the resin. In a case where the content of the structural unit C is within the above-mentioned range, a curable composition containing the dispersion composition has excellent pattern formation properties.

Further, a content of the structural unit D is preferably 0% to 80% by mass, and more preferably 10% to 60% by mass, with respect to the entire mass of the resin. In a case where the content of the structural unit D is within the above-mentioned range, the curable composition containing the dispersion composition has excellent pattern formation properties.

The respective structural units may be used alone or in combination of two or more thereof.

A weight average molecular weight of the resin is preferably 1,000 to 100,000, more preferably 10,000 to 50,000, and still more preferably 20,000 to 40,000. In a case where the weight average molecular weight of the resin is within the above-mentioned range, the dispersion composition has more excellent effects of the present invention.

The weight average molecular weight of the resin is measured by a method specifically described in the examples as described later.

An acid value of the resin is preferably 35 to 250 mgKOH/g, more preferably 40 to 220 mgKOH/g, and particularly preferably 50 to 200 mgKOH/g. In a case where the acid value of the resin is within the above-mentioned range, it is possible to obtain a curable composition having more excellent developability by using the dispersion composition. In addition, sedimentation of the colorant (for example, titanium black) can be further suppressed and the number of coarse particles can be further decreased, so that temporal stability of the dispersion composition can be further improved.

In the present specification, the acid value of the resin can be calculated from, for example, an average content of acid groups in the resin. In addition, by changing a content of the structural unit containing an acid group which is a structural unit of a resin, a resin having a desired acid value can be obtained.

The acid value can be obtained by neutralization titration using a sodium hydroxide aqueous solution. Specifically, the acid value can be obtained by subjecting a solution, in which a resin is dissolved in a solvent, to titration with a sodium hydroxide aqueous solution using a potentiometric method, so that an amount of acids contained in 1 g of a solid content of the resin is calculated, and then converting the value to a KOH equivalence.

The resin can be synthesized by a known method.

A content of the resin in the dispersion composition is preferably 1% to 70% by mass, and more preferably 5% to 50% by mass, with respect to the entire solid content in the dispersion composition. From the viewpoint that the dispersion composition has more excellent effects of the present invention, the content of the resin is still more preferably 10% to 40% by mass.

Further, in particular, in a case where the resin is introduced as a dispersant into the curable composition, a content of the resin in the curable composition is preferably 0.1% to 50% by mass, and more preferably 0.3% to 40% by mass, with respect to the entire solid content of the curable composition. From the viewpoint of obtaining a curable composition having more excellent developability, the content of the resin is still more preferably 0.5% to 30% by mass. In a case where the content of the resin is within the above-mentioned range, dispersibility of the colorant becomes better.

[Colorant]

As the colorant, various known pigments (coloring pigments) and dyes (coloring dyes) can be used.

As the coloring dye, for example, in a case of being used for manufacturing a color filter, it is possible to use a chromatic color-based dye (chromatic color dye) such as R (red), G (green), or B (blue) which forms a color pixel of a color filter, in addition to colorants described in paragraph numbers 0027 to 0200 of JP2014-42375A. In addition, it is also possible to use a black-based dye (black dye) generally used for forming a black matrix or for forming a light-shielding film.

As the coloring pigment, for example, in a case of being used for manufacturing a color filter, it is possible to use a chromatic color-based pigment (chromatic color pigment) such as R (red), G (green), or B (blue) which forms a color pixel of a color filter, and a black-based pigment (black pigment) generally used for forming a black matrix or for forming a light-shielding film system.

As a chromatic color-based pigment, various inorganic pigments or organic pigments known in the related art can be used. In addition, considering that regardless of whether the pigment is an inorganic pigment or an organic pigment, it is preferable to have a high transmittance, it is preferable to have a smaller average primary particle diameter. On the other hand, in consideration of handleability, the average primary particle diameter is preferably equal to or greater than a certain level. Accordingly, the average primary particle diameter of the pigment is preferably 0.01 µm to 0.1 µm, and more preferably 0.01 µm to 0.05 µm.

The average primary particle diameter of the pigment can be measured using a transmission electron microscope (TEM). As the transmission electron microscope, for example, a transmission type microscope HT7700 manufactured by Hitachi High-Technologies Corporation can be used.

A maximum length (Dmax: maximum length at two points on an outline of a particle image) of the particle image obtained by using a transmission electron microscope and a vertical length to the maximum length (DV-max: shortest length vertically connecting two straight lines parallel to the maximum length in a case where the image is interposed between the two straight lines) were measured and a geometric mean value thereof (Dmax×DV-max)½ was taken as a particle diameter. By using this method, particle diameters of 100 particles were measured, and an arithmetic mean value thereof was taken as the average primary particle diameter of the pigment as an average particle diameter. An "average primary particle diameter" in the examples of the present specification is also the same as the above-mentioned arithmetic mean value.

<Pigment>

Examples of the pigment include various inorganic pigments or organic pigments known in the related art.

Examples of the inorganic pigment include oxides of metals such as iron, cobalt, aluminum, cadmium, lead, copper, titanium, magnesium, chromium, zinc, and antimony, and complex oxides of the above metals.

Examples of the organic pigment can include the following. However, the present invention is not limited thereto.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, or the like, C.I. Pigment Orange 2, 5, 13, 16, 17:1, 31, 34, 36, 38, 43, 46, 48, 49, 51, 52, 55, 59, 60, 61, 62, 64, 71, 73, or the like, C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, or 279

C.I. Pigment Green 7, 10, 36, 37, 58, or 59

C.I. Pigment Violet 1, 19, 23, 27, 32, 37, or 42

C.I. Pigment Blue 1, 2, 15, 15:1, 15:2, 15:3, 15:4, 15:6, 16, 22, 60, 64, 66, 79, or 80

These organic pigments can be used alone or in various combinations thereof in order to increase color purity.

(Black Pigment)

In the present invention, it is also possible to use a black pigment as the pigment. Hereinafter, the black pigment will be described in more detail.

As the black pigment, various known black pigments can be used. In particular, from the viewpoint of realizing a high optical density in a small amount, carbon black, titanium black, titanium nitride, niobium nitride, vanadium nitride, titanium oxide, iron oxide, manganese oxide, graphite, and the like are preferable, and, among these, at least one selected from the group consisting of carbon black, titanium nitride, and titanium black is more preferable. In particular, in the curable composition of the present invention, from the viewpoint of little absorption in a light absorption wavelength range of a polymerization initiator in connection with curing efficiency by exposure, titanium black or titanium nitride is more preferable as the black pigment. Titanium nitride is not particularly limited, and titanium nitride described in, for example, WO2008/123097A, WO2010/147098A, and JP5577659B can be used. Specific examples of carbon black include organic pigments such as C.I. Pigment Black 1 and inorganic pigments such as C.I. Pigment Black 7, which are commercial products, but are not limited thereto.

Titanium Nitride-Containing Particles (Titanium Oxynitride and/or Titanium Nitride)

The black pigment may be titanium oxynitride. Also, the black pigment may be titanium nitride. Hereinafter, titanium oxynitride and titanium nitride are collectively referred to as titanium nitride-containing particles.

For the manufacture of the titanium nitride-containing particles, a vapor-phase reaction method is usually used, and specifically, an electric furnace method, a thermal plasma method, or the like is mentioned. Among these manufacturing methods, the thermal plasma method is preferable for reasons such as less incorporation of impurities, easy equalization of particle diameters, and high productivity.

Examples of a method of generating thermal plasma include DC arc discharge, multiphase arc discharge, radio frequency (RF) plasma, and hybrid plasma, and the radio frequency plasma with less incorporation of impurities from an electrode is preferable. Specific examples of a method for manufacturing the titanium nitride-containing particles by the thermal plasma method include a method of synthesizing titanium nitride-containing particles including evaporating titanium powders by radio frequency thermal plasma to introduce nitrogen into an apparatus as a carrier gas, and nitriding the titanium powders in a cooling step. However, the thermal plasma method is not limited to the above.

The method for manufacturing titanium nitride-containing particles is not particularly limited, and reference can be made to manufacturing methods described in paragraph numbers [0037] to [0089] of WO2010/147098A.

It is preferable that titanium powder materials (titanium particles) used for manufacturing the titanium nitride-containing particles are of high purity. The titanium powder materials are not particularly limited. Those having a purity of titanium atom of 99.99% or more are preferable, and those having a purity of titanium atom of 99.999% or more are more preferably used.

The titanium powder materials (titanium particles) used for manufacturing the titanium nitride-containing particles may contain atoms other than titanium atoms. Examples of other atoms that can be contained in the titanium powder materials include Fe atoms and Si atoms.

In a case where the titanium nitride-containing particles contain Fe atoms, a content of Fe atoms is preferably greater than 0.001% by mass with respect to the entire mass of the titanium powder materials.

In a case where the titanium powder materials contain Si atoms, a content of Si atoms is preferably greater than 0.002% by mass and less than 0.3% by mass, more preferably 0.01% to 0.15% by mass, and still more preferably 0.02% to 0.1% by mass, with respect to the entire mass of the titanium powder materials. In a case where the content of Si atoms is greater than 0.002% by mass, patterning properties of a cured film are further improved. In addition, in a case where the content of Si atoms is less than 0.3% by mass, it is considered to have an effect of suppressing particle generation due to reasons that polarity of the outermost layer of the obtained titanium nitride-containing particles is stabilized, and adsorbability of a dispersant to the titanium nitride-containing particles at the time of dispersing the titanium nitride-containing particles is improved, so that undispersed titanium nitride-containing particles are decreased.

Further, a moisture content in the titanium powder materials (titanium particles) used for manufacturing the titanium nitride-containing particles is preferably less than 1% by mass, and more preferably less than 0.1% by mass, with respect to the entire mass of the titanium powder materials. It is still more preferable that substantially no moisture is contained.

Further, the titanium nitride-containing particles are obtained by the thermal plasma method, so that in a case of using CuKα ray as an X-ray source, a diffraction angle 2θ of a peak derived from a (200) plane (details thereof will be described later) is easily adjusted to a range greater than 42.6° and equal to or less than 43.5°.

A content of titanium atoms (Ti atoms) content in the titanium nitride-containing particles is preferably 10% to 85% by mass, more preferably 15% to 75% by mass, and still more preferably 20% to 70% by mass, with respect to the entire mass of the titanium nitride-containing particles. The content of Ti atoms in the titanium nitride-containing particles can be analyzed by an inductively coupled plasma (ICP) emission spectroscopy.

A content of nitrogen atoms (N atoms) in the titanium nitride-containing particles is preferably 3% to 60% by mass, more preferably 5% to 50% by mass, and still more preferably 10% to 40% by mass, with respect to the entire mass of the titanium nitride-containing particles. The content of nitrogen atoms can be analyzed by an inert gas melting-thermal conductivity method.

The titanium nitride-containing particles contain titanium nitride (TiN) as a main component, and may contain, in part, oxygen atoms due to oxidation of a particle surface or the like, in which oxygen atoms are usually conspicuously present in a case where oxygens are incorporated at the time of performing synthesis thereof and in a case where a particle diameter thereof is small.

The content of oxygen atoms in the titanium nitride-containing particles is preferably 1% to 40% by mass, more preferably 1% to 35% by mass, and still more preferably 5% to 30% by mass, with respect to the entire mass of the titanium nitride-containing particles. The content of oxygen atoms can be analyzed by an inert gas melting-infrared absorption method.

From the viewpoint of dispersion stability and light-shielding properties, a specific surface area of the titanium nitride-containing particle is preferably 5 m2/g or more and 100 m2/g or less, and more preferably 10 m2/g or more and 60 m2/g or less. The specific surface area can be obtained by the Brunauer, Emmett, and Teller (BET) method.

The titanium nitride-containing particles may be composite fine particles composed of titanium nitride-containing particles and metal fine particles.

The composite fine particles refer to particles in which the titanium nitride-containing particles and the metal fine particles are complexed or are in a highly dispersed state. Here, "being complexed" means that the particles are constituted by both components of the titanium nitride-containing particles and the metal, and "highly dispersed state" means that the titanium nitride-containing particles and the metal particles are individually present and the particles, which are a component present in a small amount, are uniformly and equally dispersed without aggregation.

The metal fine particles are not particularly limited, and examples thereof include at least one selected from copper, silver, gold, platinum, palladium, nickel, tin, cobalt, rhodium, iridium, ruthenium, osmium, manganese, molybdenum, tungsten, niobium, tantalum, calcium, bismuth, antimony, lead, and alloys thereof. Among these, at least one selected from copper, silver, gold, platinum, palladium, nickel, tin, cobalt, rhodium and iridium, and alloys thereof is preferable, and at least one selected from copper, silver, gold, platinum, tin, and alloys thereof is more preferable. From the viewpoint of more excellent moisture resistance, silver is preferable.

A content of the metal fine particles in the titanium nitride-containing particles is preferably 5% by mass or more and 50% by mass or less, and more preferably 10% by mass or more and 30% by mass or less, with respect to the entire mass of the titanium nitride-containing particles.

The titanium nitride-containing particles preferably have a diffraction angle 2θ of a peak derived from a (200) plane in a case of using CuKα rays as an X-ray source is greater than 42.6° and equal to or less than 43.5°. In a cured film (for example, a black matrix or the like) obtained by using a curable composition containing the titanium nitride-containing particles having such characteristics, a high optical density (OD) value can be achieved.

In a case where an X-ray diffraction spectrum of a titanium compound is measured with CuKα rays as an X-ray source, as the strongest peak, a peak derived from the (200) plane is observed in the vicinity of 2θ=42.5° for TiN, and a peak derived from the (200) plane is observed in the vicinity of 2θ=43.4° for TiO. On the other hand, although it is not the strongest peak, a peak derived from the (200) plane is observed in the vicinity of 2θ=48.1° for the anatase-type $TiO_2$, and a peak derived from the (200) plane is observed in the vicinity of 2θ=39.2° for rutile-type $TiO_2$. Therefore, as more oxygen atoms are contained in a crystalline state, a peak position is shifted to a higher angle side with respect to 42.5°.

The diffraction angle 2θ of the peak derived from the (200) plane of the titanium nitride-containing particles is preferably greater than 42.6° and less than 43.5° from the viewpoint of temporal stability of the particles, more preferably equal to or greater than 42.7° and less than 43.5° from the viewpoint of excellent process margin during manufacturing, and still more preferably equal to or greater than 42.7° and less than 43.4° from the viewpoint of excellent reproducibility of particle performance. In a case where titanium oxide $TiO_2$ is contained as a minor component, as the strongest peak, a peak derived from anatase-type $TiO_2$ (101) is observed in the vicinity of 2θ=25.3°, and a peak derived from rutile-type $TiO_2$ (110) is observed in the vicinity of 2θ=27.4°. However, since $TiO_2$ is white and becomes a factor of decreasing light-shielding properties of the black matrix, it is preferable that $TiO_2$ is decreased to such an extent that it is not observed as a peak.

From a half-width of an X-ray diffraction peak, a crystallite size constituting the titanium nitride-containing particles can be obtained and it is calculated by using Scherrer's equation.

The crystallite size is preferably 20 nm or more, and more preferably 20 to 50 nm. By forming a black matrix using titanium nitride-containing particles having a crystallite size of 20 nm or more, transmitted light of a cured film exhibits a blue to blue-violet color whose peak wavelength is 475 nm or less, and it is possible to obtain a black matrix having both high light-shielding properties and ultraviolet sensitivity. In a case where the crystallite size is 20 nm or more, a proportion of a particle surface having activity which occupies a particle volume becomes small, and a good balance is obtained, so that the titanium nitride-containing particles are more excellent in heat resistance and/or durability.

Niobium Nitride-Containing Particles (Niobium Oxynitride and/or Niobium Nitride)

Further, the black pigment may be at least one selected from the group consisting of niobium oxynitride and niobium nitride.

In the present specification, the black pigment containing niobium oxynitride and/or niobium nitride is also referred to as "niobium nitride-containing particles" hereinafter.

For the manufacture of the niobium nitride-containing particles, a vapor-phase reaction method is usually used, and specifically, an electric furnace method, a thermal plasma method, or the like is mentioned. Among these manufacturing methods, the thermal plasma method is preferable for reasons such as less incorporation of impurities, easy equalization of particle diameters, and high productivity.

Examples of a specific method for manufacturing the niobium nitride-containing particles by the thermal plasma method include one using a metal fine particle-manufacturing apparatus. The metal fine particle-manufacturing apparatus includes, for example, a plasma torch for generating thermal plasma, a material supply device for supplying metal raw material powders into the plasma torch, a chamber having a cooling function, a cyclone for classifying the produced metal fine particles, and a collector for collecting the metal fine particles.

In the present specification, the term "niobium fine particles" means metal fine particles containing niobium and having a primary particle diameter of 20 nm to 40 μm.

The method for manufacturing the niobium nitride-containing particles using the metal fine particle-manufacturing apparatus is not particularly limited, and a known method can be used. Among these, from the viewpoint of achieving high yield of the niobium nitride-containing particles having a predetermined average primary particle diameter as described below, the method for manufacturing the niobium nitride-containing particles using the metal fine particle-manufacturing apparatus preferably includes the following steps.

Step A: A step of supplying an inert gas containing no nitrogen gas as a plasma gas into the plasma torch to generate a thermal plasma flame.

Step B: A step of supplying niobium raw material powders to the thermal plasma flame in the plasma torch and evaporating the niobium raw material powders to obtain vapor-phase niobium.

Step C: A step of cooling the vapor-phase niobium to obtain niobium fine particles.

Step D: A step of supplying an inert gas containing nitrogen gas into the plasma torch as a plasma gas to generate a thermal plasma flame.

Step E: A step of supplying the niobium fine particles to the thermal plasma flame in the plasma torch and evaporating the niobium fine particles to obtain vapor-phase niobium.

Step F: A step of cooling the vapor-phase niobium to obtain niobium nitride-containing particles.

Further, the method for manufacturing the niobium nitride-containing particles may include the following step G, as desired, after the step C and/or the step F as described above.

Step G: A step of classifying the obtained particles.

Step A

Step A is a step of supplying an inert gas containing no nitrogen gas as a plasma gas into the plasma torch to generate a thermal plasma flame. A method of generating the thermal plasma flame is not particularly limited. Examples thereof include a DC arc discharge method, a multiphase arc discharge method, a radio frequency plasma method, a hybrid plasma method, and the like, and a radio frequency plasma method with less incorporation of impurities from an electrode is preferable.

A method of generating a thermal plasma flame by the radio frequency plasma method is not particularly limited. Examples thereof include a method in which a plasma gas is supplied into a plasma torch containing a radio frequency oscillation coil and a quartz tube, and a radio frequency current is applied to the radio frequency oscillation coil to obtain a thermal plasma flame.

As the plasma gas in step A, an inert gas containing no nitrogen gas is used. Examples of the inert gas containing no nitrogen gas include argon gas and hydrogen gas. Inert gases containing no nitrogen gas may be used alone or may be used in combination of two or more thereof.

Step B

Step B is a step of supplying the niobium raw material powders to the thermal plasma flame in the plasma torch and evaporating the niobium raw material powders to obtain vapor-phase niobium. The method of supplying the niobium raw material powders to the thermal plasma flame in the plasma torch is not particularly limited, and it is preferable that the powders are atomized by using a carrier gas from the viewpoint that the resulting vapor-phase niobium becomes more uniform. As the carrier gas, it is preferable to use an inert gas containing no nitrogen gas. An embodiment of the inert gas containing no nitrogen gas is as described above.

Step C

Step C is a step of cooling the vapor-phase niobium to obtain niobium fine particles. A cooling method is not particularly limited, and it is preferable to use a chamber having a cooling function. By introducing the vapor-phase niobium which is obtained in the above-mentioned step B into the chamber having a cooling function and performing rapid cooling in the chamber, it is possible to produce niobium fine particles having a desired particle diameter as described below. The produced niobium fine particles are collected by, for example, the collector. As an atmosphere in the chamber, an inert gas containing no nitrogen gas is preferable. An embodiment of the inert gas containing no nitrogen gas is as described above.

Niobium fine particles are obtained through the above-mentioned steps A to C. The niobium fine particles easily evaporate in the step E. In addition, even in a case where the niobium raw material powders contain impurities, it is possible to remove the impurities through the above-mentioned steps A to C.

Step D

Step D is a step of supplying an inert gas containing a nitrogen gas as a plasma gas into the plasma torch to generate a thermal plasma flame. Examples of the inert gas containing nitrogen include a nitrogen gas and a nitrogen gas containing an inert gas. Examples of the inert gas include argon gas and hydrogen gas. The nitrogen gas containing an inert gas is not particularly limited, and a content of the nitrogen gas is usually about 10 to 90 mol %, and preferably about 30 to 60 mol %. Other embodiments are the same as in the step A.

Step E

Step E is a step of supplying the niobium fine particles to the thermal plasma flame in the plasma torch and evaporating the niobium fine particles to obtain vapor-phase niobium. A method of supplying the niobium fine particles to the thermal plasma flame in the plasma torch is as described above, and, as the carrier gas, an inert gas containing nitrogen is preferable. An embodiment of the inert gas containing nitrogen is as described above.

In the step E, niobium which has become the niobium fine particles by the steps A to C is supplied to the thermal plasma flame. Thus, vapor-phase niobium is easily obtained and a state of the vapor-phase niobium easily becomes more uniform.

Step F

Step F is a step of cooling the vapor-phase niobium to obtain niobium nitride-containing particles containing niobium nitride and/or niobium oxynitride. A suitable embodiment of a cooling method is as described above, and an atmosphere in the chamber is preferably an inert gas containing nitrogen gas. A suitable embodiment of the inert gas containing a nitrogen gas is as described above.

Step G

Step G is a step of classifying the obtained niobium fine particles and/or niobium nitride-containing particles. A classification method is not particularly limited, and, for example, a cyclone can be used. The cyclone has a conical container and has a function of generating a swirling flow in the container and classifying particles by using centrifugal force. The classification is preferably performed under an atmosphere of an inert gas. An embodiment of the inert gas is as described above.

Step H

Step H is a step of exposing the niobium nitride-containing particles to a mixed atmosphere of water vapor and nitrogen gas, thereby performing a nitriding treatment. Through this step, a content of the niobium nitride in the niobium nitride-containing particles can be increased. A method of exposing the niobium nitride-containing particles to the mixed atmosphere of water vapor and nitrogen gas is not particularly limited. Examples thereof include a method in which the niobium nitride-containing particles are introduced into a constant-temperature tank filled with a mixed gas of water vapor and nitrogen gas, and are allowed to stand or stirred for a predetermined time, in which it is preferable to allow the particles to stand from the viewpoint that a surface of the niobium nitride-containing particles and a crystal boundary thereof are more stabilized.

As a mixing ratio of water vapor and nitrogen gas, in the atmosphere, a condition that allows a relative humidity of 25 to 95% is preferable. In addition, the time during which the particles are allowed to stand or stirred is preferably 0.5 to 72 hours, and a temperature at that time is preferably 10° C. to 40° C.

It is preferable that the niobium powder materials (niobium particles) used for manufacturing the niobium nitride-containing particles are of high purity. The niobium powder materials are not particularly limited. Those having a purity of niobium atom of 99.99% or more are preferable, and those having a purity of niobium atom of 99.999% or more are more preferably used.

The niobium powder materials (niobium particles) used for manufacturing the niobium nitride-containing particles may contain atoms other than niobium atoms. Examples of other atoms that can be contained in the niobium powder materials include Fe atoms and Si atoms.

In a case where the niobium nitride-containing particles contain Fe atoms, a content of Fe atoms is preferably greater than 0.001% by mass with respect to the entire mass of the niobium powder materials.

In a case where the niobium powder materials contain Si atoms, a content of Si atoms is preferably greater than 0.002% by mass and less than 0.3% by mass, more preferably 0.01% to 0.15% by mass, and still more preferably 0.02% to 0.1% by mass, with respect to the entire mass of the niobium powder materials. In a case where the content of Si atoms is greater than 0.002% by mass, patterning properties of a cured film are further improved. In addition, in a case where the content of Si atoms is less than 0.3% by mass, it is considered to have an effect of suppressing particle generation due to reasons that polarity of the outermost layer of the obtained niobium nitride-containing particles is stabilized, and adsorbability of a dispersant to the niobium nitride-containing particles at the time of dispersing the niobium nitride-containing particles is improved, so that undispersed niobium nitride-containing particles are decreased.

Further, a moisture content in the niobium powder materials (niobium particles) used for manufacturing the niobium nitride-containing particles is preferably less than 1% by mass, and more preferably less than 0.1% by mass, with respect to the entire mass of the niobium powder materials. It is still more preferable that substantially no moisture is contained.

A content of niobium atoms in the niobium nitride-containing particles is preferably 10% to 85% by mass, more preferably 15% to 75% by mass, and even more preferably 20% to 70% by mass, with respect to the entire mass of the niobium nitride-containing particles. The content of Ti atoms in the niobium nitride-containing particles can be analyzed by an ICP emission spectroscopy.

A content of nitrogen atoms (N atoms) in the niobium nitride-containing particles is preferably 3% to 60% by mass, more preferably 5% to 50% by mass, and still more preferably 10% to 40% by mass, with respect to the entire mass of the niobium nitride-containing particles. The content of nitrogen atoms can be analyzed by an inert gas melting-thermal conductivity method.

The niobium nitride-containing particles contain niobium nitride as a main component, and may contain, in part, oxygen atoms due to oxidation of a particle surface or the like, in which oxygen atoms are usually conspicuously present in a case where oxygens are incorporated at the time of performing synthesis thereof and in a case where a particle diameter thereof is small.

The content of oxygen atoms in the niobium nitride-containing particles is preferably 1% to 40% by mass, more preferably 1% to 35% by mass, and still more preferably 5% to 30% by mass, with respect to the entire mass of the niobium nitride-containing particles. The content of oxygen atoms can be analyzed by an inert gas melting-infrared absorption method.

From the viewpoint of dispersion stability and light-shielding properties, a specific surface area of the niobium nitride-containing particles is preferably 5 m2/g or more and 100 m2/g or less, and more preferably 10 m2/g or more and 60 m2/g or less. The specific surface area can be obtained by the Brunauer, Emmett, and Teller (BET) method.

The niobium nitride-containing particles may be composite fine particles composed of niobium nitride-containing particles and metal fine particles.

The composite fine particles refer to particles in which the niobium nitride-containing particles and the metal fine particles are complexed or are in a highly dispersed state. Here, "being complexed" means that the particles are constituted by both components of the niobium nitride-containing particles and the metal, and "highly dispersed state" means that the niobium nitride-containing particles and the metal particles are individually present and the particles, which are a component present in a small amount, are uniformly and equally dispersed without aggregation.

The metal fine particles are not particularly limited, and examples thereof include at least one selected from copper, silver, gold, platinum, palladium, nickel, tin, cobalt, rhodium, iridium, ruthenium, osmium, manganese, molybdenum, tungsten, titanium, tantalum, calcium, bismuth, antimony, lead, and alloys thereof. Among these, at least one selected from copper, silver, gold, platinum, palladium, nickel, tin, cobalt, rhodium and iridium, and alloys thereof is preferable, and at least one selected from copper, silver, gold, platinum, tin, and alloys thereof is more preferable. From the viewpoint of more excellent moisture resistance, silver is preferable.

A content of the metal fine particles in the niobium nitride-containing particles is preferably 5% by mass or more and 50% by mass or less, and more preferably 10% by mass or more and 30% by mass or less, with respect to the entire mass of the niobium nitride-containing particles.

(Other Pigments)

In the present invention, as the pigment, in addition to the pigment described as the black pigment, a pigment having infrared ray absorbability can also be used.

As the pigment having infrared ray absorbability, a tungsten compound, a metal boride, and the like are preferable, and among these, a tungsten compound is more preferable from the viewpoint of excellent light-shielding properties at wavelengths in an infrared ray region.

Two or more of these pigments may be used in combination, or they may be used in combination with a dye. In order to adjust a tint and/or to improve light-shielding properties in a desired wavelength range, for example, an embodiment, in which a black pigment or a pigment having infrared ray shielding properties is mixed with a chromatic pigment or dye such as red, green, yellow, orange, violet, and blue as described above, is used. It is preferable to mix a black pigment or a pigment having infrared ray shielding properties with a red pigment or dye, or a violet pigment or dye, and it is more preferable to mix a black pigment or a pigment having infrared ray shielding properties with a red pigment.

The black pigment preferably contains titanium black.

Titanium black is a black particle containing a titanium atom. Preferred examples thereof include low-order titanium oxide and titanium oxynitride. In titanium black, it is possible to modify a surface thereof as necessary for the purpose of improving dispersibility and suppressing aggregating properties. It is possible to coat titanium black with silicon oxide, titanium oxide, germanium oxide, aluminum oxide, magnesium oxide, or zirconium oxide. Further, it is also possible to subject titanium black to a surface treatment with a water repellent material as shown in JP2007-302836A.

A specific surface area of titanium black is not particularly limited, and, in order to allow water repellency of titanium black after surface treatment thereof with a water repellent agent to become a predetermined performance, a value measured by the Brunauer, Emmett, and Teller (BET) method is preferably 5 m2/g or more and 150 m2/g or less, and more preferably 20 m2/g or more and 120 m2/g or less.

Examples of commercial products of titanium black include TITANIUM BLACK 10S, 12S, 13R, 13M, 13M-C, 13R, 13R-N, 13M-T (all trade names, manufactured by Mitsubishi Materials Corporation), and Tilack D (trade name, manufactured by Ako Kasei Co., Ltd.).

Furthermore, it is also preferable to contain titanium black as a dispersed body containing titanium black and Si atoms.

In this embodiment, titanium black is contained as a dispersed body in a dispersion composition, and a content ratio of Si atoms to Ti atoms (Si/Ti) in the dispersed body is, in terms of mass, preferably 0.05 or more, more preferably 0.05 to 0.5, and still more preferably 0.07 to 0.4.

Here, the dispersed body includes both one in which titanium black is in a state of primary particles and one in which titanium black is in a state of aggregates (secondary particles).

In order to change the Si/Ti of the dispersed body (for example, to be 0.05 or more), known means can be used.

Titanium black whose Si/Ti is, for example, adjusted to 0.05 or more, can be, for example, produced by the method described in paragraph number [0005] and paragraph numbers [0016] to [0021] of JP2008-266045A.

The content ratio (Si/Ti) of Si atoms to Ti atoms in the dispersed body can be measured, for example, by using the method (1-1) or method (1-2) described in paragraph number 0033 of JP2013-249417A.

Further, with respect to a dispersed body contained in the light-shielding film obtained by curing the composition, in determining whether the content ratio (Si/Ti) of Si atoms to Ti atoms in the dispersed body is 0.05 or more, the method (2) described in paragraph number 0035 of JP2013-249417A is used.

In the dispersed body containing titanium black and Si atoms, as titanium black, those as described above can be used.

Further, in this dispersed body, for the purpose of adjusting dispersibility, coloring properties, and the like, black pigments formed of a composite oxide such as Cu, Fe, Mn, V, or Ni, cobalt oxide, iron oxide, carbon black, aniline black, and the like may be used alone or in combination of two or more thereof, together with titanium black, as the dispersed body.

In this case, it is preferable that a dispersed body composed of titanium black accounts for 50% by mass or more of the entire dispersed body.

Further, in this dispersed body, for the purpose of adjusting light-shielding properties or the like, as long as an effect of the present invention is not impaired, other colorants (organic pigments or dyes, or the like) may be used in combination with titanium black as desired.

Hereinafter, materials used for introducing Si atoms into the dispersed body will be described. In a case of introducing Si atoms into the dispersed body, a Si-containing substance such as silica may be used.

Examples of silica that can be used can include precipitated silica, fumed silica, colloidal silica, and synthetic silica, which may be appropriately selected and used.

Furthermore, in a case where a particle diameter of silica particles is smaller than a film thickness of the light-shielding film, since more excellent light-shielding properties are obtained, it is preferable to use fine particle-type silica as the silica particles. Examples of the fine particle-type silica include silica described in paragraph number 0039 of JP2013-249417A, the contents of which are incorporated herein.

Further, as the pigment, as described above, a tungsten compound and/or a metal boride can also be used.

Hereinafter, the tungsten compound and the metal boride will be described in detail.

The tungsten compound and the metal boride are an infrared ray shielding material which exhibits high absorption for infrared rays (light having a wavelength of about 800 to 1200 nm) (that is, has high light-shielding properties (shielding properties) against infrared rays) and exhibits low absorption for visible light. Therefore, by containing the tungsten compound and/or the metal boride, a curable composition containing the dispersion composition of the present invention as described later can form a pattern which exhibits high light-shielding properties in an infrared region and exhibits high light-transmitting properties in a visible light region.

Further, the tungsten compound and the metal boride also exhibit low absorption for light of shorter wavelength than a visible region which is used for exposure by a high-pressure mercury lamp, KrF, ArF, or the like used for image formation. Therefore, by combining with a polymerizable compound, an alkali-soluble resin, and a photopolymerization initiator, in the curable composition of the present invention which will be described later, excellent patterns can be obtained and development residues can be further suppressed in pattern formation.

Examples of the tungsten compound can include a tungsten oxide-based compound, a tungsten boride-based compound, and a tungsten sulfide-based compound, and a tungsten oxide-based compound represented by General Formula (composition formula) (I) is preferable.

$$M_xW_yO_z \quad (I)$$

M represents a metal, W represents tungsten, and O represents oxygen.

$$0.001 \leq x/y \leq 1.1$$

$$2.2 \leq z/y \leq 3.0$$

Examples of the metal of M include an alkali metal, an alkaline earth metal, Mg, Zr, Cr, Mn, Fe, Ru, Co, Rh, Jr, Ni, Pd, Pt, Cu, Ag, Au, Zn, Cd, Al, Ga, In, Tl, Sn, Pb, Ti, Nb, V, Mo, Ta, Re, Be, Hf, Os, and Bi. The metal of M may be one or two or more.

M is preferably the alkali metal, more preferably Rb or Cs, and still more preferably Cs.

In a case where x/y is 0.001 or more, it is possible to sufficiently shield infrared rays, and in a case where it is 1.1 or less, it is possible to more reliably prevent an impurity phase from being generated in the tungsten compound.

In a case where z/y is 2.2 or more, it is possible to further improve chemical stability of the compound as a material, and in a case where it is 3.0 or less, it is possible to sufficiently shield infrared rays.

Specific examples of the tungsten oxide-based compound represented by General Formula (I) can include $Cs_{0.33}WO_3$, $Rb_{0.33}WO_3$, $K_{0.33}WO_3$, and $Ba_{0.33}WO_3$; and $Cs_{0.33}WO_3$ or $Rb_{0.33}WO_3$ is preferable, and $Cs_{0.33}WO_3$ is more preferable.

The tungsten compound is preferably fine particles. An average particle diameter of the tungsten fine particles is preferably 800 nm or less, more preferably 400 nm or less, and still more preferably 200 nm or less. In a case where the average particle diameter thereof is in such a range, since the tungsten fine particles hardly block visible light by light scattering, it is possible to obtain more reliable light-transmitting properties in a visible light region. From the viewpoint of avoiding light scattering, the average particle diameter of the tungsten fine particles is preferably as small as possible, but it is usually 1 nm or more for reasons such as ease of handling during manufacturing.

Further, two or more of the tungsten compounds can be used.

The tungsten compound is available as a commercial product. However, in a case where the tungsten compound is, for example, a tungsten oxide-based compound, the tungsten oxide-based compound can be obtained by a method of subjecting a tungsten compound to a heat treatment in an inert gas atmosphere or a reducing gas atmosphere (see JP4096205B).

Further, the tungsten oxide-based compound is, for example, also available as a dispersion of tungsten fine particles such as YMF-02 manufactured by Sumitomo Metal Mining Co., Ltd.

Further, examples of the metal boride can include one or two or more of lanthanum boride ($LaB_6$), praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB$, $CrB_2$), molybdenum boride ($MoB_2$, $Mo_2B_5$, $MoB$), and tungsten boride ($W_2B_5$), and lanthanum boride ($LaB_6$) is preferable.

The metal boride is preferably fine particles. An average particle diameter of the metal boride fine particles is preferably 800 nm or less, more preferably 300 nm or less, and still more preferably 100 nm or less. In a case where the average particle diameter thereof is in such a range, since the metal boride fine particles hardly block visible light by light scattering, light-transmitting properties in a visible light region are further improved. From the viewpoint of avoiding light scattering, the average particle diameter of the metal boride fine particles is preferably as small as possible, but it is usually 1 nm or more for reasons such as ease of handling during manufacturing.

Further, two or more of the metal borides can be used.

Metal borides are available as commercial products, and are, for example, also available as a dispersion of metal boride fine particles such as KHF-7 manufactured by Sumitomo Metal Mining Co., Ltd.

<Dye>

As dyes, for example, colorants described in JP1989-90403A (JP-S64-90403A), JP1989-91102A (JP-S64-91102A), JP1989-94301A (JP-H1-94301A), JP1994-11614A (JP-H6-11614A), JP2592207B, US4808501A, US5667920A, US505950A, JP1993-333207A (JP-H5-333207A), JP1994-35183A (JP-H6-35183A), JP1994-51115A (JP-H6-51115A), JP1994-194828A (JP-H6-194828A), and the like can be used. In a case of being categorized as a chemical structure, a pyrazole azo compound, a pyrromethene compound, an aniline azo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like can be used. In addition, as the dye, a colorant multimer may be used. Examples of the colorant multimer include compounds described in JP2011-213925A and JP2013-041097A.

Further, in the present invention, as the colorant, a colorant having an absorption maximum in a range of wavelengths 800 to 900 nm can be used.

Examples of the colorant having such spectral characteristics include a pyrrolopyrrole compound, a copper compound, a cyanine compound, a phthalocyanine compound, an iminium compound, a thiol complex-based compound, a transition metal oxide-based compound, a squarylium compound, a naphthalocyanine compound, a quaterrylene compound, a dithiol metal complex-based compound, and a croconium compound.

For the phthalocyanine compound, the naphthalocyanine compound, the iminium compound, the cyanine compound, the squarylium compound, and the croconium compound, compounds disclosed in paragraph numbers 0010 to 0081 of JP2010-111750A may be used, the contents of which are incorporated herein. For the cyanine compound, reference can be made to, for example, "Functional colorants, written by Okawara Shin, Matsuoka Ken, Kitao Teijirou, and Hirashima Kousuke, published by Kodansha Scientific Ltd.", the contents of which are incorporated herein.

As the colorants having the above spectral characteristics, it is also possible to use compounds disclosed in paragraph numbers 0004 to 0016 of JP07-164729A and/or compounds disclosed in paragraph numbers 0027 to 0062 of JP2002-146254A. In addition, it is also possible to use near infrared ray-absorbing particles composed of crystallites of oxides containing Cu and/or P and having a number average aggregated particle diameter of 5 to 200 nm which are disclosed in paragraph numbers 0034 to 0067 of JP2011-164583A.

In the present invention, the colorant having an absorption maximum in a range of wavelengths 800 to 900 nm is preferably a pyrrolopyrrole compound. The pyrrolopyrrole compound may be a pigment or dye, and is preferably a pigment due to the reason that a film having excellent heat resistance can be formed in the curable composition containing the dispersion composition of the present invention.

Regarding details of the pyrrolopyrrole compound, reference can be made to description of paragraph numbers 0017 to 0047 of JP2009-263614A, the contents of which are incorporated herein. In addition, specific examples thereof include compounds described in paragraph numbers 0049 to 0058 of JP2009-263614A, the contents of which are incorporated herein.

Dye multimers described in paragraph numbers 0027 to 0200 of JP2014-199436A can also be suitably used. In addition, a salt-forming compound obtained by reacting a resin having a cationic group in a side chain described in paragraph numbers 0018 to 0078 of JP2011-242752A with an anionic dye can be suitably used as the dye multimer.

Furthermore, the dispersion composition of the present invention may contain an extender pigment as necessary. Examples of such extender pigment can include barium sulfate, barium carbonate, calcium carbonate, silica, basic magnesium carbonate, alumina white, gloss white, titanium white, and hydrotalcite. These extender pigments can be used alone or in admixture of two or more thereof. The amount used of the extender pigment is usually 0 to 100 parts by mass, preferably 5 to 50 parts by mass, and more preferably 10 to 40 parts by mass, with respect to 100 parts by mass of the colorant. In the present invention, the colorant and extender pigment can be used by modifying their surface with a polymer as the case may be.

Further, in addition to the black pigment or the pigment which has excellent transmittance of a light having a wavelength in a visible light region and thus has an excellent function of shielding a light having a wavelength in an infrared region, a colored organic pigment or dye such as red, blue, yellow, green, and violet may be contained. In a case where the colored organic pigment or dye, and the black pigment or the pigment which has excellent transmittance of a light having a wavelength in a visible light region and thus has an excellent function of shielding a light having a wavelength in an infrared region are used in combination, a red pigment or dye is preferably used in an amount of 1% to 40% by mass with respect to the black pigment or the pigment which has excellent transmittance of a light having a wavelength in a visible light region and thus has an excellent function of shielding a light having a wavelength in an infrared region, and as the red pigment or dye, Pigment Red 254 is preferable.

A content of the colorant (particularly preferably black pigment) in the dispersion composition is preferably 20% to 80% by mass, more preferably 30% to 70% by mass, and still more preferably 35% to 60% by mass, with respect to the entire solid content in the dispersion composition.

[Other Optional Components]

<Solvent>

The dispersion composition of the present invention may contain a solvent.

As the solvent, water or an organic solvent is mentioned.

As examples of the organic solvent, for example, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, ethyl lactate, and the like are mentioned, but not limited thereto.

Although the solvents may be used alone, it is preferable to use two or more of organic solvents in combination from the viewpoint that generation of precipitates under a low temperature environment is further suppressed. By using two or more of organic solvents in combination, it is considered that solubility of the resin is improved, and generation of precipitates under a low temperature environment is further suppressed.

In a case where two or more of organic solvents are used in combination, particularly preferably, the solvents are composed of two or more selected, from the group consisting of 3-ethoxypropionic acid methyl, ethyl 3-ethoxypropionate, ethylcellosolve acetate, ethyl lactate, diethylene glycol dimethyl ether, butyl acetate, methyl 3-methoxypropionate, 2-heptanone, cyclohexanone, cyclopentanone, ethyl carbitol acetate, butyl carbitol acetate, propylene glycol methyl ether, and propylene glycol methyl ether acetate.

An amount of the solvent contained in the dispersion composition is preferably 10% to 90% by mass, and more preferably 20% to 85% by mass, with respect to the entire mass of the dispersion composition.

[Method for Manufacturing Dispersion Composition]

The dispersion composition of the present invention can be manufactured by mixing the above-mentioned various components using a known mixing method (for example, a stirrer, a homogenizer, a high-pressure emulsification apparatus, a wet type pulverizer, and a wet type dispersing machine).

In preparing the composition, the respective components constituting the composition may be blended at once, or the respective components may be sequentially blended after being dissolved or dispersed in a solvent. In addition, introduction sequence and working conditions at the time of blending are not particularly limited.

In a case of manufacturing the dispersion composition of the present invention, it is preferable to have a step of filtering the dispersion composition with a filter for the purpose of removing foreign matters and reducing defects. In a case of filtering the dispersion composition with a filter, it is more preferable that the dispersion composition is stored for a long time under low temperature and, after the storage, a filtration step is carried out for the dispersion composition.

Further, in a case where the dispersion composition contains a pigment, a step of dispersing the pigment may be carried out.

In the step of dispersing the pigment, a mechanical force used for dispersing the pigment includes compression, squeezing, impact, shearing, cavitation, or the like. Specific examples of these processes include a beads mill, a sand mill, a roll mill, a ball mill, a high speed impeller, a sand grinder, a flow jet mixer, high-pressure wet atomization, ultrasonic dispersion, and the like. In addition, processes and dispersing machines, described in "Encyclopedia of Dispersion Technology, issued by JOHOKIKO Co., Ltd., Jul. 15, 2005" and "Practical comprehensive data collection on dispersion technology centered on suspension (solid/liquid dispersion system) and industrial application thereof, issued by Publishing Department of Management Development Center, Oct. 10, 1978", can be suitably used.

Further, in the step of dispersing the pigment, the pigment may be subjected to a fining treatment by a salt milling step. For materials, equipment, processing conditions, and the like used in the salt milling step, those described in, for example, JP2015-194521A and JP2012-046629A can be used.

[Curable Composition]

A curable composition of the present invention contains the above-described dispersion composition, a polymerizable compound, and a polymerization initiator. One of features of the curable composition of the present invention is that it contains a dispersion composition in which generation of precipitates is suppressed under a low temperature environment. Since the curable composition of the present invention contains a dispersion composition in which residues are hardly generated during storage, transportation and/or use under a low temperature environment, foreign matters due to precipitates are hardly generated in a coating film formed by using the curable composition of the present invention. Therefore, residues hardly remain in unexposed portions of the coating film after exposure step and developing step as described later, and the curable composition of the present invention has excellent developability. Hereinafter, the respective components contained in the curable composition of the present invention will be described in detail.

[Dispersion Composition]

The curable composition of the present invention contains a dispersion composition. Suitable embodiments for the dispersion composition are as described above.

[Polymerizable Compound]

The curable composition of the present invention contains a polymerizable compound.

The polymerizable compound is preferably a compound having at least one addition-polymerizable ethylenically unsaturated group and having a boiling point of 100° C. or more at normal pressure.

Examples of the compound having at least one addition-polymerizable ethylenic unsaturated group and having a boiling point of 100° C. or more at normal pressure include monofunctional acrylate or methacrylate such as polyethylene glycol mono(meth)acrylate, polypropylene glycol mono(meth)acrylate, and phenoxyethyl (meth)acrylate; polyethylene glycol di(meth)acrylate, trimethylol ethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl)ether, and tri(acryloyloxyethyl)isocyanurate. In addition, one obtained by (meth)acrylation after addition of ethylene oxide or propylene oxide to a multifunctional alcohol such as glycerin and trimethylolethane; one obtained by poly(meth)acrylation of pentaerythritol or dipentaerythritol; urethane acrylates described in JP1973-41708B (JP-S48-41708B), JP1975-6034B (JP-S50-6034B), and JP1976-37193 (JP-S51-37193B); polyester acrylates described in JP1973-64183A (JP-S48-64183A), JP1974-43191B (JP-S49-43191B), and JP1977-30490B (JP-S52-30490B); and multifunctional acrylates and methacrylates such as epoxy acrylates which are reaction products of epoxy resins and (meth)acrylic acids are also mentioned. Furthermore, those described as photocurable monomers or oligomers in the Journal of the Adhesion Society of Japan, Vol. 20, No. 7, pp. 300 to 308 can also be used.

Further, a compound obtained by (meth)acrylation after addition of ethylene oxide or propyleneoxide to a multifunctional alcohol, which is represented by General Formula (1)

and General Formula (2) in JP1998-62986A (JP-H10-62986A), along with specific examples thereof, can also be used.

Among these, a structure in which dipentaerythritol penta (meth)acrylate, dipentaerythritol hexa(meth) acrylate, and acryloyl groups thereof are linked to dipentaerythritol via an ethylene glycol residue or a propylene glycol residue is preferable. Oligomer types thereof can also be used.

Further, urethane acrylates as described in JP1973-41708B (JP-S48-41708B), JP1976-37193A (JP-S51-37193A), JP1990-32293B (JP-H2-32293B), and JP1990-16765B (JP-H2-16765B), or urethane compounds having an ethylene oxide-based skeleton as described in JP1983-49860B (JP-S58-49860B), JP1981-17654B (JP-S56-17654B), JP1987-39417B (JP-S62-39417B), and JP1987-39418B (JP-S62-39418B) are also suitable. Furthermore, by using addition-polymerizable compounds having an amino structure or a sulfide structure in a molecule thereof as described in JP1988-277653A (JP-S63-277653A), JP1988-260909A (JP-S63-260909A), and JP1989-105238A (JP-H1-105238A), it is possible to obtain a photopolymerizable composition which is highly excellent in photosensitive speed. Examples of commercial products include urethane oligomer UAS-10, UAB-140 (trade name, manufactured by Nippon Paper Chemicals Co., Ltd.), UA-7200 (manufactured by Shin-Nakamura Chemical Co., Ltd.), DPHA-40H (trade name, manufactured by Nippon Kayaku Co., Ltd.), UA-306H, UA-306T, UA-306I, AH-600, T-600, AI-600 (trade name, manufactured by Kyoeisha Chemical Co., Ltd).

Further, ethylenically unsaturated compounds having an acid group are also suitable, and examples of commercial products thereof include TO-756 which is a trifunctional acrylate containing a carboxylic acid group and TO-1382 which is a 5-functional acrylate containing a carboxylic acid group, all manufactured by Toagosei Co., Ltd. As the polymerizable compound used in the present invention, a tetrafunctional or higher functional acrylate compound is more preferable.

The polymerizable compounds may be used alone or in combination of two or more thereof.

In a case where two or more polymerizable compounds are used in combination, an embodiment of combination can be appropriately set according to physical properties and the like required for the composition. One suitable embodiment of combination of the polymerizable compounds is, for example, an embodiment in which two or more polymerizable compounds selected from the above-mentioned polyfunctional acrylate compounds are combined, and one example thereof is a combination of dipentaerythritol hexaacrylate and pentaerythritol triacrylate.

A content of the polymerizable compound in the curable composition of the present invention is preferably 3% to 55% by mass, and more preferably 5% to 50% by mass, with respect to the entire solid content in the composition.

[Polymerization Initiator]

The curable composition of the present invention contains a polymerization initiator.

The polymerization initiator is not particularly limited, and known polymerization initiators can be used, for example, those having photosensitivity, so-called photopolymerization initiators, are preferable.

<Photopolymerization Initiator>

A photopolymerization initiator is not particularly limited as long as it has an ability to initiate polymerization of the polymerizable compound, and can be appropriately selected from known photopolymerization initiators. For example, those having photosensitivity to a light in an ultraviolet-ray region to a visible light region are preferable. In addition, it may also be an activator which causes some actions with a photosensitized sensitizer and produces an active radical. In addition, it may be an initiator which initiates cationic polymerization depending on a type of monomer. In addition, the photopolymerization initiator preferably has at least one compound having a molecular light absorption coefficient of at least about 50 in a range of about 300 nm to 800 nm (more preferably 330 nm to 500 nm).

The photopolymerization initiator is preferably a compound having at least an aromatic group, and examples thereof include (bis)acylphosphine oxide or esters thereof, an acetophenone-based compound, an α-aminoketone compound, a benzophenone-based compound, a benzoin ether-based compound, a ketal derivative compound, a thioxanthone compound, an oxime ester compound, a hexaarylbiimidazole compound, a trihalomethyl compound, an azo compound, an organic peroxide, a diazonium compound, an iodonium compound, a sulfonium compound, an azinium compound, an onium salt compound such as a metallocene compound, an organoboron salt compound, and a disulfone compound. From the viewpoint of sensitivity, an oxime ester compound, an acylphosphine oxide-based compound, an acetophenone-based compound, a α-aminoketone compound, a trihalomethyl compound, a hexaarylbiimidazole compound, or a thiol compound is preferable, and an oxime ester compound is more preferable. In a case where a black pigment is used as a colorant, excellent lithography properties are easily obtained by using an oxime ester compound as the photopolymerization initiator.

As the photopolymerization initiator, a hydroxyacetophenone compound, an aminoacetophenone compound, and an acylphosphine compound can also be suitably used. More specifically, for example, an aminoacetophenone-based initiator described in JP1998-291969A (JP-H10-291969A) and an acylphosphine oxide-based initiator described in JP4225898B can also be used. As the hydroxyacetophenone initiator, IRGACURE-184, DAROCUR-1173, IRGACURE-500, IRGACURE-2959, and IRGACURE-127 (all trade names, manufactured by BASF) can be used. As the aminoacetophenone-based initiator, commercial products IRGACURE-907, IRGACURE-369, and IRGACURE-379 (all trade names: manufactured by BASF) can be used. As the aminoacetophenone-based initiator, compounds described in JP2009-191179A, of which absorption wavelength matches a long wave light source at 365 nm, 405 nm, or the like, can also be used. As the acylphosphine-based initiator, commercial products IRGACURE-819 and DAROCUR-TPO (trade name: manufactured by BASF) can be used.

As specific examples of the oxime compound, compounds described in JP2001-233842A, compounds described in JP2000-80068A, and compounds described in JP2006-342166A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, compounds described in J. C. S. Perkin II (1979) pp. 1653 to 1660, J. C. S. Perkin II (1979) pp. 156 to 162, Journal of Photopolymer Science and Technology (1995) pp. 202 to 232, JP2000-66385A, compounds described in JP2000-80068A, JP2004-534797A, and JP2006-342166A are mentioned.

IRGACURE-OXE 01 (manufactured by BASF) and IRGACURE-OXE 02 (manufactured by BASF) are also preferably used as commercial products. In addition, TRONLY TR-PBG-304, TRONLY TR-PBG-309, TRONLY TR-PBG-305 (manufactured by CHANGZHOU TRONLY NEW ELECTRONIC MATERIALS CO., LTD) and ADEKA ARKLS NCI-930 (manufactured by ADEKA Co., Ltd.) can also be used.

Further, as the oxime compound other than those as described above, a compound described in JP2009-519904A in which an oxime is linked to a N-position of carbazole, a compound described in U.S. Pat. No. 7,626,957B in which a hetero substituent is introduced at a benzophenone moiety, compounds described in JP2010-15025A and US2009-292039A in which a nitro group is introduced at a colorant moiety, a ketoxime compound described in WO2009-131189A, a compound described in U.S. Pat. No. 7,556,910B in which a triazine skeleton and an oxime skeleton are contained in the same molecule, a compound described in JP2009-221114A, which has an absorption maximum at 405 nm and has good sensitivity to a g-ray light source, and the like may be used. Preferably, for example, reference can be made to paragraph numbers 0274 to 0275 of JP2013-29760A, the contents of which are incorporated herein.

In the present invention, as the photopolymerization initiator, an oxime compound having a fluorene ring can also be used. Specific examples of the oxime compound having a fluorene ring include compounds described in JP2014-137466A. The contents thereof are incorporated herein.

In the present invention, as the photopolymerization initiator, an oxime compound having a fluorine atom can also be used. Specific examples of the oxime compound having a fluorine atom include compounds described in JP2010-262028A, Compounds 24 and 36 to 40 described in JP2014-500852A, and a compound (C-3) described in JP2013-164471A, and the like are mentioned. The contents thereof are incorporated herein.

As the photopolymerization initiator, an oxime compound having a nitro group can be used. Specific examples of the oxime compound having a nitro group include compounds described in paragraph numbers 0031 to 0047 of JP2013-114249A and paragraph numbers 0008 to 0012, and 0070 to 0079 of JP2014-137466A, and ADEKA ARKLS NCI-831 (manufactured by ADEKA Co., Ltd.).

Specific examples of the oxime compound are shown below, but the present invention is not limited thereto.

(C-1)

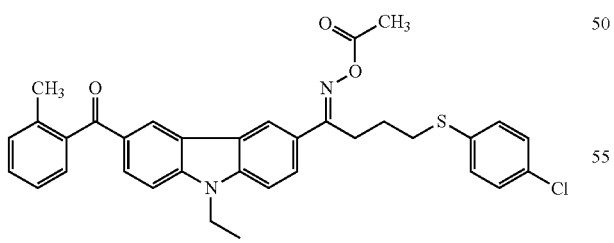

(C-2)

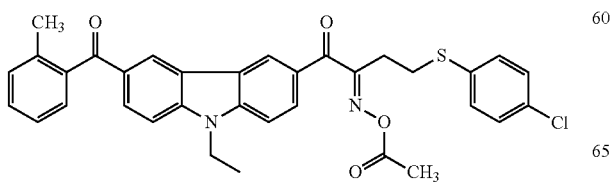

(C-3)

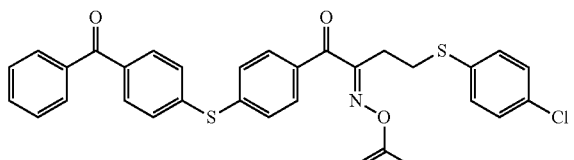

(C-4)

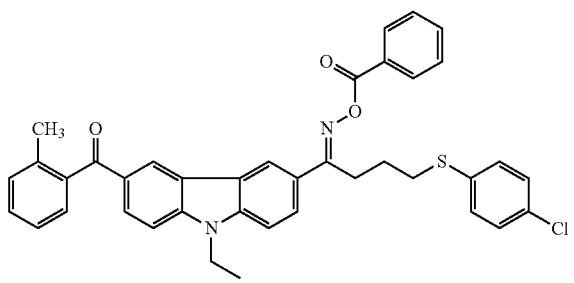

(C-5)

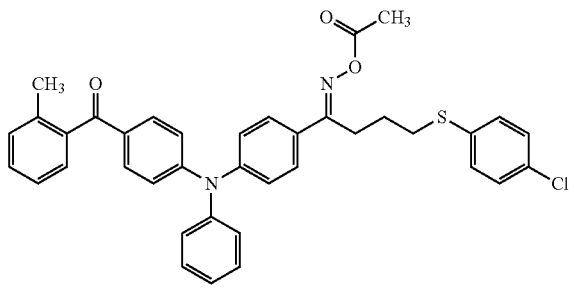

(C-6)

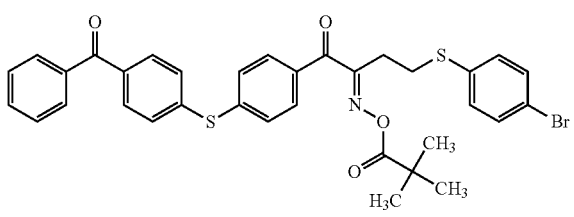

(C-7)

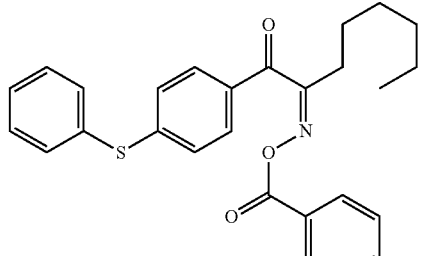

(C-8)

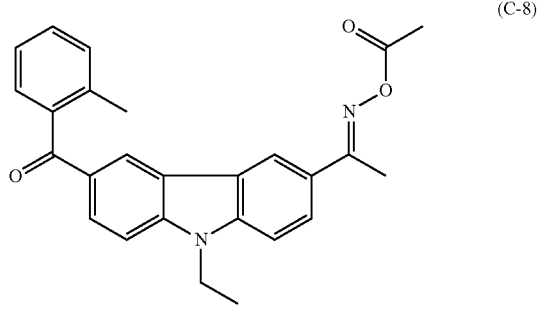

-continued (C-9)

(C-10)

(C-11)

(C-12)

(C-13)

(C-14)

The photopolymerization initiator is preferably a compound having a maximum absorption wavelength in a wavelength range of 350 nm to 500 nm, more preferably a compound having a maximum absorption wavelength in a wavelength range of 360 nm to 480 nm, and still more preferably a compound having high absorbance at 365 nm and 405 nm.

In the photopolymerization initiator, from the viewpoint of sensitivity, a molar light absorption coefficient thereof at 365 nm or 405 nm is preferably 1,000 to 300,000, more preferably 2,000 to 300,000, still more preferably 5,000 to 200,000. For measurement of a molar light absorption coefficient of a compound, a known method can be used. Specifically, for example, it is preferable to perform measurement at a concentration of 0.01 g/L with an ethyl acetate solvent using an ultraviolet and visible spectrophotometer (Cary-5 spectrophotometer manufactured by Varian Co.).

The photopolymerization initiators may be used in combination of two or more thereof as necessary.

A content of the photopolymerization initiator is preferably 0.1% to 50% by mass, more preferably 0.5% to 30% by mass, and still more preferably 1% to 20% by mass, with respect to the entire solid content of the curable composition. Within this range, better sensitivity and pattern formation properties are obtained.

[Optional Components]

The curable composition of the present invention may contain other components than the above-mentioned main components. Hereinafter, various optional components will be described in detail.

<Binder Polymer>

The curable composition of the present invention may contain a binder polymer.

As the binder polymer, a linear organic polymer is preferably used. As such linear organic polymer, known ones can be used in a predetermined manner. Preferably, a linear organic polymer which is soluble or swellable in water or weakly alkaline water is selected so as to allow for water development or weakly alkaline water development. Among these, as the binder polymer, an alkali-soluble resin (a resin having a group that promotes alkali solubility) is preferable.

The binder polymer can be appropriately selected from alkali-soluble resins which are linear organic polymers and have at least one alkali solubility-promoting group in a molecule thereof (the molecule preferably having a (meth)acrylic copolymer or a styrene-based copolymer as a main chain). From the viewpoint of heat resistance, a polyhydroxystyrene-based resin, a polysiloxane-based resin, a (meth)acrylic resin, a (meth)acrylamide-based resin, or a (meth)acrylic/(meth)acrylamide copolymer resin is preferable; and from the viewpoint of control of developability, a (meth)acrylic resin, a (meth)acrylamide resin, or a (meth)acrylic/(meth)acrylamide copolymer resin is preferable.

Examples of the group that promotes alkali solubility include a carboxylic acid group, a phosphoric acid group, a sulfonic acid group, and a phenolic hydroxy group.

Examples of the binder polymer include radical polymers having a carboxylic acid group in a side chain, for example, those described in JP1984-44615A (JP-S59-44615A), JP1979-34327B (JP-S54-34327B), JP1983-12577B (JP-S58-12577B), JP1979-25957B (JP-S54-25957B), JP1979-92723A (JP-S54-92723A), JP1984-53836A (JP-S59-53836A), and JP1984-71048A (JP-S59-71048A), that is, a resin obtained by homopolymerizing or copolymerizing a monomer having a carboxylic acid group, a resin obtained by homopolymerizing or copolymerizing a monomer having an acid anhydride and subjecting the acid anhydride unit to hydrolysis, half-esterification, or half-amidation, and an epoxy acrylate obtained by modifying an epoxy resin with an unsaturated monocarboxylic acid and an acid anhydride. Examples of the monomer having a carboxylic acid group include acrylic acid, methacrylic acid, itaconic acid, crotonic acid, maleic acid, fumaric acid, and 4-carboxylstyrene; and examples of the monomer having an acid anhydride include maleic acid anhydride. In addition, similarly, an acidic cellulose derivative having a carboxylic acid group in a side chain is mentioned as an example. Besides, those obtained by adding a cyclic acid anhydride to a polymer having a hydroxy group are useful.

Further, acetal-modified polyvinyl alcohol-based binder polymers having an acid group which are described in EP993966B, EP1204000B, JP2001-318463A, and the like, are suitable due to an excellent balance between film strength and developability.

Furthermore, as other water-soluble linear organic polymers, polyvinyl pyrrolidone and polyethylene oxide are useful. In addition, in order to increase strength of a cured film, alcohol-soluble nylon, a condensation reaction product of 2,2-bis-(4-hydroxyphenyl)-propane and epichlorohydrin, and the like are also useful.

In particular, among these, [benzyl (meth)acrylate/(meth) acrylic acid/other addition polymerizable vinyl monomer as necessary] copolymers and [allyl (meth)acrylate/(meth) acrylic acid/other addition polymerizable vinyl monomer as necessary] copolymers are suitable due to an excellent balance among film strength, sensitivity, and developability.

Examples of commercial products thereof include Acrylic Base FF-187, FF-426 (manufactured by Fujikura Kasei Co., Ltd.), Acricure-RD-F8 (Nippon Shokubai Co., Ltd.), and CyclomerP(ACA) 230AA manufactured by Daicel-Allnex Ltd.

For the manufacture of the binder polymer, for example, a method according to a known radical polymerization method can be applied. Polymerization conditions such as temperature, pressure, type and amount of a radical initiator, and type of a solvent during manufacture of an alkali-soluble resin with a radical polymerization method can be easily set by those skilled in the art, and the conditions can also be set in an experimental way.

A content of the binder polymer in the curable composition of the present invention is preferably 0.1% to 30% by mass, and more preferably 0.3% to 25% by mass, with respect to the entire solid content of the curable composition. In addition, it is more preferable that the binder polymer is the above-mentioned alkali-soluble resin.

<Silane Coupling Agent>

The curable composition of the present invention may contain a silane coupling agent.

The silane coupling agent is a compound having a hydrolyzable group and other functional groups in the molecule thereof. The hydrolyzable group such as an alkoxy group is bonded to a silicon atom.

The hydrolyzable group refers to a substituent which is directly bonded to a silicon atom and can generate a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group has a carbon atom, a number of carbon atoms thereof is preferably 6 or less, and more preferably 4 or less. In particular, an alkoxy group having 4 or less carbon atoms or an alkenyloxy group having 4 or less carbon atoms is preferable.

Further, in order to improve adhesiveness between a base material and a cured film, the silane coupling agent preferably does not contain any of a fluorine atom and a silicon atom (excluding a silicon atom to which a hydrolyzable group is bonded), and the silane coupling agent desirably does not contain any of a fluorine atom, a silicon atom (excluding a silicon atom to which a hydrolyzable group is bonded), an alkylene group substituted with a silicon atom, a linear alkyl group having 8 or more carbon atoms, and a branched alkyl group having 3 or more carbon atoms.

The silane coupling agent preferably has a group represented by Formula (Z). * represents a bonding position.

In Formula (Z), $R^{Z1}$ represents a hydrolyzable group, and a definition thereof is as described above.

The silane coupling agent preferably has one or more curable functional groups selected from the group consisting of a (meth)acryloyloxy group, an epoxy group, and an oxetanyl group. The curable functional group may be directly bonded to a silicon atom or may be bonded to a silicon atom via a linking group.

As a suitable embodiment of the curable functional group contained in the silane coupling agent, a radically polymerizable group is mentioned.

A molecular weight of the silane coupling agent is not particularly limited, and is often 100 to 1000 from the viewpoint of handling properties. The molecular weight is preferably 270 or more, and more preferably 270 to 1000, from the viewpoint of having more excellent effects of the present invention.

One suitable embodiment of the silane coupling agent is a silane coupling agent X represented by Formula (W).

$R^{Z1}$ represents a hydrolyzable group, and a definition thereof is as described above.

$R^{Z2}$ represents a curable functional group, and a definition thereof is as described above and a suitable range thereof is also as described above.

$L^Z$ represents a single bond or a divalent linking group. In a case where $L^Z$ represents a divalent linking group, examples of the divalent linking group include an alkylene group which may be substituted with a halogen atom, an arylene group which may be substituted with a halogen atom, $-NR^{12}-$, $-CONR^{12}-$, $-CO-$, $-CO_2-$, $SO_2NR^{12}$, O, S, $SO_2$, or combinations thereof. Among these, at least one selected from the group consisting of an alkylene group having 2 to 10 carbon atoms which may be substituted with a halogen atom and an arylene group having 6 to 12 carbon atoms which may be substituted with a halogen atom, or a combination of these groups and at least one group selected from the group consisting of $-NR^{12}-$, —CONR$^{12}$—, —CO—, —CO$_2$—, SO$_2$NR$^{12}$—, —O—, —S—, and SO$_2$— is preferable, and an alkylene group having 2 to 10 carbon atoms which may be substituted with a halogen atom, —CO$_2$—, —O—, —CO—, —CONR$^{12}$—, or a group composed of a combination of these groups is more preferable. Here, R$^{12}$ represents a hydrogen atom or a methyl group.

Examples of the silane coupling agent X include N-β-aminoethyl-γ-aminopropyl-methyldimethoxysilane (trade name KBM-602 manufactured by Shin-Etsu Chemical Co., Ltd.), N-β-aminoethyl-γ-aminopropyl-trimethoxy silane (trade name KBM-603, manufactured by Shin-Etsu Chemical Co., Ltd.), N-β-aminoethyl-γ-aminopropyltriethoxy silane (trade name KBE-602 manufactured by Shin-Etsu Chemical Co., Ltd.), γ-aminopropyl-trimethoxy silane (trade name KBM-903, manufactured by Shin-Etsu Chemical Co., Ltd.), γ-aminopropyl-triethoxy silane (trade name KBE-903, manufactured by Shin-Etsu Chemical Co., Ltd.), 3-methacryloxypropyltrimethoxy silane (trade name KBM-503 manufactured by Shin-Etsu Chemical Co., Ltd.), and glycidoxycyctyltrimethoxy silane (trade name KBM-4803 manufactured by Shin-Etsu Chemical Co., Ltd.).

As another suitable embodiment of the silane coupling agent, a silane coupling agent Y having at least a silicon atom, a nitrogen atom, and a curable functional group in the molecule thereof and having a hydrolyzable group bonded to a silicon atom is mentioned.

The silane coupling agent Y may have at least one silicon atom in the molecule thereof, and the silicon atom can be bonded to the following atoms or substituents. These atoms or substituents may be the same or different from each other. Examples of the atoms or substituents to which the silicon atom can be bonded include a hydrogen atom, a halogen atom, a hydroxy group, an amino group substitutable with an alkyl group, an alkenyl group, an alkynyl group, an aryl group, an alkyl group and/or an aryl group having 1 to 20 carbon atoms, a silyl group, an alkoxy group having 1 to 20 carbon atoms, and an aryloxy group. These substituents may further be substituted with a silyl group, an alkenyl group, an alkynyl group, an aryl group, an alkoxy group, an aryloxy group, a thioalkoxy group, an amino group substitutable with an alkyl group and/or an aryl group, a halogen atom, a sulfonamide group, an alkoxycarbonyl group, an amide group, a urea group, an ammonium group, an alkylammonium group, a carboxylic acid group or a salt thereof, a sulfo group or a salt thereof, or the like.

At least one hydrolyzable group is bonded to the silicon atom. A definition of the hydrolyzable group is as described above.

The silane coupling agent Y may contain a group represented by Formula (Z).

It is preferable that the silane coupling agent Y has at least one nitrogen atom in the molecule thereof and the nitrogen atom is present in the form of a secondary amino group or a tertiary amino group, that is, it is preferable that the nitrogen atom has at least one organic group as a substituent. A structure of the amino group may be present in the molecule in the form of a partial structure of a nitrogen-containing heterocycle or may be present as a substituted amino group such as aniline.

Here, examples of the organic group include an alkyl group, an alkenyl group, an alkynyl group, an aryl group, and a combination thereof. These may further have a substituent, and examples of the substituent that can be introduced include a silyl group, an alkenyl group, an alkynyl group, an aryl group, an alkoxy group, an aryloxy group, a thioalkoxy group, an amino group, a halogen atom, a sulfo-namide group, an alkoxycarbonyl group, a carbonyloxy group, an amide group, a urea group, an alkyleneoxy group, an ammonium group, an alkylammonium group, a carboxylic acid group or a salt thereof, and a sulfo group.

Further, it is preferable that the nitrogen atom is bonded to the curable functional group via a predetermined organic linking group. Preferable examples of the organic linking group include a substituent that can be introduced into the nitrogen atom and the organic group bonded thereto as described above.

A definition of the curable functional group contained in the silane coupling agent Y is as described above, and a suitable range thereof is also as described above.

The silane coupling agent Y may have at least one curable functional group in one molecule, and it is also possible to adopt an embodiment having two or more curable functional groups. From the viewpoint of sensitivity and stability, the silane coupling agent Y preferably has 2 to 20 curable functional groups, more preferably has 4 to 15 curable functional groups, and still more preferably has 6 to 10 curable functional groups.

Molecular weights of the silane coupling agent X and the silane coupling agent Y are not particularly limited, and the above-mentioned range (preferably 270 or more) is mentioned.

Ae content of the silane coupling agent in the curable composition of the present invention is preferably 0.1% to 10% by mass, more preferably 0.5% to 8% by mass, and still more preferably 1.0% to 6% by mass, with respect to the entire solid content in the curable composition.

The curable composition of the present invention may contain one type of silane coupling agent alone or may contain two or more types thereof. In a case where the curable composition contains two or more silane coupling agents, a total thereof may fall within the above-mentioned range.

<Ultraviolet Absorber>

The curable composition of the present invention may contain an ultraviolet absorber. Thus, more excellent (delicate) shape of pattern can be obtained.

As the ultraviolet absorber, salicylate-based, benzophenone-based, benzotriazole-based, substituted acrylonitrile-based, and triazine-based ultraviolet absorbers can be used. As specific examples thereof, compounds of paragraph numbers 0137 to 0142 of JP2012-068418A (paragraph numbers 0251 to 0254 of corresponding US2012/0068292) can be used, the contents of which can be cited and are incorporated herein.

Further, a diethylamino-phenylsulfonyl-based ultraviolet absorber (manufactured by Daito Chemical Co., Ltd., trade name: UV-503) and the like are also suitably used.

Examples of the ultraviolet absorber include compounds exemplified in paragraph numbers 0134 to 0148 of JP2012-32556A.

In a case where the curable composition contains an ultraviolet absorber, a content of the ultraviolet absorber is preferably 0.001% to 15% by mass, more preferably 0.01% to 10% by mass, and still more preferably 0.1% to 5% by mass, with respect to the entire solid content of the composition.

<Surfactant>

Various surfactants may be contained in the curable composition from the viewpoint of further improving coatability. As the surfactant, various surfactants such as a fluorine-based surfactant, a nonionic surfactant, a cationic surfactant, an anionic surfactant, and a silicone-based surfactant are mentioned. In particular, since the curable composition of the present invention contains a fluorine-based surfactant, liquid properties (particularly, fluidity) of the curable composition are further improved, so that uniformity of coating thickness and liquid saving properties at the time of coating can be further improved.

Examples of the fluorine-based surfactant include MEGAFAC F171, F172, F173, F176, F177, F141, F142, F143, F144, R30, F437, F475, F479, F482, F554, F780, RS-72-K (all manufactured by DIC Ltd.), Fluorad FC430, FC431, FC171 (all manufactured by Sumitomo 3M Limited), Surflon S-382, SC-101, SC-103, SC-104, SC-105, SC1068, SC-381, SC-383, S393, and KH-40 (all manufactured by Asahi Glass Co., Ltd.), PF636, PF656, PF6320, PF6520, and PF7002 (all manufactured by OMNOVA). As the fluorine-based surfactant, compounds described in paragraph numbers 0015 to 0158 of JP2015-117327A can also be used. As the fluorine-based surfactant, a block polymer can also be used, and specific examples thereof include compounds described in JP2011-89090A.

As the fluorine-based surfactant, a fluorine-containing polymer compound containing a repeating unit derived from a (meth)acrylate compound having a fluorine atom and a repeating unit derived from a (meth)acrylate compound having 2 or more (preferably 5 or more) alkyleneoxy groups (preferably ethyleneoxy group or propyleneoxy group) are also preferably mentioned, and the following compounds are also exemplified as the fluorine-based surfactant used in the present invention.

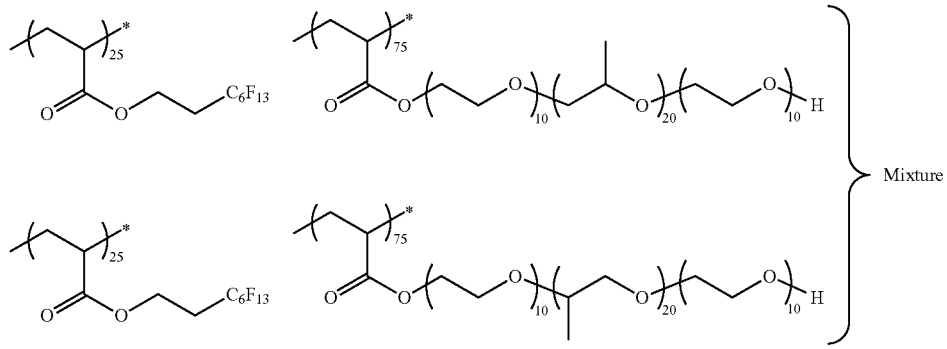

A weight average molecular weight of the above compound is preferably 3,000 to 50,000, for example, 14,000.

As the fluorine-based surfactant, a fluorine-containing polymer having an ethylenically unsaturated group in a side chain is also mentioned. Specific examples thereof include compounds described in paragraph numbers 0050 to 0090 and paragraph numbers 0289 to 0295 of JP2010-164965A, such as MEGAFAC RS-101, RS-102, and RS-718K, all manufactured by DIC Corporation.

Specific examples of other surfactants include surfactants described in paragraph numbers 0174 to 0177 of JP2013-249417A, the contents of which are incorporated herein.

The surfactants may be used alone or in combination of two or more thereof.

A content of the surfactant is preferably 0.001% to 2.0% by mass, or more preferably 0.005% to 1.0% by mass, with respect to the entire mass of the composition.

In addition to the above components, the curable composition may contain the following components. Examples thereof include a sensitizer, a co-sensitizer, a crosslinking agent, a curing accelerator, a filler, a heat-curing accelerator, a polymerization inhibitor, a plasticizer, a diluent, a pigment derivative, and an oil sensitizer. Furthermore, known additives such as an adhesion promoter and other auxiliary agents (for example, conductive particles, fillers, defoaming agents, flame retardants, leveling agents, peeling accelerators, antioxidants, perfumes, surface tension adjusting agents, and chain transfer agents) may be contained in the curable composition, as necessary.

For these components, reference can be made to paragraph numbers 0183 to 0228 of JP2012-003225A (<0237> to <0309> of corresponding US2013/0034812A), paragraph numbers 0101 to 0102, paragraph numbers 0103 to 0104, and paragraph numbers 0107 to 0109 of JP2008-250074A, and paragraph numbers 0159 to 0184 of JP2013-195480A, the contents of which are incorporated herein.

A concentration of solid contents of the curable composition of the present invention is preferably 5% to 50% by mass, and more preferably 15% to 40% by mass, from the viewpoint of balance between thickness of cured film to be formed and light-shielding properties.

<Method for Manufacturing Curable Composition>

The curable composition of the present invention can be prepared by mixing the above-mentioned various components using a known mixing method (for example, a mixing method using a stirrer, a homogenizer, a high-pressure emulsifying apparatus, a wet type pulverizing machine, and a wet type dispersing machine).

In preparing the composition, the respective components constituting the composition may be blended at once, or the respective components may be sequentially blended after being dissolved or dispersed in a solvent. In addition, introduction sequence and working conditions at the time of blending are not particularly limited.

The curable composition of the present invention is preferably filtered with a filter for the purpose of removing foreign matters and reducing defects. As the filter, any filter can be used without particular limitation as long as it is used for filtration applications or the like in the related art. Examples of the filter include a fluororesin such as PTFE (polytetrafluoroethylene), a polyamide resin such as nylon, and a polyolefin resin (including a high density and ultra high-molecular-weight polyolefin resin) such as polyethylene and polypropylene (PP). Among these materials, polypropylene (including a high density polypropylene) and nylon are preferable.

A pore diameter of the filter is suitably about 0.1 to 7.0 μm, preferably about 0.2 to 2.5 μm, more preferably about 0.2 to 1.5 μm, and still more preferably 0.3 to 0.7 μm. By being set to this range, it is possible to reliably remove fine foreign matters such as impurities and aggregates contained in a pigment while suppressing filter clogging due to the pigment.

In a case of using a filter, different filters may be combined. In that case, filtering with a first filter may be performed only once or twice or more. In a case where filtering is performed twice or more by combining different filters, it is preferable that a pore diameter in second and subsequent filterings is equal to or larger than a pore diameter in a first filtering. In addition, another first filter having a different pore diameter may also be combined therewith in the above range. Here, a pore diameter can refer to a nominal value of a filter maker. As a commercial filter, for example, it is possible to make a selection from various filters provided by Nihon Pall Ltd., Advantec Toyo Kaisha, Ltd., Nihon Entegris K.K. (formerly Nihon Mykrolis K.K.), KITZ MICROFILTER CORPORATION, and the like.

As a second filter, one made of the same material or the like as the above-mentioned first filter can be used. A pore diameter of the second filter is suitably about 0.2 to 10.0 μm, preferably about 0.2 to 7.0 μm, and more preferably about 0.3 to 6.0 μm.

The curable composition of the present invention preferably does not contain impurities such as metal, metal salt containing halogen, acid, or alkali. A content of impurities contained in these materials is preferably 1 ppm or less, more preferably 1 ppb or less, still more preferably 100 ppt or less, and particularly preferably 10 ppt or less. It is most preferable that substantially no (not more than detection limits of a measurement apparatus) impurities are contained.

Meanwhile, the impurities can be measured by an inductively coupled plasma mass spectrometer (Agilent 7500cs type, manufactured by Yokogawa Analytical Systems).

[Cured Film and Method for Manufacturing the Same]

By using the curable composition described above, a cured film can be formed.

A thickness of the cured film is not particularly limited, and is preferably 0.2 to 25 μm, and more preferably 1.0 to 10 μm, from the viewpoint of having more excellent effects of the present invention.

The thickness is an average thickness, which is a value obtained by measuring thickness at any five or more points of the cured film and carrying out arithmetic averaging therefor.

A method of manufacturing a cured film is not particularly limited, and examples thereof include a method of manufacturing a cured film by coating the above-mentioned curable composition on a base material to form a coating film and subjecting the coating film to a curing treatment.

A method for the curing treatment is not particularly limited, and examples thereof include photocuring treatment or heat-curing treatment. From the viewpoint of facilitating pattern formation, the photocuring treatment (in particular, a curing treatment by irradiation with actinic rays or radiation) is preferable.

In a case of manufacturing a patterned cured film, examples of a suitable embodiment include an embodiment which includes a step of coating the composition of the present invention on a base material to form a curable composition layer (hereinafter appropriately abbreviated as "curable composition layer-forming step"), a step of exposing the curable composition layer by irradiation with actinic rays or radiation (hereinafter appropriately abbreviated as "exposure step"), and a step of developing the curable composition layer after exposure to form a cured film (hereinafter appropriately abbreviated as "developing step").

Specifically, a patterned cured film can be manufactured by coating the composition of the present invention on a base material directly or via another layer to form a curable composition layer (curable composition layer-forming step), exposing the curable composition layer by irradiation with actinic rays or radiation through a predetermined mask pattern and curing only a portion of the curable composition layer which has been irradiated with light (exposure step), and developing the light-irradiated curable composition layer with a developer (developing step).

The respective steps in the above embodiment will be described below.

<Curable Composition Layer-Forming Step>

In the curable composition layer-forming step, the curable composition of the present invention is coated on a base material to form a curable composition layer.

There are no particular limitations on a type of the base material, and in a case where the cured film is disposed in a solid-state imaging device, for example, various members in a solid-state imaging device (for example, an infrared light cut filter, an outer peripheral portion of a solid-state imaging device, a peripheral portion of a wafer level lens, and a rear surface of a solid-state imaging device) are mentioned.

Examples of a coating method of the composition of the present invention on a base material include various coating methods such as spin coating, slit coating, ink jet method, spray coating, rotary coating, cast coating, roll coating, and screen printing method.

The curable composition coated on the base material is usually dried under a condition of a temperature of 70° C. or more and 110° C. or less for about 2 minutes or more and about 4 minutes or less to form a curable composition layer.

<Exposure Step>

In the exposure step, the curable composition layer formed in the curable composition layer-forming step is exposed by irradiation with actinic rays or radiation through a mask, and only the curable composition layer portion irradiated with light is cured.

Exposure is preferably performed by irradiation with radiation. As the radiation that can be used at the time of exposure, in particular, ultraviolet rays such as g rays, h rays, and i rays are preferably used, and as a light source, a high-pressure mercury lamp is preferable. An irradiation intensity is preferably 5 mJ/cm$^2$ or more and 1,500 mJ/cm$^2$ or less, and more preferably 10 mJ/cm$^2$ or more and 1,000 mJ/cm$^2$ or less.

<Developing Step>

Following the exposure step, developing treatment (developing step) is performed, and an unirradiated portion in the exposure step is eluted into a developer. Thus, only a photocured portion remains.

As the developer, an alkali developer may be used. In that case, it is preferable to use an organic alkali developer. A developing temperature is usually 20° C. or more and 30° C. or less, and a developing time is 20 seconds or more and 90 seconds or less.

For the alkaline aqueous solution (alkali developer), examples of the inorganic developing solution include an alkaline aqueous solution in which an alkaline compound such as sodium hydroxide, potassium hydroxide, sodium carbonate, sodium hydrogen carbonate, sodium silicate, and sodium metasilicate is dissolved at a concentration of 0.001% to 10% by mass, and preferably 0.005% to 0.5% by mass.

Further, examples of the organic alkali developer include an alkaline aqueous solution in which an alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5,4,0]-7-undecene is dissolved at a concentration of 0.001% to 10% by mass, and preferably 0.005% to 0.5% by mass.

A suitable amount of a water-soluble organic solvent such as methanol and ethanol, and/or a surfactant can be added to the alkaline aqueous solution. In a case of using a developer composed of such an alkaline aqueous solution, in general, the cured film is washed (rinsed) with pure water after development.

The method for manufacturing a cured film may include other steps.

The other steps are not particularly limited and can be appropriately selected depending on purposes.

Examples of the other steps include a surface treatment step of a base material, a pre-heating step (pre-baking step), and a post-heating step (post-baking step). After performing the curable composition layer-forming step, the exposure step, and the developing step, a curing step (post-baking step) of curing the formed patterned cured film by heating and/or exposure may be carried out, as necessary.

<Pre-Heating Step and Post-Heating Step>

A heating temperature in the pre-heating step and the post-heating step is preferably 80° C. to 250° C. An upper limit thereof is more preferably 200° C. or less, and still more preferably 150° C. or less. A lower limit thereof is preferably 90° C. or higher.

A heating time in the pre-heating step and the post-heating step is preferably 30 to 300 seconds. An upper limit thereof is preferably 240 seconds, and more preferably 180 seconds or less. A lower limit thereof is preferably 60 seconds or more.

[Light-Shielding Film and Solid-State Imaging Device]

In a case where a black pigment is used as a colorant, the above-mentioned cured film can be suitably applied as a so-called light-shielding film. In addition, such light-shielding film can be suitably applied to a solid-state imaging device.

Hereinafter, firstly, a first embodiment of the solid-state imaging device having the light-shielding film of the present invention will be described in detail.

Figure 2:
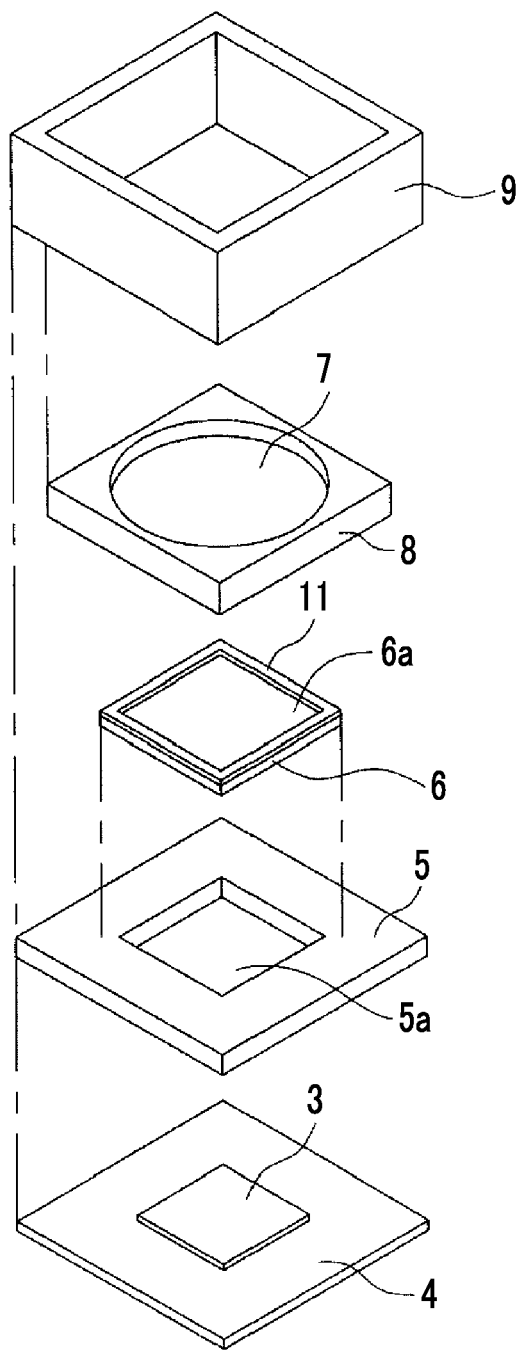
FIG. 2 is an exploded perspective view of the solid-state imaging device according to the first embodiment.

As shown in FIGS. 1 and 2, a solid-state imaging device 2 includes a complementary metal oxide semiconductor (CMOS) sensor 3 as a solid-state imaging device, a circuit board 4 on which the CMOS sensor 3 is mounted, and a ceramic substrate 5 which is made of ceramic and holds the circuit board 4. In addition, the solid-state imaging device 2 further includes an IR cut filter 6 which is held by the ceramic substrate 5 and cuts off infrared light (IR) directed toward the CMOS sensor 3, a taking lens 7, a lens holder 8 holding the taking lens 7, and a holding cylinder 9 for movably holding the lens holder 8. In addition, instead of the CMOS sensor 3, a charge coupled device (CCD) sensor or an organic CMOS sensor may be provided.

The ceramic substrate 5 has an opening 5a into which the CMOS sensor 3 is inserted, has a frame shape, and surrounds a side surface of the CMOS sensor 3. In this state, the circuit board 4 on which the CMOS sensor 3 is mounted is fixed to the ceramic substrate 5 by an adhesive (for example, an epoxy-based adhesive, which is the same hereinafter). On the circuit board 4, various circuit patterns are formed.

In the IR cut filter 6, a reflection film that reflects infrared light is formed on a plate-shaped glass or blue glass, and a surface on which this reflection film is formed is an incident surface 6a. The IR cut filter 6 is formed in a somewhat larger size than the opening 5a and fixed to the ceramic substrate 5 with an adhesive so as to cover the opening 5a.

The CMOS sensor 3 is disposed behind the taking lens 7 (lower part in FIGS. 2 and 3), and an IR cut filter 6 is disposed between the taking lens 7 and the CMOS sensor 3. The subject light enters a light receiving surface of the CMOS sensor 3 through the taking lens 7 and the IR cut filter 6. At this time, the infrared light is cut by the IR cut filter 6.

The circuit board 4 is connected to a controller provided in an electronic device (for example, a digital camera) on which the solid-state imaging device 2 is mounted, and electric power is supplied from the electronic device to the solid-state imaging device 2. In the CMOS sensor 3, a large number of color pixels are two-dimensionally arranged on the light receiving surface, and each color pixel photoelectrically converts incident light and accumulates the generated signal electric charges.

Figure 3:
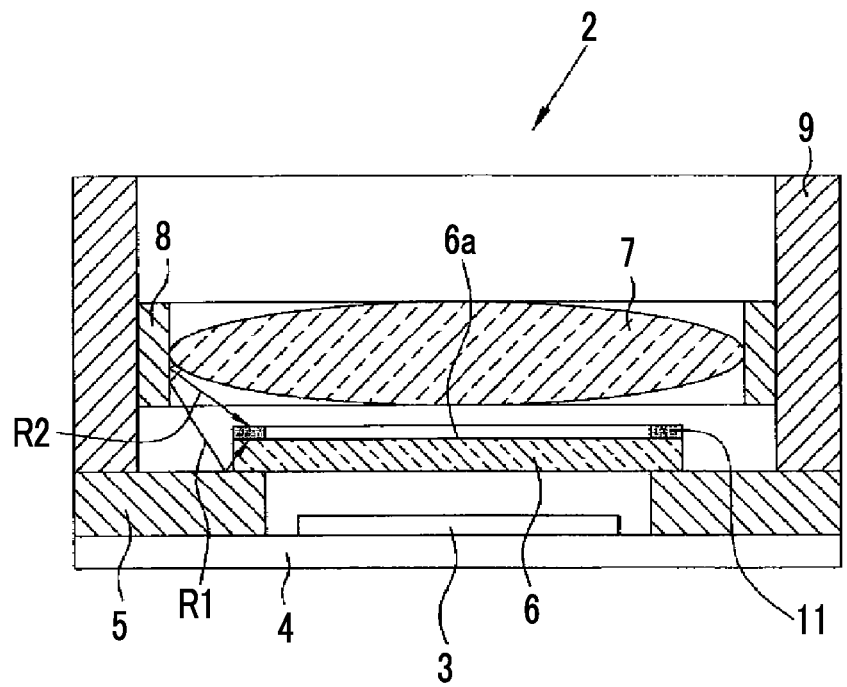
FIG. 3 is a cross-sectional view showing the solid-state imaging device according to the first embodiment.

As shown in FIGS. 2 and 3, the light-shielding film (light-shielding layer) 11 as described above is disposed on an end portion of the incident surface 6a of the IR cut filter 6 over the entire circumference thereof, so that an infrared light cut filter with a light-shielding film is formed. In a case where a reflected light R1 emitted from the taking lens 7 and reflected on a front surface (upper surface in FIGS. 2 and 3) of the ceramic substrate 5 is incident on the CMOS sensor 3 after being repeatedly reflected in the device, and/or in a case where a reflected light R2 reflected from an inner wall surface of the lens holder 8 emitted from the taking lens 7 is incident on the CMOS sensor 3, this causes occurrence of flare in a taken image. The light-shielding film 11 shields harmful light, such as the reflected light R1 or R2 which is directed toward the CMOS sensor 3. The light-shielding film 11 is coated by, for example, a spin coating method or a spray coating method. In FIGS. 2 and 3, a thickness of the light-shielding film 11 is exaggeratedly drawn.

Figure 4:
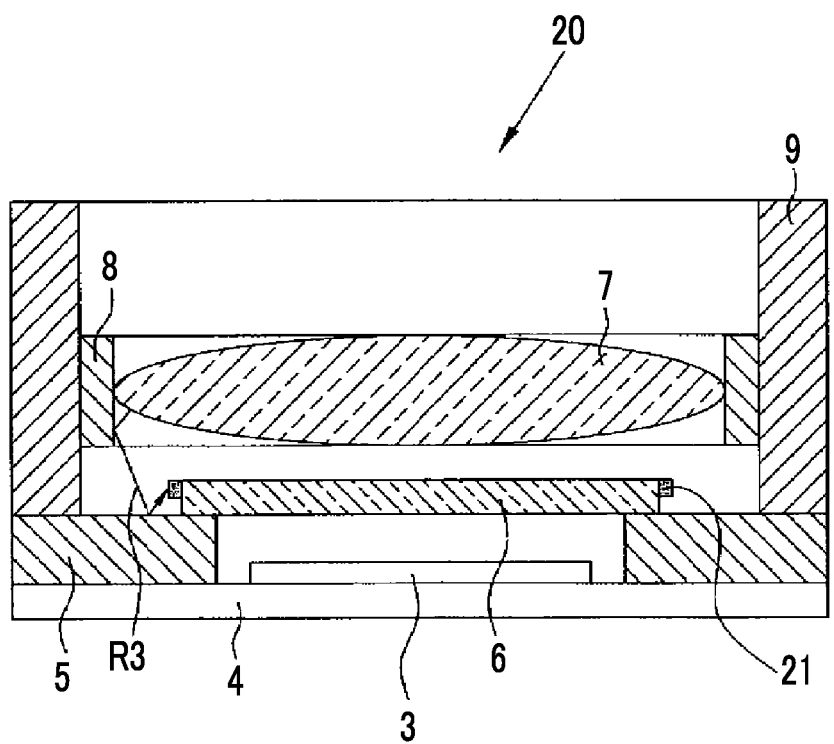
FIG. 4 is a cross-sectional view showing a solid-state imaging device according to a second embodiment.

FIG. 4 shows a solid-state imaging device 20 according to a second embodiment. Constituent members similar to those of the first embodiment are denoted by the same reference numerals, and detailed descriptions thereof will be omitted.

The solid-state imaging device 20 includes a CMOS sensor 3, a circuit board 4, a ceramic substrate 5, an IR cut filter 6, a taking lens 7, a lens holder 8, and a holding cylinder 9. A light-shielding film (light-shielding layer) 21 as described above is formed on a side end face of the IR cut filter 6 over the entire circumference thereof. In a case where a reflected light R3 emitted from the taking lens 7 and reflected on a front surface of the ceramic substrate 5 is incident on the CMOS sensor 3 after being repeatedly reflected and refracted in the device, this causes occurrence of flare in a taken image. The light-shielding film 21 shields harmful light such as the reflected light R3 which is directed toward the CMOS sensor 3.

Figure 5:
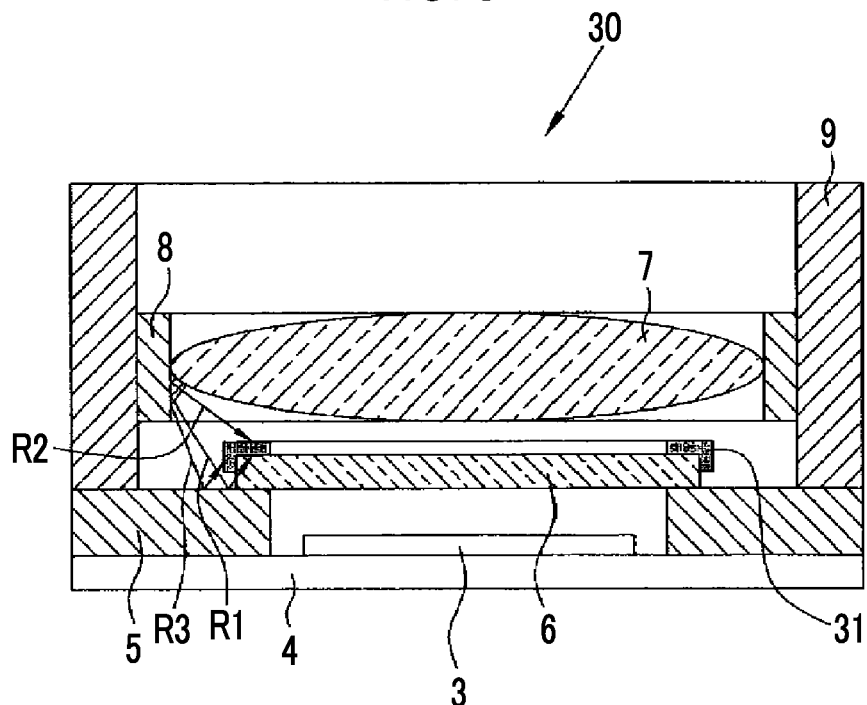
FIG. 5 is a cross-sectional view showing a solid-state imaging device according to a third embodiment.

FIG. 5 shows a solid-state imaging device 30 according to a third embodiment. Constituent members similar to those of the first embodiment are denoted by the same reference numerals, and detailed descriptions thereof will be omitted.

The solid-state imaging device 30 includes a CMOS sensor 3, a circuit board 4, a ceramic substrate 5, an IR cut filter 6, a taking lens 7, a lens holder 8, and a holding cylinder 9. The light-shielding film (light-shielding layer) 31 as described above is formed on an end portion and a side end surface of the incident surface 6a of the IR cut filter 6 over the entire circumferences thereof. That is, the third embodiment is a combination of the first and second embodiments. In the present embodiment, since higher light-shielding properties are achieved than in the first and second embodiments, occurrence of flare is reliably suppressed.

Figure 6:
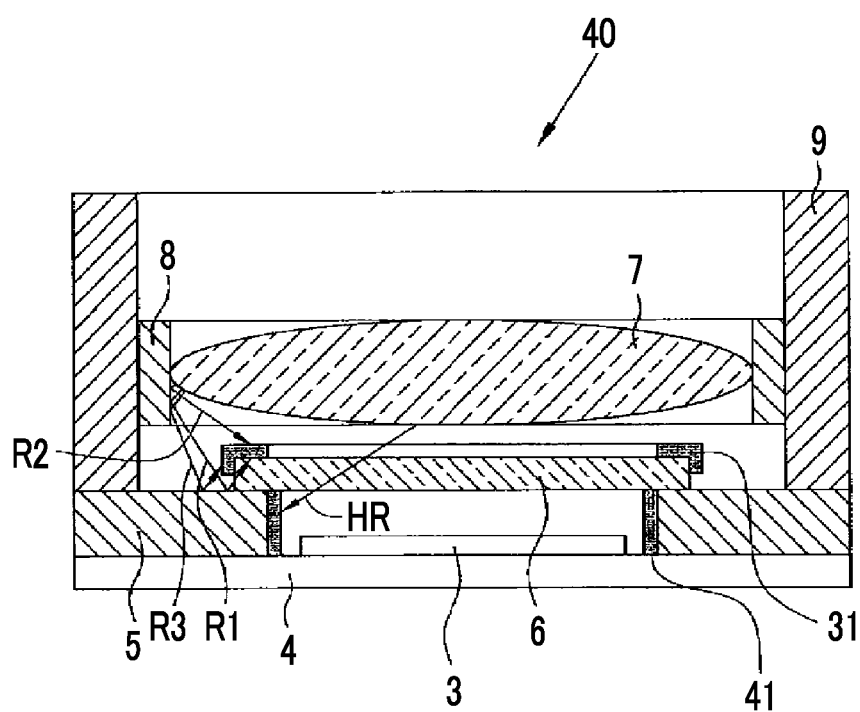
FIG. 6 is a cross-sectional view showing a solid-state imaging device according to a fourth embodiment.

FIG. 6 shows a solid-state imaging device 40 according to a fourth embodiment. Constituent members similar to those of the first embodiment are denoted by the same reference numerals, and detailed descriptions thereof will be omitted.

The solid-state imaging device 40 includes a CMOS sensor 3, a circuit board 4, a ceramic substrate 5, an IR cut filter 6, a taking lens 7, a lens holder 8, and a holding cylinder 9. The light-shielding film (light-shielding layer) 31 as described above is formed on an end portion and a side end surface of the incident surface 6a of the IR cut filter 6 over the entire circumferences thereof.

Further, on an inner wall surface of the ceramic substrate 5, a light-shielding film (light-shielding layer) 41 is formed. In a case where a reflected light, which is emitted from the taking lens 7, passes through the IR cut filter 6, and is reflected on the inner wall surface of the ceramic substrate 5, is incident on the CMOS sensor 3, this causes occurrence of flare in a taken image. Since the light-shielding film 41 has higher light-shielding properties than the inner wall surface of the ceramic substrate 5, occurrence of flare is reliably suppressed.

The solid-state imaging device of the present invention may have a color filter of the present invention as described later. A configuration of the solid-state imaging device of the present invention is not particularly limited as long as it includes the color filter of the present invention and functions as a solid-state imaging device, and, for example, the configuration is as follows.

The solid-state imaging device of the present invention is configured to have, on a base material, a transfer electrode composed of a plurality of photodiodes constituting a light receiving area of a solid-state imaging element (charge coupled device (CCD) image sensor, complementary metal oxide semiconductor (CMOS) image sensor, or the like), polysilicon, and the like, a light-shielding film having an opening in the photodiode and a light receiving portion of the photodiode on the transfer electrode, a device protective film composed of silicon nitride and the like formed on the light-shielding film so as to cover the entire surface of the light-shielding film and the photodiode light receiving portion, and a color filter on the device protective film. Furthermore, a configuration in which a light-focusing means (for example, a microlens or the like, which is the same hereinafter) is present below the color filter (on a side close to the base material) on the device protective film, a configuration in which the light-focusing means is present on the color filter, or the like may be adopted. In addition, the color filter may have a structure in which a cured film forming each color pixel is embedded in a space, for example, partitioned in a lattice shape by a partition wall. In this case, the partition wall preferably has a low refractive index with respect to each color pixel. Examples of a solid-state imaging device having such a structure include devices described in JP2012-227478A and JP2014-179577A.

[Color Filter]

Further, a cured film of the present invention can also be used for a color filter.

The color filter can be suitably used for a solid-state imaging device including a charge coupled device (CCD), a complementary metal oxide semiconductor (CMOS), or the like and is particularly suitable for CCD, CMOS, and the like, having a high resolution that exceeds 1 million pixels. The color filter can be, for example, disposed between a light receiving portion of each of pixels constituting the CCD or CMOS and a microlens for focusing and used.

Further, the color filter can be preferably used for an organic electroluminescence (organic EL) element. As the organic EL element, a white organic EL element is preferable. The organic EL element preferably has a tandem structure. Regarding the tandem structure of the organic EL element, reference is made to descriptions in JP2003-45676A, "Frontiers of Organic EL Technology Development—High Brightness, High Accuracy, Prolonged Lifetime, Know-How Collection", supervised by Akiyoshi Mikami, Technical Information Institute Co., Ltd., pages 326-328, 2008, and the like. Examples of the tandem structure of the organic EL element include a structure in which an organic EL layer is provided between a lower electrode having light reflectivity and an upper electrode having light transmittance, on one surface of a substrate. The lower electrode is preferably made of a material having sufficient reflectance in a wavelength range of visible light. It is preferable that the organic EL layer includes a plurality of light emitting layers and has a stacked structure (tandem structure) in which the plurality of light emitting layers are stacked. In the organic EL layer, for example, the plurality of light emitting layers can include a red light emitting layer, a green light emitting layer, and a blue light emitting layer. In addition to the plurality of light emitting layers, it is preferable to have a plurality of light emitting auxiliary layers for causing the light emitting layers to emit light. For example, the organic EL layer can have a stacked structure in which the light emitting layers and the light emitting auxiliary layers are alternately stacked. An organic EL element having the organic EL layer having such a structure can emit white light. In that case, a spectrum of the white light emitted by the organic EL element is preferably one having a strong maximum emission peak in a blue region (430 nm to 485 nm), a green region (530 nm to 580 nm), and a yellow region (580 nm to 620 nm). It is more preferable that in addition to these emission peaks, the spectrum has a maximum emission peak in a red region (650 nm to 700 nm). By combining the organic EL element (white organic EL element) that emits white light with the color filter of the present invention, spectrum having excellent color reproducibility can be obtained and sharper videos or images can be displayed.

A thickness of a colored pattern (colored pixel) in the color filter is preferably 2.0 μm or less, more preferably 1.0 μm or less, and still more preferably 0.7 μm or less. A lower limit thereof can be, for example, 0.1 μm or more, and can be 0.2 μm or more.

Further, a size (pattern width) of the colored pattern (colored pixel) is preferably 2.5 μm or less, more preferably 2.0 μm or less, and particularly preferably 1.7 μm or less. A lower limit thereof can be, for example, 0.1 μm or more, and can also be 0.2 μm or more.

[Image Display Device]

A cured film (color filter, light-shielding film, or the like) of the present invention can be used in an image display device such as a liquid crystal display device and an organic electroluminescence display device.

Definitions of display devices and details of the respective display devices are described, for example, in "Electronic Display Devices (edited by Akio, SASAKI, published by Kogyo Chosakai Publishing Co., Ltd., 1990)", "Display Devices (edited by Toshiyuki, IBUKI, published by Sangyo Tosho Publishing Co., Ltd., 1989)", and the like. In addition, liquid crystal display devices are described, for example, in "Next Generation Liquid Crystal Display Technology (edited by Tatsuo UCHIDA, published by Kogyo Chosakai Publishing Co., Ltd., 1994)". The liquid crystal display devices to which the present invention can be applied are not particularly limited, and for example, the present invention can be applied to the liquid crystal display devices of various modes that are described in the above "Next Generation Liquid Crystal Display Technology".

The color filter in the present invention may be used for a color thin film transistor (TFT) mode liquid crystal display devices. The color TFT mode liquid crystal display devices are described, for example, in "Color TFT Liquid Crystal Display (published by KYORITSU SHUPPAN CO., LTD, 1996). Furthermore, the present invention can be applied to liquid crystal display devices having a widened viewing angle that employ a lateral electric field driving mode such as in plane switching (IPS), a pixel division mode such as multi-domain vertical alignment (MVA), and/or a super-twist nematic (STN), a twisted nematic (TN), a vertical alignment (VA), an on-chip spacer (OCS), a fringe field switching (FFS), a reflective optically compensated bend (R-OCB), and the like.

Further, the color filter in the present invention can also be provided in a color-filter on array (COA) mode that is bright and has high-definition. In a liquid crystal display device of the COA mode, in addition to the ordinary required characteristics as described above, required characteristics for the color filter may require characteristics required for an interlayer dielectric film, that is, low dielectric constant and remover liquid resistance. Since the color filter of the present invention is excellent in light fastness and the like, it is possible to provide a COA mode liquid crystal display device having high resolution and excellent long-term durability. In order to satisfy the required characteristics of low dielectric constant, a resin coating film may be provided on the color filter layer.

Such image display modes are described, for example, at page 43 of "EL, PDP, and LCD Display Technology and Recent Trends of the Market (TORAY RESEARCH CENTER, research and study department, 2001)".

The liquid crystal display device is configured to have various members such as an electrode substrate, a polarizing film, a phase difference film, a backlight, a spacer, and a viewing angle compensation film, in addition to the color filter of the present invention. The color filter of the present invention can be applied to liquid crystal display devices configured to have such known members. These members are described, for example, in "'94 Market for Liquid Crystal Display Related Materials and Chemicals (Kentaro, SHIMA, published by CMC Publishing CO., LTD., 1994)" and "2003 Current Situation of Liquid Crystal-Related Market and Future Prospects ($2^{nd}$ volume) (Yoshikichi HYO, published by Fuji Chimera Research Institute, Inc., 2003)".

The backlight is described in SID meeting Digest 1380 (2005) (A. Konno et al.), Display (monthly publication), December, 2005, pages 18 to 24 (Yasuhiro, SHIMA) and pages 25 to 30 (Takaaki HACHIKI), and the like.

Further, the cured film of the present invention can be used for a light-shielding member and a light-shielding layer of an optical filter and a module used for a portable device such a personal computer, a tablet, a mobile phone, a smartphone, and a digital camera; an office automation (OA) device such as a printer multifunctional machine and a scanner; an industrial equipment such as a surveillance camera, a bar code reader, an automatic teller machine (ATM), a high-speed camera, and identity authentication using face image authentication; an automotive camera equipment; a medical camera equipment such as an endoscope, a capsule endoscope, and a catheter; a biological sensor, a bio sensor a military reconnaissance camera, a 3D map camera, a weather or ocean observation camera, a land resource exploration camera, a space equipment such as an exploration camera for space astronomy or deep space targets, and the like. Furthermore, the cured film of the present invention can be used for an antireflection member and an antireflection layer of the optical filter and module.

Further, the cured film of the present invention can also be used for applications such as a micro light emitting diode (LED) and a micro organic light emitting diode (OLED). The applications are not particularly limited, and the cured film of the present invention is suitably used for a member which imparts light-shielding properties and antireflection properties, in addition to an optical filter and an optical film used for the micro LED and the micro OLED.

Examples of the micro LED and the micro OLED include those described in JP2015-500562A and JP2014-533890A.

Further, the cured film of the present invention can also be used for applications such as quantum dot display. The applications are not particularly limited, and the cured film of the present invention is suitably used for a member which imparts light-shielding properties and antireflection properties, in addition to an optical filter and an optical film used for the quantum dot display.

Examples of the quantum dot display include those described in US2013/0335677A, US2014/0036536A, US2014/0036203A, and US2014/0035960A.

EXAMPLES

Hereinafter, the present invention will be described in more detail based on examples, but the present invention is not limited to the following examples as long as the gist of the present invention is retained. Unless otherwise specified, "parts" and "%" are on a mass basis.

Synthesis Example 1: Synthesis of Macromonomer A-1

ε-caprolactone (255.2 g), δ-valerolactone (28.4 g), and 2-ethyl-1-hexanol (16.4 g) were introduced into a 1,000 mL three-neck flask and the mixture was stirred while blowing nitrogen. Monobutyltin oxide (0.14 g) was then added to the mixture and the obtained mixture was heated to 90° C. After 4 hours, disappearance of a signal derived from 2-ethyl-1-hexanol as a raw material was confirmed by $^1$H-NMR (nuclear magnetic resonance), and then the mixture was heated to 110° C. After continuing polymerization reaction under nitrogen at 110° C. for 12 hours, disappearance of signals derived from ε-caprolactone and δ-valerolactone was confirmed by $^1$H-NMR, and the mixture was cooled to 80° C. In a manner as described above, a Polymer G-1 represented by Formula (G-1) was obtained.

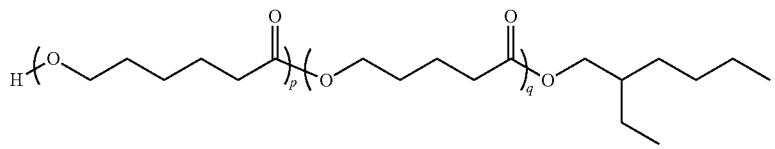

(G-1)

With respect to the Polymer G-1 obtained as described above, measurement for a molecular weight was performed by a GPC method (according to measurement conditions as described later), and a repetition number (p+q) was obtained. The repetition number (p+q) is shown in Table 1.

Further, with respect to the Polymer G-1 obtained as described above, measurement of a crystallization temperature was performed by DSC (according to measurement conditions as described later). The crystallization temperature of the Polymer G-1 is shown in Table 1.

Thereafter, 2,6-di-t-butyl-4-methylphenol (0.08 g) was added to the obtained Polymer G-1 and then 2-methacryloyloxyethyl isocyanate (19.9 g) was added dropwise to the obtained mixture over 30 minutes. One hour after completion of the dropwise addition, disappearance of a signal derived from 2-methacryloyloxyethyl isocyanate (MOI) was confirmed by $^1$H-NMR, and then propylene glycol monomethyl ether acetate (PGMEA) (319.9 g) was added to the mixture to obtain a Macromonomer A-1 solution (600 g) having a concentration of 50% by mass. A structure of the Macromonomer A-1 (shown in Formula (A-1)) was confirmed by $^1$H-NMR. The obtained Macromonomer A-1 had a weight average molecular weight of 6,000.

Table 1 shows monomer compositions of the Macromonomers A-2 to A-12, weight average molecular weights of the macromonomers obtained after synthesis, and repetition numbers of the Polymers G-2 to G-12 calculated from $^1$H-NMR, all together. The repetition number indicates a total number of units of the structural unit $L^1$ and the structural unit $L^2$ in one macromonomer molecule (which corresponds to p+q as described above). A number of each unit in the repetition number was almost the same as a charge ratio. The polymers obtained in Synthesis Examples 6, 7, 9, and 10 are shown in Formulas (G-6), (G-7), (G-9), and (G-10). In addition, the obtained macromonomers are shown in Formulas (A-6), (A-7), (A-9), and (A-10).

Meanwhile, "content (% by mass)" in the "structural unit $L^1$" column and "content (% by mass)" in the "structural unit $L^2$" column in Table 1 represent a content of the structural unit $L^1$ and a content of the structural unit $L^2$, respectively, with respect to the entire mass of a polymer chain in the macromonomer.

The Polymers (G-2) to (G-5), (G-8), and (G-12) are represented by a similar formula as the Polymer (G-1), and each of the polymers has a different repetition number (p+q) as shown in Table 1.

Further, the Macromonomers (A-2) to (A-5), (A-8), and (A-12) are represented by a similar formula as the Macromonomer (A-1), and each of the macromonomers has a different repetition number (p+q) as shown in Table 1.

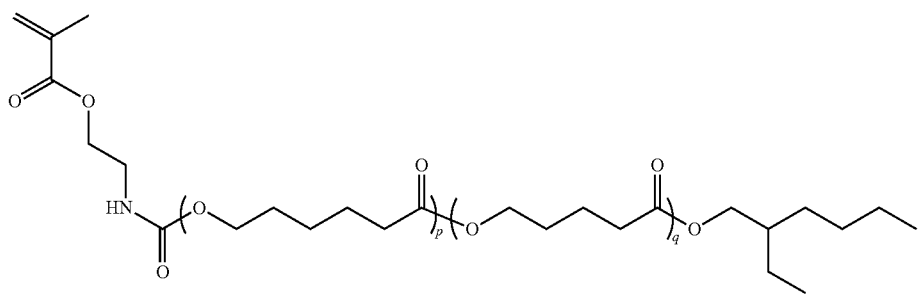

(A-1)

Synthesis Examples 2 to 11: Synthesis of Macromonomers A-2 to A-11

Polymers G-2 to G-11 and Macromonomers A-2 to A-11 were obtained by the same procedure as in Synthesis Example 1 (synthesis method of Macromonomer A-1) except that adjustment was made by changing a type of the cyclic compound used in the synthesis of the Macromonomer A-1 and a charge amount thereof, respectively, as described in Table 1 so that desired weight average molecular weight and repetition number were obtained.

Synthesis Example 12A: Synthesis of Macromonomer A-12

Polymer G-12 and Macromonomer A-12 were obtained by the same procedure as in Synthesis Example 1 (synthesis method of Macromonomer A-1) except that adjustment was made for each of them by changing a type of the cyclic compound used in the synthesis of the Macromonomer A-1 and a charge amount thereof as described in Table 1 so that desired weight average molecular weight and repetition number were obtained.

A crystallization temperature (Tc) of the polymers obtained above was calculated by DSC measurement under the following measurement conditions.

Approximately 5 mg of the polymer to be measured was weighed and set in an aluminum pan for measurement, and a differential scanning calorimeter (DSC, Q1000 type) manufactured by TA Instruments Japan Inc. was mounted thereon. Measurement was carried out by raising a temperature from 25° C. to 150° C. at a rate of 10° C./min and then holding at 150° C. for 5 minutes and then cooling from 150° C. to −30° C. at 10° C./min. The crystallization temperature was defined as a peak top temperature of an exothermic peak appearing on a DSC curve obtained by the above method.

The results are summarized in Table 1. In the table, "-" indicates that no exothermic peak showing crystallization was observed by the above method. In addition, ">50" indicates that the crystallization temperature exceeds 50° C.

TABLE 1

| | Macro-monomer | Weight average molecular weight | Polymer | Structural unit L¹ Cyclic compound | Content (% by mass) | Structural unit L² Cyclic compound | Content (% by mass) | Repetition number (p + q) | Crystallization temperature Tc (° C.) |
|---|---|---|---|---|---|---|---|---|---|
| Synthesis Example 1 | A-1 | 6,000 | G-1 | ε-caprolactone | 90 | δ-valerolactone | 10 | 20 | 15.8 |
| Synthesis Example 2 | A-2 | 6,000 | G-2 | ε-caprolactone | 80 | δ-valerolactone | 20 | 20 | 2.5 |
| Synthesis Example 3 | A-3 | 1,200 | G-3 | ε-caprolactone | 90 | δ-valerolactone | 10 | 5 | — |
| Synthesis Example 4 | A-4 | 20,000 | G-4 | ε-caprolactone | 90 | δ-valerolactone | 10 | 60 | 15.8 |
| Synthesis Example 5 | A-5 | 35,000 | G-5 | ε-caprolactone | 90 | δ-valerolactone | 10 | 120 | 17.2 |
| Synthesis Example 6 | A-6 | 5,500 | G-6 | ε-caprolactone | 90 | DL lactide | 10 | 20 | 15.4 |
| Synthesis Example 7 | A-7 | 5,500 | G-7 | δ-valerolactone | 90 | DL lactide | 10 | 20 | 12.7 |
| Synthesis Example 8 | A-8 | 7,000 | G-8 | ε-caprolactone | 50 | δ-valerolactone | 50 | 20 | −11.0 |
| Synthesis Example 9 | A-9 | 6,000 | G-9 | ε-caprolactone | 100 | | | 20 | 27.4 |
| Synthesis Example 10 | A-10 | 6,000 | G-10 | δ-valerolactone | 100 | | | 20 | 20.8 |
| Synthesis Example 11 | A-11 | 6,000 | G-11 | DL lactide | 100 | | | 20 | >50 |
| Synthesis Example 12A | A-12 | 6,000 | G-12 | ε-caprolactone | 85 | δ-valerolactone | 15 | 20 | 8.2 |

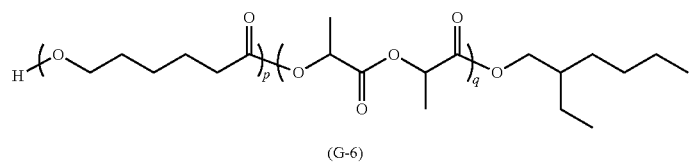

(G-6)

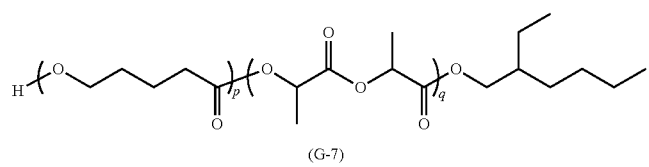

(G-7)

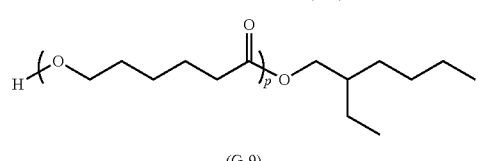

(G-9)

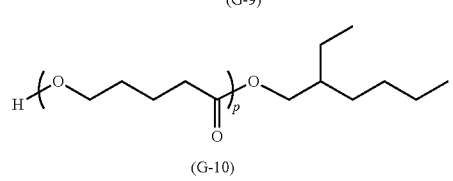

(G-10)

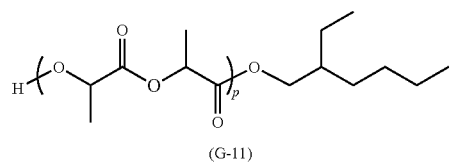

(G-11)

TABLE 1-continued

| | Weight average molecular | | Structural unit $L^1$ | | Structural unit $L^2$ | | Repetition | Crystallization |
| Macro-monomer | weight | Polymer | Cyclic compound | Content (% by mass) | Cyclic compound | Content (% by mass) | number (p + q) | temperature Tc (° C.) |
| --- | --- | --- | --- | --- | --- | --- | --- | --- |

(A-6)

(A-7)

(A-9)

(A-10)

(A-11)

Synthesis Example 12B: Synthesis of Resin B-1

Into a 1,000 mL three-neck flask, the Macromonomer A-1 (20.0 g), CB-1 (60.0 g) (2-methacryloyloxyethyl phthalate (manufactured by Shin-Nakamura Chemical Co., Ltd.)) as a polymerizable monomer for obtaining the structural unit B, benzyl methacrylate (40.0 g) as a compound for obtaining the structural unit C, PGMEA (366.7 g), dodecyl mercaptan (2.3 g), and propylene glycol monomethyl ether acetate (233.3 g) were introduced, and the mixture was stirred while blowing nitrogen. Next, the mixture was heated to 75° C. while allowing nitrogen to flow into the flask. Next, to the mixture, dodecylmercaptan (2.93 g) and then 2,2'-azobis (methyl 2-methylpropionate) (V-601) (0.74 g) were added to initiate polymerization reaction. After heating the mixture at 75° C. for 2 hours, V-601 (0.74 g) was further added to the mixture. After 2 hours, V-601 (0.74 g) was further added to the mixture. After further carrying out the reaction for 2 hours, the mixture was heated to 90° C. and stirred for 2 hours. After completion of the reaction, PGMEA (319.7 g) was added to the obtained mixture to obtain a 20% by mass solution of Resin B-1. The obtained Resin B-1 had a weight average molecular weight of 30,000 and an acid value of 60 mgKOH/mg.

Synthesis Examples 13 to 27, 30, and 31: Synthesis of Resins B-2 to B-16, B-19, and B-20

Resins B-2 to B-B-16, B-19 and B-20 were obtained by the same procedure as in Synthesis Example 12B (synthesis method of Resin B-1) except that a type of the macromonomer used in the synthesis of the Resin B-1, a type of the polymerizable monomer for obtaining the structural unit B, a type of the compound for obtaining the structural unit C, and charge amounts thereof are set, respectively, as described in Table 2 and charge amounts of an initiator and a chain transfer agent were adjusted so as to obtain a desired molecular weight.

Table 2 shows monomer compositions of Resins B-1 to B-16, B-19, and B-20, and weight average molecular weights and acid values of the resins obtained after synthesis.

Meanwhile, in Table 2, "content" in the "structural unit A" column, "content" in the "structural unit B" column, and "content" in the "structural unit C" column represent a content of the structural unit A, a content of the structural unit B, and a content of the structural unit C respectively, with respect to the entire mass of the resin.

Various abbreviations listed in Table 2 are shown below.
CB-1: 2-Methacryloyloxyethyl phthalic acid (manufactured by Shin-Nakamura Chemical Co., Ltd.)
MAA: Methacrylic acid
HO-MS: 2-Methacryloyloxyethyl succinic acid (manufactured by Kyoeisha Chemical Co., Ltd.)
Phosmer M: Acid phosphooxyethyl methacrylate (manufactured by Unichemical Co., Ltd.)
BzMA: Benzyl methacrylate Synthesis Example 28: Synthesis of Resin B-17

Into a 1,000 mL three-neck flask, BLEMMER 55 PET-800 (weight average molecular weight: 1200, p+q=15, represented by Formula (PET), manufactured by NOF Corporation, having a crystallization temperature of less than 20° C. as measured using the above method) (20.0 g), CB-1 (60.0 g) as a polymerizable monomer for obtaining the structural unit B, benzyl methacrylate (40.0 g) as a compound for obtaining the structural unit C, PGMEA (366.7 g), dodecyl mercaptan (2.3 g), and propylene glycol monomethyl ether acetate (233.3 g) were introduced, and the mixture was stirred while blowing nitrogen. The mixture was heated to 75° C. while allowing nitrogen to flow into the flask. Next, to the mixture, dodecylmercaptan (2.93 g) and then 2,2'-azobis (methyl 2-methylpropionate) (V-601) (0.74 g) were added to initiate polymerization reaction. After heating the mixture at 75° C. for 2 hours, V-601 (0.74 g) was further added to the mixture. After 2 hours, V-601 (0.74 g) was further added to the mixture. After further carrying out the reaction for 2 hours, the mixture was heated to 90° C. and stirred for 2 hours. After completion of the reaction, PGMEA (319.7 g) was added to the obtained mixture to obtain a 20% by mass solution of Resin B-17. The obtained Resin B-17 had a weight average molecular weight of 27,500 and an acid value of 60 mgKOH/mg.

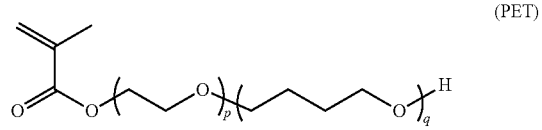

(PET)

Synthesis Example 29: Synthesis of Resin B-18

ε-caprolactone (248.0 g), δ-valerolactone (27.6 g), and lauric acid (24.5 g) were introduced into a 1,000 mL three-neck flask, and the mixture was stirred while blowing nitrogen and heated to 100° C. Next, zirconium isopropoxide (0.34 g) was added to the mixture and the obtained mixture was heated to 170° C. After 6 hours, the mixture was cooled to room temperature so that a polyester (A-18, p+q=20) was obtained. The obtained A-18 and polyethyleneimine (weight average molecular weight of 10,000, manufactured by Nippon Shokubai Co., Ltd.) were heated under nitrogen at 120° C. for 6 hours. After completion of the reaction, PGMEA was added to the mixture so that a 20% by mass solution of Resin B-18 was obtained. The obtained B-18 had a weight average molecular weight of 32,000.

TABLE 2

| | | Structural unit A | | Structural unit B | | Structural unit C | | Weight | |
| | | | Content | | Content | | Content | average | |
| | | | (% by | Polymerizable | (% by | Raw | (% by | molecular | Acid |
| | Resin | Macromer | mass) | monomer | mass) | material | mass) | weight | value |
| Synthesis Example 12B | B-1 | A-1 | 50 | CB-1 | 30 | BzMA | 20 | 30,000 | 60 |
| Synthesis Example 13 | B-2 | A-1 | 70 | CB-1 | 30 | | | 30,000 | 60 |
| Synthesis Example 14 | B-3 | A-1 | 50 | HO-MS | 30 | BzMA | 20 | 28,000 | 75 |
| Synthesis Example 15 | B-4 | A-1 | 50 | MAA | 20 | BzMA | 30 | 28,000 | 130 |

TABLE 2-continued

|  | Resin | Macromer | Structural unit A Content (% by mass) | Structural unit B Polymerizable monomer | Content (% by mass) | Structural unit C Raw material | Content (% by mass) | Weight average molecular weight | Acid value |
|---|---|---|---|---|---|---|---|---|---|
| Synthesis Example 16 | B-5 | A-1 | 50 | Phosmer M | 30 | BzMA | 20 | 31,000 | 80 |
| Synthesis Example 17 | B-6 | A-1 | 90 | CB-1 | 10 | | | 30,000 | 20 |
| Synthesis Example 18 | B-7 | A-2 | 70 | CB-1 | 30 | | | 27,500 | 60 |
| Synthesis Example 19 | B-8 | A-3 | 70 | CB-1 | 30 | | | 29,000 | 60 |
| Synthesis Example 20 | B-9 | A-4 | 70 | CB-1 | 30 | | | 32,000 | 60 |
| Synthesis Example 21 | B-10 | A-5 | 70 | CB-1 | 30 | | | 45,000 | 60 |
| Synthesis Example 22 | B-11 | A-6 | 70 | CB-1 | 30 | | | 31,000 | 60 |
| Synthesis Example 23 | B-12 | A-7 | 70 | CB-1 | 30 | | | 32,000 | 60 |
| Synthesis Example 24 | B-13 | A-8 | 70 | CB-1 | 30 | | | 29,800 | 60 |
| Synthesis Example 25 | B-14 | A-9 | 70 | CB-1 | 30 | | | 29,000 | 60 |
| Synthesis Example 26 | B-15 | A-10 | 70 | CB-1 | 30 | | | 29,500 | 60 |
| Synthesis Example 27 | B-16 | A-11 | 70 | CB-1 | 30 | | | 28,000 | 60 |
| Synthesis Example 30 | B-19 | A-12 | 50 | CB-1 | 30 | BzMA | 20 | 30,000 | 60 |
| Synthesis Example 31 | B-20 | A-12 | 50 | MAA | 30 | BzMA | 20 | 27,500 | 200 |

In the present example, a weight average molecular weight (Mw), a number average molecular weight (Mn), and a molecular weight distribution (Mw/Mn) of each of the obtained macromonomers and resins were calculated by GPC measurement under the following measurement conditions.

Apparatus: HLC-8220 GPC [manufactured by Tosoh Corporation] Detector: Differential refractometer (refractive index (RI) detector)

Precolumn: TSKGUARDCOLUMN MP(XL) 6 mm×40 mm (manufactured by Tosoh Corporation)

Sample side column: The following four are directly connected [all manufactured by Tosoh Corporation]

TSK-GEL Multipore-HXL-M 7.8 mm×300 mm

Reference side column: Same as the sample side column

Constant-temperature tank temperature: 40° C.

Mobile phase: Tetrahydrofuran

Sample side moving bed flow rate: 1.0 mL/min

Reference side moving bed flow rate: 0.3 mL/min

Specimen concentration: 0.1% by mass

Specimen injection amount: 100 μL

Data collecting time: 16 minutes to 46 minutes after specimen injection

Sampling pitch: 300 msec

Further, in Table 2 above, the acid value was obtained by neutralization titration using a sodium hydroxide aqueous solution. Specifically, a solution in which the obtained resin is dissolved in a solvent was titrated with a sodium hydroxide aqueous solution using a potentiometric method to calculate a value of millimoles of acid contained in 1 g of a solid form of the resin, and the value was multiplied by 56.1 which is a molecular weight of KOH to obtain the acid value.

Example 1: Preparation of Dispersant Solution D-1

10 g of PGMEA was mixed with 10 g of the Resin B-1 (solid content of 20% by mass) obtained in Synthesis Example 12B to prepare a Dispersant Solution D-1 having a concentration of solid contents of 10%.

Examples 2 to 14, Examples 43 and 44, and Comparative Examples 1 to 4

Dispersant Solutions D-2 to D-20 were prepared in the same manner as in Example 1 by changing a type of resin as shown in Table 3.

<Evaluation of Generation of Precipitates Under Low Temperature Environment>

Dispersant Solutions D-1 to D-20 having different types of resins were allowed to stand for 24 hours under a condition of −20° C. After being allowed to stand, a solution in a lower part of a container and a solution in an upper part of the container were collected, concentrations of solid contents thereof were calculated again, and an amount of precipitation was evaluated by estimation from a difference (Δ solid content) between solid content values of the solutions of the upper part and the lower part. In a case where no precipitation occurs (ideal value), Δ solid content=0. Evaluation was conducted according to the following criteria, and the results are shown in Table 3. B or more is a practical range. In addition, in the dispersant solutions, in a case where generation of precipitates is suppressed under a low temperature environment, even in a dispersion composition containing a colorant and a resin, generation of precipitates under a low temperature environment is suppressed.

A: Precipitates cannot be visually observed. Δ solid content: 0% to 1% by mass

B: Precipitates cannot be observed, but a solution in a lower part has a slight turbidity. Δ solid content: Greater than 1% by mass and equal to or less than 5% by mass.

C: Precipitates can be visually observed. Δ solid content: Greater than 5% by mass (Calculation Method for Solid Content Concentration)

A solid content concentration was calculated by an evaporation to dryness method. Specifically, 1 g of the collected dispersant solution was dried under reduced pressure at 110° C. for 2 hours, and the solid content concentration was obtained from a mass ratio of a specimen before and after drying by the following equation.

Solid content concentration (%)=(total mass of specimen after drying/total mass of specimen before drying)×100   (Equation)

TABLE 3

| | Resin | Dispersant solution | Generation of precipitates under low temperature environment |
|---|---|---|---|
| Example 1 | B-1 | D-1 | A |
| Example 2 | B-2 | D-2 | A |
| Example 3 | B-3 | D-3 | A |
| Example 4 | B-4 | D-4 | A |
| Example 5 | B-5 | D-5 | A |
| Example 6 | B-6 | D-6 | A |
| Example 7 | B-7 | D-7 | A |
| Example 8 | B-8 | D-8 | A |
| Example 9 | B-9 | D-9 | A |
| Example 10 | B-10 | D-10 | B |
| Example 11 | B-11 | D-11 | A |
| Example 12 | B-12 | D-12 | A |
| Example 13 | B-13 | D-13 | B |
| Example 14 | B-17 | D-17 | A |
| Comparative Example 1 | B-14 | D-14 | C |
| Comparative Example 2 | B-15 | D-15 | C |
| Comparative Example 3 | B-16 | D-16 | C |
| Comparative Example 4 | B-18 | D-18 | C |
| Example 43 | B-19 | D-19 | A |
| Example 44 | B-20 | D-20 | A |

From the results shown in Table 3, in the dispersant solutions of Examples 1 to 14, Example 43, and Example 44 containing a resin having a predetermined structural unit, generation of precipitates under a low temperature environment was suppressed. On the other hand, in the dispersant solutions of Comparative Examples 1 to 4, which did not contain a resin having a predetermined structural unit, a desired effect was not obtained.

Further, the dispersant solution of Example 2 containing a resin having a mass ratio of the structural unit $L^1$ to the structural unit $L^2$ of greater than 50/50, as compared with Example 13, generation of precipitates under a low temperature environment was further suppressed.

Further, in the dispersant solution of Example 9 containing a resin having a sum of p and q of less than 120, as compared with Example 10, generation of precipitates under a low temperature environment was further suppressed.

As in the above results, even in the dispersion compositions containing the resin and the colorant used in Examples 1 to 14, Example 43, and Example 44, precipitates under a low temperature environment could not be observed, which was a result showing a similar tendency to the above Table 3.

[Production of Titanium Nitride (Titanium Oxynitride)-Containing Particles TiN-1]

First, Ti nanoparticles (Ti-containing metal fine particles) were formed by subjecting Ti particles (TC-200, manufactured by Tohotech Corporation) to plasma treatment in Ar gas. After the plasma treatment, the Ti nanoparticles were allowed to stand for 24 hours under an Ar gas atmosphere at a condition of an $O_2$ concentration of 50 ppm or less and 30° C., and then was allowed to stand at 30° C. for 24 hours in a state where $O_2$ gas was introduced into the Ar atmosphere so that an $O_2$ concentration was 100 ppm, (pretreatment of Ti particles).

Thereafter, the obtained Ti nanoparticles were classified using a TTSP separator manufactured by Hosokawa Micron Corporation at a condition that allows a yield of 10%, and powders of Ti particles were obtained. A primary particle diameter of the obtained powders was obtained by calculating an average particle diameter of 100 particles by arithmetic mean using TEM observation, and, as a result, it was 120 nm.

Titanium nitride-containing particles TiN-1 were manufactured using an apparatus similar to a metal fine particle-manufacturing apparatus described in FIG. 1 of WO2010/147098A.

Specifically, in the metal fine particle-manufacturing apparatus, radio frequency voltages of about 4 MHz and about 80 kVA were applied to a radio frequency oscillation coil of a plasma torch, and, from a plasma gas supply source, a mixed gas of argon gas of 50 L/min and nitrogen of 50 L/min was supplied as a plasma gas to generate an argon-nitrogen thermal plasma flame in the plasma torch. In addition, a carrier gas of 10 L/min was supplied from an atomizing gas supply source of a material supply device.

Then, Fe powders (JIP 270 M, manufactured by JFE Steel Co., Ltd.) and Si powders (Silicon powder SI 006031) were mixed with the Ti particles obtained as described above so that a mass ratio of Ti/Fe/Si=remainder/0.05/0.05. The mixture was supplied, together with argon gas as a carrier gas, into a thermal plasma flame in the plasma torch, and evaporated in the thermal plasma flame to be highly dispersed in a vapor-phase state.

Further, nitrogen was used as a gas to be supplied into a chamber by a gas supply device. At this time, a flow rate in the chamber was 5 m/sec, and a supply amount was 1000 L/min. In addition, a pressure inside a cyclone was 50 kPa, and a supply rate of each raw material from the chamber to the cyclone was 10 m/s (average value).

In this way, titanium nitride-containing particles TiN-1 were obtained.

For the obtained titanium nitride-containing particles TiN-1, contents of titanium (Ti) atoms, iron (Fe) atoms, and silicon (Si) atoms were measured by an ICP emission spectroscopy. In the ICP emission spectroscopy, an ICP emission spectroscopic apparatus "SPS 3000" (trade name) manufactured by Seiko Instruments Inc. was used.

Further, a content of nitrogen atoms was measured using an oxygen/nitrogen analyzer "EMGA-620 W/C" (trade name) manufactured by HORIBA, Ltd., and calculated by an inert gas melting-thermal conductivity method. As a result, a mass ratio of the respective atoms contained in the titanium nitride-containing particles TiN was Ti/N/Fe/Si=57/34/0.0030/0.0020.

Regarding X-ray diffraction of the titanium nitride-containing particles TiN-1, a powder specimen was packed in an aluminum standard specimen holder and measurement was performed by a wide angle X-ray diffraction method (trade name "RU-200R" manufactured by Rigaku Corporation). As a measurement condition, an X-ray source was CuKα ray, an output was 50 kV/200 mA, a slit type was 1°-1°-0.15 mm-0.45 mm, a measurement step (2θ) was 0.02°, and a scan speed was 2°/min.

Then, a diffraction angle of a peak derived from a TiN (200) plane observed near a diffraction angle 2θ (42.6°) was measured. Furthermore, from a half-width of the peak derived from the (200) plane, a crystallite size constituting the particles was obtained by using Scherrer's equation. As a result, the diffraction angle of the peak was 42.62° and the crystallite size was 10 nm. No X-ray diffraction peak attributable to $TiO_2$ was found.

[Production of Niobium Nitride-Containing Particles (Niobium Oxynitride) NbN-1]

Niobium nitride-containing particles (niobium oxynitride) were produced by the following method.

First, niobium (powder) <100-325 mesh> manufactured by Mitsuwa Chemical Co., Ltd. was prepared as a raw material (hereinafter also referred to as a "metal raw material powder").

Next, Nb nanoparticles (metal fine particles containing Nb) were formed by subjecting the metal raw material powder to a plasma treatment in Ar gas (treatment conditions were the same as in the following plasma treatment (1)).

(Plasma Treatment (1))

A plasma treatment (1) was performed by the following method. The plasma treatment (1) was performed under the following conditions using a device similar to the above-mentioned metal fine particle-manufacturing apparatus.

Radio frequency voltage applied to radio frequency oscillation coil: Frequency of about 4 MHz, and voltage of about 80 kVA Plasma gas: Argon gas (supply amount: 100 L/min)

Carrier gas: Argon gas (supply amount: 10 L/min)

Atmosphere in chamber: Argon gas (supply amount of 1,000 L/min and flow rate in chamber of 5 m/sec)

Atmosphere in cyclone: Argon gas, internal pressure: 50 kPa

Material feed rate from chamber to cyclone: 10 m/s (average value)

Next, using the Nb nanoparticles as a raw material metal powder, the raw material metal powder was subjected to a plasma treatment in a nitrogen gas (treatment conditions were the same as in plasma treatment (2) as described later), and niobium oxynitride was obtained.

(Plasma Treatment (2))

A plasma treatment (2) was carried out by the following method. An apparatus used is the same as the plasma treatment (1).

Radio frequency voltage applied to radio frequency oscillation coil: Frequency of about 4 MHz and voltage of about 80 kVA Plasma gas: Argon gas and nitrogen gas (supply amounts are each 50 L/min)

Carrier gas: Nitrogen gas (supply amount of 10 L/min)

Atmosphere in chamber: Nitrogen gas (supply amount of 1,000 L/min and flow rate in chamber of 5 m/sec)

Atmosphere in cyclone: nitrogen gas, internal pressure of 50 kPa

Material feed rate from chamber to cyclone: 10 m/s (average value)

Nitrogen gas at 20° C. was introduced into the particles after completion of the plasma treatment (2) at a condition that allows a relative humidity of 95% in atmospheric air with argon gas by a split-type humidity supply apparatus SRH manufactured by NIHON SHINTECH CO., LTD., and this was allowed to stand for 24 hours. Thereafter, the obtained particles were classified using a TTSP separator made by Hosokawa Micron Corporation at a condition that allows a yield of 10%, and niobium nitride-containing particles were obtained. Nitrogen gas was supplied to the separator.

Example 15: Preparation of Pigment Dispersion Liquid (Corresponding to Dispersion Composition) P-1

(A) Titanium black (average primary particle diameter: 30 nm) 45 parts by mass
(B) Dispersant (Resin B-1) (solid content of 20% by mass) 13.5 parts by mass The above components were mixed, and the mixture was subjected to a dispersion treatment with beads mill (zirconia beads of 0.3 mm) to obtain a pigment dispersion liquid.

Example 15 Ti: Preparation of Pigment Dispersion Liquid (Corresponding to Dispersion Composition) P-Ti-1

(A) TiN-1 45 parts by mass
(B) Dispersant (Resin B-1) (solid content of 20% by mass) 13.5 parts by mass The above components were mixed, and the mixture was subjected to a dispersion treatment with beads mill (zirconia beads of 0.3 mm) to obtain a pigment dispersion liquid.

Example 15 Nb: Preparation of Pigment Dispersion Liquid (Corresponding to Dispersion Composition) P-Nb-1

(A) NbN-1 45 parts by mass
(B) Dispersant (Resin B-1) (solid content of 20% by mass) 13.5 parts by mass The above components were mixed, and the mixture was subjected to a dispersion treatment with beads mill (zirconia beads of 0.3 mm) to obtain a pigment dispersion liquid.

Examples 16 to 28, Examples 45 and 46, and Comparative Examples 5 to 8

Pigment Dispersion Liquids P-2 to P-20 containing Resins B-2 to B-20 were obtained in the same manner as in Example 15.

Examples 16Ti to 28Ti, Example 45Ti, Example 46Ti, and Comparative Examples 5Ti to 8Ti Pigment Dispersion Liquids P-Ti-2 to P-Ti-20 containing Resins B-2 to B-20 were obtained in the same manner as in Example 15Ti.

Examples 16Nb to 28Nb, Example 45Nb, Example 46Nb, and Comparative Examples 5Nb to 8Nb Pigment Dispersion Liquids P-Nb-2 to P-Nb-20 containing Resins B-2 to B-20 were obtained in the same manner as in Example 15Nb.

<Evaluation of Temporal Stability>

A viscosity immediately after preparation of a pigment dispersion liquid and a viscosity after 3 days under a constant temperature environment at 45° C. were measured, respectively, and a temporal stability was evaluated by a viscosity change. Evaluation was carried out according to the following criteria, and the results are shown in Table 4. B or more is a practical range.

The viscosity change is a thickening rate calculated by the following equation. A viscosity of a pigment dispersion liquid in the following equation is a value measured according to the test method described in JISK5101-6-2: 2004 using an E type viscometer (R85 type, manufactured by Toki Sangyo Co., Ltd.).

Thickening rate=((viscosity of pigment dispersion liquid after 3 days under constant temperature environment at 45° C.)/viscosity of pigment dispersion liquid immediately after preparation/ viscosity of pigment dispersion liquid immediately after preparation)×100    (Equation)

AA: No thickened. Thickening rate: Equal to or greater than 0% and equal to or less than 3%
A: Slightly thickened with no problem. Thickening rate: Greater than 3% and equal to or less than 5%
B: Somewhat thickened with no problem. Thickening rate: Greater than 5% and equal to or less than 10%
C: Extremely thickened. Thickening rate: Greater than 10%

TABLE 4

| | Resin | Pigment dispersion | Temporal stability |
|---|---|---|---|
| Example 15 | B-1 | P-1 | AA |
| Example 16 | B-2 | P-2 | A |
| Example 17 | B-3 | P-3 | A |
| Example 18 | B-4 | P-4 | A |
| Example 19 | B-5 | P-5 | A |
| Example 20 | B-6 | P-6 | A |
| Example 21 | B-7 | P-7 | AA |
| Example 22 | B-8 | P-8 | B |
| Example 23 | B-9 | P-9 | A |
| Example 24 | B-10 | P-10 | B |
| Example 25 | B-11 | P-11 | A |
| Example 26 | B-12 | P-12 | A |
| Example 27 | B-13 | P-13 | A |
| Example 28 | B-17 | P-17 | A |
| Comparative Example 5 | B-14 | P-14 | A |
| Comparative Example 6 | B-15 | P-15 | A |
| Comparative Example 7 | B-16 | P-16 | A |
| Comparative Example 8 | B-18 | P-18 | B |
| Example 45 | B-19 | P-19 | AA |
| Example 46 | B-20 | P-20 | A |
| Example 15Ti | B-1 | P-Ti-1 | AA |
| Example 16Ti | B-2 | P-Ti-2 | A |
| Example 17Ti | B-3 | P-Ti-3 | A |
| Example 18Ti | B-4 | P-Ti-4 | A |
| Example 19Ti | B-5 | P-Ti-5 | A |
| Example 20Ti | B-6 | P-Ti-6 | A |
| Example 21Ti | B-7 | P-Ti-7 | AA |
| Example 22Ti | B-8 | P-Ti-8 | B |
| Example 23Ti | B-9 | P-Ti-9 | A |
| Example 24Ti | B-10 | P-Ti-10 | B |
| Example 25Ti | B-11 | P-Ti-11 | A |
| Example 26Ti | B-12 | P-Ti-12 | A |
| Example 27Ti | B-13 | P-Ti-13 | A |
| Example 28Ti | B-17 | P-Ti-17 | A |
| Comparative Example 5Ti | B-14 | P-Ti-14 | A |
| Comparative Example 6Ti | B-15 | P-Ti-15 | A |
| Comparative Example 7Ti | B-16 | P-Ti-16 | A |
| Comparative Example 8Ti | B-18 | P-Ti-18 | B |
| Example 45Ti | B-19 | P-Ti-19 | AA |
| Example 46Ti | B-20 | P-Ti-20 | A |

| | Resin | Pigment dispersion liquid | Temporal stability |
|---|---|---|---|
| Example 15Nb | B-1 | P-Nb-1 | AA |
| Example 16Nb | B-2 | P-Nb-2 | A |
| Example 17Nb | B-3 | P-Nb-3 | A |

TABLE 4-continued

| Example 18Nb | B-4 | P-Nb-4 | A |
|---|---|---|---|
| Example 19Nb | B-5 | P-Nb-5 | A |
| Example 20Nb | B-6 | P-Nb-6 | A |
| Example 21Nb | B-7 | P-Nb-7 | AA |
| Example 22Nb | B-8 | P-Nb-8 | B |
| Example 23Nb | B-9 | P-Nb-9 | A |
| Example 24Nb | B-10 | P-Nb-10 | B |
| Example 25Nb | B-11 | P-Nb-11 | A |
| Example 26Nb | B-12 | P-Nb-12 | A |
| Example 27Nb | B-13 | P-Nb-13 | A |
| Example 28Nb | B-17 | P-Nb-17 | A |
| Comparative Example 5Nb | B-14 | P-Nb-14 | A |
| Comparative Example 6Nb | B-15 | P-Nb-15 | A |
| Comparative Example 7Nb | B-16 | P-Nb-16 | A |
| Comparative Example 8Nb | B-18 | P-Nb-18 | B |
| Example 45Nb | B-19 | P-Nb-19 | AA |
| Example 46Nb | B-20 | P-Nb-20 | A |

From the results shown in Table 4, Example 15 in which a content of the structural unit A is less than 70% by mass with respect to the entire mass of the resin had excellent temporal stability as compared with Example 16.

Example 21 in which a mass ratio of the structural unit $L^1$ to the structural unit $L^2$ was less than 90/10 had excellent temporal stability as compared with Example 16.

Further, Example 16, in which a sum of p and q was greater than 5 and less than 120, had more excellent temporal stability as compared with Examples 22 and 24.

[Preparation of Curable Composition M-1]

Using the Pigment Dispersion Liquid P-1 prepared above, various components were mixed so as to have a composition shown in Table 5, and a Curable Composition M-1 was obtained. A final solid content was adjusted with PGMEA to be 32% by mass. The pigment dispersion liquid after storage at −18° C. for 1 day was used.

TABLE 5

| | Name and the like | | Solid content (% by mass) |
|---|---|---|---|
| Pigment Dispersion Liquid P-1 (corresponding to dispersion composition) | Dispersant (corresponding to resin) | Resin B-1 | 17.4 |
| | Pigment (corresponding to colorant) | Titanium black | 58.0 |
| Binder polymer | | Acricure-RD-F8 (manufactured by Nippon Shokubai Co., Ltd.) | 3.3 |
| Polymerizable compound | | KAYARAD DPHA (manufactured by Nippon Kayaku Co., Ltd.) | 16.5 |
| Polymerization initiator | | Irgacure OXE02 (manufactured by BASF Japan) | 4.8 |

[Preparation of Curable Compositions M-2 to M-20]

Curable compositions M-2 to M-20 were prepared, respectively, in the same manner as in the preparation of the Curable Composition M-1 except that the Pigment Dispersion Liquid P-1 was changed to each of the Pigment Dispersion Liquids P-2 to P-20.

[Preparation of Curable Compositions M-Ti-1 to M-Ti-20]

Curable composition M-Ti-1 to M-Ti-20 were prepared in the same manner as in the preparation of the Curable Compositions M-1 to M-20 except that the Pigment Dispersion Liquid P-1 was changed to each of P-Ti-1 to P-Ti-20.

[Preparation of Curable Compositions M-Nb-1 to M-Nb-20]

Curable Composition M-Nb-1 to M-Nb-20 were prepared in the same manner as in the preparation of the Curable Compositions M-1 to M-20 except that the Pigment Dispersion Liquid P-1 was changed to each of P-Nb-1 to P-Nb-20.

Example 29: Production of Light-Shielding Color Filter for Solid-State Imaging Device By using the Curable Composition M-1, a light-shielding color filter for a solid-state imaging device was produced by the following procedure.

[Curable Composition Layer-Forming Step]

The Curable Composition M-1 was uniformly coated onto a silicon wafer as a support by adjusting a coating rotation speed of spin coating so that a film thickness after a heat treatment became 2.0 μm, and the silicon wafer coated with the Curable Composition M-1 was heated for 120 seconds by a hot plate having a surface temperature of 120° C. In this manner, a coating film having a film thickness of 2.0 μm was obtained. This coating film corresponds to a curable composition layer.

[Exposure Step]

Next, the coating film was irradiated (exposed) with an exposure amount of 200 to 1000 mJ/cm$^2$ through an Island pattern mask of 2 μm square using an i-ray stepper that is FPA-3000iS+ [manufactured by Canon Inc.].

[Developing Step]

After irradiation (exposure), the silicon wafer on which the irradiated coating film was formed was placed on a horizontal rotating table of a spin shower developing machine (DW-30 type, manufactured by Chemitronics Co., Ltd.), and puddle development was carried out at 23° C. for 60 seconds using CD-2000 (manufactured by Fujifilm Electronic Materials Co., Ltd.).

Next, the silicon wafer on which the coating film after the exposure was formed was fixed to the above-mentioned horizontal rotating table by a vacuum chuck method, and the silicon wafer was rotated at a rotation speed of 50 rpm by a rotation device while supplying pure water from a jet nozzle in a shower shape from above a rotation center thereof to perform a rinsing treatment. Thereafter, the silicon wafer was spray-dried to form a silicon wafer having a black matrix.

[Post-Baking Step]

Furthermore, the silicon wafer was heat-treated at 220° C. for 300 seconds using a clean oven CLH-21 CDH (manufactured by Koyo Thermo Systems Co., Ltd.).

Examples 30 to 42, Examples 47 and 48, and Comparative Examples 9 to 12

Light-shielding color filters for a solid-state imaging device of Examples 30 to 42, Examples 47 and 48, and Comparative Examples 9 to 12 were produced by the same procedure except that each of M-2 to M-20 was used in place of the Curable Composition M-1 used in Example 29.

Examples 29Ti to 42 Ti, Example 47Ti, Example 48Ti, and Comparative Examples 9Ti to 12Ti Light-shielding color filters for a solid-state imaging device of Examples 29Ti to 42Ti, Example 47Ti, Example 48Ti, and Comparative Examples 9Ti to 12Ti were produced by the same procedure except that each of M-Ti-1 to M-Ti-20 was used in place of the Curable Composition M-1 used in Example 29.

Examples 29Nb to 42Nb, Example 47Nb, Example 48Nb, and Comparative Examples 9Nb to 12Nb Light-shielding color filters for a solid-state imaging device of Examples 29Nb to 42Nb, Example 47Nb, Example 48Nb, and Comparative Examples 9Nb to 12Nb were produced by the same procedure except that each of M-Nb-1 to M-Nb-20 was used in place of the Curable Composition M-1 used in Example 29.

<Evaluation of Developability>

In the above-described light-shielding color filter for a solid-state imaging device, presence or absence of residues (which are considered to be derived from precipitates of the dispersion composition) in a region (unexposed portion) where light was not irradiated in the exposure step was observed with a scanning electron microscope (SEM). Evaluation was carried out according to the following criteria, and the evaluation results are shown in Table 6. B or more is a practical range.

A: No residues were observed in the unexposed portion.

B: Although a slight amount of residues was observed in the unexposed portion, it was such a level that practically no problems occurred.

C: Residues were remarkably observed in the unexposed portion.

<Film Uniformity>

A pattern obtained through the above [post-baking step] was visually observed, and a film uniformity was evaluated according to the following evaluation criteria.

"A": No foreign matters in appearance.

"B": There are few foreign matters.

"C": There are foreign matters in a large amount.

TABLE 6

|  | Resin | Curable composition | Film uniformity | Developability |
|---|---|---|---|---|
| Example 29 | B-1 | M-1 | A | A |
| Example 30 | B-2 | M-2 | A | A |
| Example 31 | B-3 | M-3 | A | A |
| Example 32 | B-4 | M-4 | A | B |
| Example 33 | B-5 | M-5 | A | A |
| Example 34 | B-6 | M-6 | A | B |
| Example 35 | B-7 | M-7 | A | A |
| Example 36 | B-8 | M-8 | A | A |
| Example 37 | B-9 | M-9 | A | A |
| Example 38 | B-10 | M-10 | B | B |
| Example 39 | B-11 | M-11 | A | A |
| Example 40 | B-12 | M-12 | A | A |
| Example 41 | B-13 | M-13 | A | B |
| Example 42 | B-17 | M-17 | A | A |
| Comparative Example 9 | B-14 | M-14 | C | C |
| Comparative Example 10 | B-15 | M-15 | C | C |
| Comparative Example 11 | B-16 | M-16 | C | C |
| Comparative Example 12 | B-18 | M-18 | C | C |
| Example 47 | B-19 | M-19 | A | A |
| Example 48 | B-20 | M-20 | A | A |
| Example 29Ti | B-1 | M-Ti-1 | A | A |
| Example 30Ti | B-2 | M-Ti-2 | A | A |
| Example 31Ti | B-3 | M-Ti-3 | A | A |
| Example 32Ti | B-4 | M-Ti-4 | A | B |
| Example 33Ti | B-5 | M-Ti-5 | A | A |
| Example 34Ti | B-6 | M-Ti-6 | A | B |
| Example 35Ti | B-7 | M-Ti-7 | A | A |
| Example 36Ti | B-8 | M-Ti-8 | A | A |
| Example 37Ti | B-9 | M-Ti-9 | A | A |
| Example 38Ti | B-10 | M-Ti-10 | B | B |

TABLE 6-continued

| | Resin | Curable composition | Film uniformity | Developability |
|---|---|---|---|---|
| Example 39Ti | B-11 | M-Ti-11 | A | A |
| Example 40Ti | B-12 | M-Ti-12 | A | A |
| Example 41Ti | B-13 | M-Ti-13 | A | B |
| Example 42Ti | B-17 | M-Ti-17 | A | A |
| Comparative Example 9Ti | B-14 | M-Ti-14 | C | C |
| Comparative Example 10Ti | B-15 | M-Ti-15 | C | C |
| Comparative Example 11Ti | B-16 | M-Ti-16 | C | C |
| Comparative Example 12Ti | B-18 | M-Ti-18 | C | C |
| Example 47Ti | B-19 | M-Ti-19 | A | A |
| Example 48Ti | B-20 | M-Ti-20 | A | A |
| Example 29Nb | B-1 | M-Nb-1 | A | A |
| Example 30Nb | B-2 | M-Nb-2 | A | A |
| Example 31Nb | B-3 | M-Nb-3 | A | A |
| Example 32Nb | B-4 | M-Nb-4 | A | B |
| Example 33Nb | B-5 | M-Nb-5 | A | A |
| Example 34Nb | B-6 | M-Nb-6 | A | B |
| Example 35Nb | B-7 | M-Nb-7 | A | A |
| Example 36Nb | B-8 | M-Nb-8 | A | A |
| Example 37Nb | B-9 | M-Nb-9 | A | A |
| Example 38Nb | B-10 | M-Nb-10 | B | B |
| Example 39Nb | B-11 | M-Nb-11 | A | A |
| Example 40Nb | B-12 | M-Nb-12 | A | A |
| Example 41Nb | B-13 | M-Nb-13 | A | B |
| Example 42Nb | B-17 | M-Nb-17 | A | A |
| Comparative Example 9Nb | B-14 | M-Nb-14 | C | C |
| Comparative Example 10Nb | B-15 | M-Nb-15 | C | C |
| Comparative Example 11Nb | B-16 | M-Nb-16 | C | C |
| Comparative Example 12Nb | B-18 | M-Nb-18 | C | C |
| Example 47Nb | B-19 | M-Nb-19 | A | A |
| Example 48Nb | B-20 | M-Nb-20 | A | A |

From the results shown in Table 6, the curable compositions of Examples 29 to 42, Example 47, and Example 48 containing a predetermined resin had excellent developability. On the other hand, in the curable compositions of Comparative Examples 9 to 12 containing no predetermined resin, a desired effect was not obtained.

Further, Examples 29 and 30 in which a content of the structural unit A is less than 90% by mass relative to the entire mass of the resin had excellent developability as compared with Example 34.

Further, Examples 30 and 35 in which a mass ratio of the structural unit $L^1$ to the structural unit $L^2$ was greater than 50/50 had excellent developability as compared with Example 41.

Further, Examples 30 and 37 where a sum of p and q is less than 120 had excellent developability as compared with Example 38.

Example 29-A: Developability (1) after Post-Baking of Curable Composition M-1

The light-shielding color filter for a solid-state imaging device, which was produced in the same manner as in Example 29 except that a film thickness of the curable composition layer after the heat treatment in [Curable composition layer-forming step] in Example 29 was 1.0 μm, was heated in an oven at 220° C. for 1 hour to perform a post-baking step. Thereafter, evaluation of developability was performed in the same manner as described above.

Example 29-B: Developability (2) after Post-Baking of Curable Composition M-1

Evaluation of developability was performed in the same manner as in Example 29-A except that a film thickness of the curable composition layer after the heat treatment in [Curable composition layer-forming step] in Example 29-A was 3.0 μm. The results are shown in Table 7.

TABLE 7

| | Resin | Curable composition | Developability |
|---|---|---|---|
| Example 29-A | B-1 | M-1 | A |
| Example 29-B | B-1 | M-1 | A |

From the results shown in Table 7, it was found that in a case where the film thickness of the curable composition layer after the heat treatment was in a range of 1.0 to 3.0 μm, excellent developability was exhibited.

Examples 15-D and 29-D: Developability of Curable Composition Containing Carbon Black Pigment Dispersion Liquid P-1-D and Curable Composition M-1-D were prepared in the same manner as in Examples 15 and 29 except that carbon black (trade name "Color Black S170", manufactured by Degussa AG, average primary particle diameter of 17 nm, BET specific surface area of 200 m²/g, which is carbon black manufactured by gas black method) was used in place of titanium black. Using the obtained Pigment Dispersion Liquid P-1-D and the Curable Composition M-1-D, evaluation of temporal stability and evaluation of developability, and evaluation of linearity of pattern edge were performed in the same manner as in Examples 15 and 29. The results are shown in Table 8.

The linearity of pattern edge is obtained by also observing a shape of the pattern edge (a boundary portion between an exposed portion and an unexposed portion) in the SEM observation in the above-described evaluation of the developability and evaluating a shape of a linear portion thereof. Evaluation is carried out from the following viewpoints, and B or more is a practical range.

A: A shape of pattern edge is linear.
B: There is somewhat disorder in a shape of pattern edge, but it is roughly linear.
C: There is a disorder in a shape of pattern edge.

TABLE 8

| | Resin | Pigment dispersion liquid | Curable composition | Temporal stability | Developability | Linearity of pattern edge |
|---|---|---|---|---|---|---|
| Example 15-D | B-1 | P-1-D | — | AA | — | — |
| Example 29-D | B-1 | P-1-D | M-1-D | — | A | B |
| Example 15 | B-1 | P-1 | — | AA | — | — |
| Example 29 | B-1 | P-1 | M-1 | — | A | A |

From the results shown in Table 8, in Example 15-D, the same results as in Example 15 were obtained. On the other hand, in Example 29-D, the same results as in Example 29 were obtained regarding developability. Regarding the linearity of the pattern edge, it was found that Example 29 is superior to Example 29-D.

Examples 15-E and 29-E: Developability of Curable Composition Containing Pigment Red Pigment Dispersion Liquid P-1-E and Curable Composition M-1-E were prepared in the same manner as in Examples 15 and 29 except that Pigment Red 254 (trade name BK-CF, manufactured by Ciba Specialty Chemicals Inc.) was used in place of titanium black.

Using the obtained Pigment Dispersion Liquid P-1-E and the Curable Composition M-1-E, evaluation of temporal stability and developability was carried out in the same manner as in Examples 15 and 29. The results are shown in Table 9.

TABLE 9

|  | Resin | Pigment dispersion liquid | Curable composition | Temporal stability | Developability |
|---|---|---|---|---|---|
| Example 15-E | B-1 | P-1-E | — | AA | — |
| Example 29-E | B-1 | P-1-E | M-1-E | — | A |
| Example 15 | B-1 | P-1 | — | AA | — |
| Example 29 | B-1 | P-1 | M-1 | — | A |

From the results shown in Table 9, it was found that Examples 15-E and 29-E in which Pigment Red was used as a colorant had similarly excellent temporal stability and developability as compared with Example 15 and Example 29.

Examples 15-F and 29-F: Developability of Curable Compositions Using Titanium Nitride Pigment Dispersion Liquid P-1-F and Curable Composition M-1-F were prepared in the same manner as in Examples 15 and 29 except that titanium nitride was used in place of titanium black. With respect to the obtained Pigment Dispersion Liquid P-1-F and the Curable Composition M-1-F, evaluation of temporal stability and developability was performed in the same manner as in Examples 15 and 29. The results are shown in Table 10.

TABLE 10

|  | Resin | Pigment dispersion liquid | Curable composition | Temporal stability | Developability |
|---|---|---|---|---|---|
| Example 15-F | B-1 | P-1-F | — | AA | — |
| Example 29-F | B-1 | P-1-F | M-1-F | — | A |
| Example 15 | B-1 | P-1 | — | AA | — |
| Example 29 | B-1 | P-1 | M-1 | — | A |

From the results shown in Table 10, it was found that Examples 15-F and 29-F using titanium nitride as colorant had similarly excellent temporal stability and developability as compared with Example 15 and Example 29.

Examples 15-G and 29-G: Developability of Curable Compositions Using Niobium Nitride Pigment Dispersion Liquid P-1-G and Curable Composition M-1-G were prepared in the same manner as in Examples 15 and 29 except that niobium nitride was used in place of titanium black. Using the obtained Pigment Dispersion Liquid P-1-G and the Curable Composition M-1-G, evaluation of temporal stability and developability was performed in the same manner as in Examples 15 and 29. The results are shown in Table 11.

TABLE 11

|  | Resin | Pigment dispersion liquid | Curable composition | Temporal stability | Developability |
|---|---|---|---|---|---|
| Example 15-G | B-1 | P-1-G | — | AA | — |
| Example 29-G | B-1 | P-1-G | M-1-G | — | A |
| Example 15 | B-1 | P-1 | — | AA | — |
| Example 29 | B-1 | P-1 | M-1 | — | A |

From the results shown in Table 11, it was found that Examples 15-G and 29-G using titanium nitride as colorant had similarly excellent temporal stability and developability as compared with Example 15 and Example 29.

Examples 15-H and 29-H: Temporal Stability and Developability in Case of Using Cyclohexanone Pigment Dispersion Liquid P-1-H and Curable Composition M-1-H were prepared in the same manner as in Example 15 and Example 29 except that the solvent was changed from PGMEA to cyclohexanone.

Using the obtained Pigment Dispersion Liquid P-1-H and Curable Composition M-1-H, evaluation of temporal stability and developability was performed in the same manner as in Examples 15 and 29. The results are shown in Table 12.

TABLE 12

|  | Resin | Pigment dispersion liquid | Curable composition | Temporal stability | Developability |
|---|---|---|---|---|---|
| Example 15-H | B-1 | P-1-H | — | AA | — |
| Example 29-H | B-1 | P-1-H | M-1-H | — | A |
| Example 15 | B-1 | P-1 | — | AA | — |
| Example 29 | B-1 | P-1 | M-1 | — | A |

From the results shown in Table 12, it was found that Examples 15-H and 29-H using cyclohexanone as a solvent have similarly excellent temporal stability and developability as compared with Example 15 and Example 29.

Example 29-I

Curable Composition M-1-I was prepared in the same manner as in Example 29 except that KAYARAD DPHA (dipentaerythritol hexaacrylate, manufactured by Nippon Kayaku Co., Ltd.) (10.0 parts by mass) as a polymerizable compound and PET-30 (pentaerythritol triacrylate, Nippon Kayaku Co., Ltd.) (8.5 parts by mass) were used.

Using the obtained Curable Composition M-1-I, steps up to the post-baking step carried out in Example 29-A were carried out, and evaluation of developability and linearity of pattern edge was evaluated. A film thickness of the curable composition layer after the heat treatment in [Curable composition layer-forming step] is 2.0 μm. The results are shown in Table 13.

TABLE 13

| | Resin | Pigment dispersion liquid | Curable composition | Temporal stability | Developability | Linearity of pattern edge |
|---|---|---|---|---|---|---|
| Example 29-I | B-1 | P-1 | M-1-I | — | A | A |
| Example 29 | B-1 | P-1 | M-1 | — | A | A |

From the results shown in Table 13, it was found that Example 29-I using KAYARAD DPHA (dipentaerythritol hexaacrylate, manufactured by Nippon Kayaku Co., Ltd.) (10.0 parts by mass) as a polymerizable compound and PET-30 (pentaerythritol triacrylate, manufactured by Yakuhin Kabushiki Kaisha, Ltd.) (8.5 parts by mass) had similarly excellent developability and linearity of pattern edge as compared with Example 29.

[Production and Evaluation of Solid-State Imaging Device]

On the base material on which the light-shielding color filter for a solid-state imaging device produced in Example 29 was formed, a curable composition for lens (composition obtained by adding 1% by mass of aryl sulfonium salt derivative (SP-172 manufactured by ADEKA CORPORATION) to an alicyclic epoxy resin (EHPE-3150 manufactured by Daicel Chemical Industries, Ltd.)) was used to form a curable resin layer, and a shape was transferred thereto with a quartz mold having a lens shape. The curable resin layer was cured with a high-pressure mercury lamp at an exposure amount of 400 mJ/cm$^2$, so that a wafer level lens array having a plurality of wafer level lenses was produced.

The produced wafer level lens array was cut, and the obtained wafer level lens was used to produce a lens module. Thereafter, an imaging element and a sensor substrate were attached thereto to produce an imaging unit (corresponding to a solid-state imaging device).

The obtained wafer level lens had good transmittance without residues at a lens opening. Also, high uniformity in a surface of the cured film and high light-shielding properties were exhibited.

[Production of Color Filter Having Black Matrix]
[Formation of Black Matrix]

The curable composition M-1 obtained in Example 29 was coated on a glass wafer by a spin coating method and then heated, with the glass wafer, on a hot plate at 120° C. for 2 minutes to obtain a curable composition layer. A film thickness of the obtained curable composition layer was 2.0 µm.

Subsequently, using an i-ray stepper, the obtained curable composition layer was exposed through a photomask having an island pattern with a pattern of 0.1 mm at an exposure amount of 500 mJ/cm$^2$.

Puddle development was carried out on the curable composition layer after the exposure using a 0.3% aqueous solution of tetramethylammonium hydroxide at a temperature of 23° C. for 60 seconds. Thereafter, the curable composition layer after the developing treatment was subjected to a rinsing treatment with a spin shower, and the curable composition layer which had been subjected to the rinsing treatment was washed with pure water to obtain a patterned light-shielding film (black matrix).

[Preparation of Chromatic Color Curable Composition]

Each of Curable Composition R-1 for red (R), Curable Composition G-1 for green (G), and Curable Composition B-1 for blue (B) was prepared in the same manner as in Curable Composition M-1, except that each of the following chromatic color pigments was used in place of titanium black.

The chromatic color pigments used in the preparation of the curable compositions are as follows.
Pigment for red (R)
C.I. Pigment Red 254
Pigment for green (G)
30/70 (mass ratio) mixture of C.I. Pigment Green 36 and C.I. Pigment Yellow 219
Pigment for blue (B)
30/70 [mass ratio] mixture of C.I. Pigment Blue 15:6 and C.I. Pigment Violet 23

[Production of Color Filter]

Using the above Curable Composition R-1 for red (R) in the black matrix produced by the above-described method, a red (R) colored pattern of 80×80 µm was formed in the same manner as the production method of the above-produced black matrix. Furthermore, similarly, in a sequential manner, a green (G) chromatic colored pattern was formed using the Curable Composition G-1 for green (G) and a blue (B) chromatic colored pattern was formed using the Curable Composition B-1 for blue (B), to produce a color filter having a black matrix for a liquid crystal display device.

It was found that no development scum or foreign matters were observed in-plane in the obtained color filter, and the color filter had good contrast.

EXPLANATION OF REFERENCES

2, 20, 30, 40: solid-state imaging device
3: CMOS sensor
4: circuit board
5: ceramic substrate
5*a*: opening
5*b*: inner wall surface
6: IR cut filter
6*a*: incident surface
7: taking lens
8: lens holder
9: holding cylinder
10: cured film
11, 21, 31, 41: light-shielding film (light-shielding layer)

What is claimed is:
1. A dispersion composition comprising:
a colorant; and
a resin,
wherein the resin contains a structural unit A having a polymer chain and a structural unit B having an acid group,
the polymer chain contains two or more structural units GF,
each of the structural units GF is selected from the group consisting of a structural unit composed of an oxyalkylene group and a structural unit composed of an oxyalkylene carbonyl group,
the polymer chain contains a structural unit L$^1$ represented by Formula (1), and a structural unit L$^2$ selected from the group consisting of a structural unit represented by Formula (2) and a structural unit represented by Formula (3),

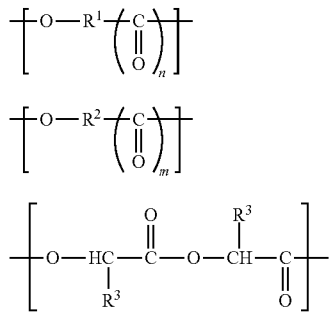

(1)

(2)

(3)

in Formula (1), $R^1$ represents an alkylene group, and n represents 1,
in Formula (2), $R^2$ represents an alkylene group different from $R^1$, and m represents 1, and
in Formula (3), $R^3$ represents an alkyl group,
the resin contains a structural unit C, and
the structural unit C is one or more structural units selected from structural units based on monomers represented by General Formulas (ic) to (iiic),

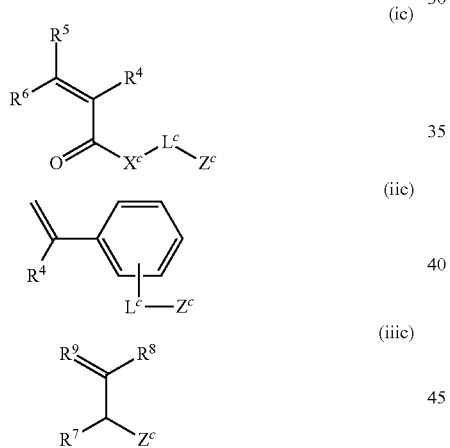

(ic)

(iic)

(iiic)

in Formulas (ic) to (iiic), $R^4$, $R^5$, and $R^6$ each independently represents a hydrogen atom, a halogen atom, or an alkyl group,
$X^c$ represents an oxygen atom (—O—) or an imino group (—NH—),
$R^7$, $R^8$, and $R^9$ each independently represents a hydrogen atom, a halogen atom, an alkyl group having 1 to 6 carbon atoms, $Z^c$ or $-L^c-Z^c$,
$L^c$ represents a single bond or a divalent linking group, and
$Z^c$ represents an aliphatic group, an aromatic group, a heterocyclic group, and combinations thereof.

2. The dispersion composition according to claim 1, wherein a polymer forming the polymer chain has a crystallization temperature of less than 20.0° C.

3. The dispersion composition according to claim 1, wherein the structural unit A is represented by Formula (A), and the structural unit B is represented by Formula (B),

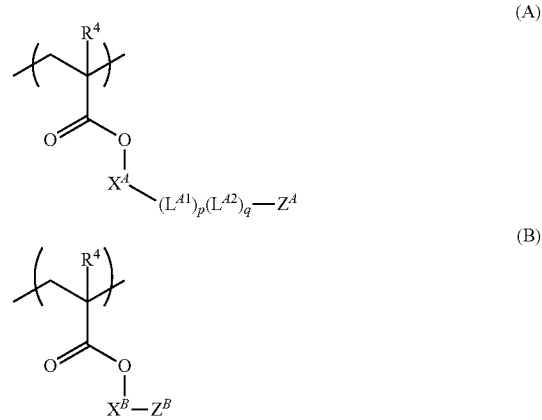

(A)

(B)

in Formula (A), $R^4$ represents a hydrogen atom or an alkyl group, and $X^A$ represents a single bond or a divalent linking group,
p and q each represent an integer of 1 or more,
$Z^A$ represents a hydrogen atom or a monovalent organic group, and
$L^{A1}$ and $L^{A2}$ represent the structural unit $L^1$ and the structural unit $L^2$, respectively, and
in Formula (B), $R^4$ represents a hydrogen atom or an alkyl group, and $X^B$ represents a single bond or a divalent linking group,
$Z^B$ represents a hydrogen atom, or an acid group selected from the group consisting of a carboxylic acid group, a phosphoric acid group, a sulfonic acid group, a phenolic hydroxy group, and a thiol group, or a derivative group thereof, and,
in a case where $Z^B$ is a hydrogen atom, $X^B$ represents a single bond.

4. The dispersion composition according to claim 3, wherein a sum of p and q in Formula (A) is greater than 5 and less than 120.

5. The dispersion composition according to claim 1, wherein a mass ratio of the structural unit $L^1$ to the structural unit $L^2$ is greater than 50/50 and less than 95/5.

6. The dispersion composition according to claim 1, wherein the structural unit $L^1$ and the structural unit $L^2$ are each a structural unit obtained by ring-opening polymerization of a cyclic compound.

7. The dispersion composition according to claim 6, wherein the cyclic compound is a lactone compound.

8. The dispersion composition according to claim 7, wherein the lactone compound is at least one selected from the group consisting of β-propiolactone, β-butyrolactone, β-valerolactone, γ-butyrolactone, γ-valerolactone, γ-caprylolactone, δ-valerolactone, β-methyl-δ-valerolactone, δ-stearolactone, ε-caprolactone, 2-methyl-ε-caprolactone, 4-methyl-ε-caprolactone, ε-caprylolactone, and ε-palmitolactone.

9. The dispersion composition according to claim 1, wherein the structural unit A has a formula weight of 500 to 30,000.

10. The dispersion composition according to claim 1, wherein a content of the structural unit A is 10% to 90% by mass with respect to the entire mass of the resin, and a content of the structural unit B is 10% to 90% by mass with respect to the entire mass of the resin.

11. The dispersion composition according to claim 1, wherein the resin has a weight average molecular weight of 1,000 to 100,000.

12. The dispersion composition according to claim 1, wherein the resin has an acid value of 35 to 250 mgKOH/g.

13. The dispersion composition according to claim 1, further comprising a solvent.

14. The dispersion composition according to claim 13, wherein the solvent includes two or more solvents.

15. A curable composition comprising:
the dispersion composition according to claim 1;
a polymerizable compound; and
a polymerization initiator.

16. The curable composition according to claim 15, further comprising an alkali-soluble resin.

17. The curable composition according to claim 15, wherein the colorant contains a black pigment.

18. The curable composition according to claim 17, wherein the black pigment is titanium oxynitride.

19. The curable composition according to claim 17, wherein the black pigment is titanium nitride.

20. The curable composition according to claim 17, wherein the black pigment is at least one selected from the group consisting of niobium oxynitride and niobium nitride.

21. A method for manufacturing a cured film, comprising:
a step of coating the curable composition according to claim 15 onto a base material to form a curable composition layer;
a step of irradiating the curable composition layer with actinic rays or radiation to perform exposure; and
a step of developing the curable composition after the exposure to form a cured film.

22. A color filter comprising a cured film that is obtained by curing the curable composition according to claim 15.

23. A light-shielding film that is obtained by curing the curable composition according to claim 17.

24. A solid-state imaging device comprising a cured film that is obtained by curing the curable composition according to claim 15.

25. An image display device comprising a cured film that is obtained by curing the curable composition according to claim 15.

26. The dispersion composition according to claim 1, wherein the content of the structural unit $L^1$ in the polymer chain is 80% to 98% by mass, with respect to the entire mass of the polymer chain.

27. The dispersion composition according to claim 1, wherein a content of the structural unit C is 10% to 40% by mass, with respect to the entire mass of resin.

28. The dispersion composition according to claim 1, wherein the colorant is a chromatic color pigment, and the average primary particle diameter of the chromatic color pigment is 0.01 μm to 0.1 μm.

29. The dispersion composition according to claim 1, wherein the colorant includes an inorganic pigment or an organic pigment, and
the inorganic pigment is oxides of metals selected from the group consisting of iron, cobalt, aluminum, cadmium, lead, copper, titanium, magnesium, chromium, zinc, and antimony, or complex oxides of the metals.

30. The dispersion composition according to claim 1, wherein the colorant contains a black pigment, and
the black pigment is carbon black, titanium black, titanium nitride, niobium nitride, vanadium nitride, titanium oxide, iron oxide, manganese oxide, or graphite.

31. The dispersion composition according to claim 1, wherein the colorant contains a black pigment, and
the black pigment is at least one selected from the group consisting of niobium oxynitride and niobium nitride.

32. The dispersion composition according to claim 1, wherein the structural unit C is the structural unit based on monomer represented by General Formulas (ic), and
$R^4$ is a hydrogen atom or a methyl group, $R^5$ and $R^6$ are hydrogen atoms, $L^c$ is a single bond, $X^c$ is an oxygen atom, and $Z^c$ is an aromatic group.

* * * * *